(12) United States Patent
Matsuba et al.

(10) Patent No.: US 11,638,020 B2
(45) Date of Patent: Apr. 25, 2023

(54) VIDEO PROCESSING USING MULTIPLE BITSTREAM ENGINES

(71) Applicant: QUALCOMM Incorporated, San Diego, CA (US)

(72) Inventors: Yasutomo Matsuba, San Diego, CA (US); Kai Wang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 51 days.

(21) Appl. No.: 17/217,745

(22) Filed: Mar. 30, 2021

(65) Prior Publication Data
US 2022/0321899 A1 Oct. 6, 2022

(51) Int. Cl.
*H04N 19/42* (2014.01)
*H04N 19/107* (2014.01)
*H04N 19/124* (2014.01)
*H04N 19/172* (2014.01)
*H04N 19/18* (2014.01)
*H04N 19/51* (2014.01)
*H04N 19/70* (2014.01)

(52) U.S. Cl.
CPC ........... *H04N 19/42* (2014.11); *H04N 19/107* (2014.11); *H04N 19/124* (2014.11); *H04N 19/172* (2014.11); *H04N 19/18* (2014.11); *H04N 19/51* (2014.11); *H04N 19/70* (2014.11)

(58) Field of Classification Search
CPC .............................. H04N 19/42; H04N 19/107
See application file for complete search history.

(56) References Cited

U.S. PATENT DOCUMENTS

| 5,809,176 A | 9/1998 | Yajima |
| 2013/0128956 A1* | 5/2013 | Bouillet ........... H04N 21/23439 375/240.26 |

(Continued)

FOREIGN PATENT DOCUMENTS

| GB | 2569959 A | 7/2019 |
| JP | 2018198439 A | 12/2018 |

OTHER PUBLICATIONS

Grange A., et al., "A VP9 Bitstream Overview: draft-grange-vp9-bitstream-00", Google, Network Working Group, Feb. 18, 2013, 8 pages, Retrieved on Mar. 3, 2021, https://tools.ietf.org/id/draft-grange-vp9-bitstream-00.html.

(Continued)

*Primary Examiner* — Jerry T Jean Baptiste
(74) *Attorney, Agent, or Firm* — Moore IP

(57) ABSTRACT

A device includes a first bitstream engine and a second bitstream engine. The first bitstream engine is configured to decode a first portion of a first video frame of a plurality of video frames to generate first decoded portion data. The first bitstream engine is also configured to generate synchronization information based on completion of decoding the first portion. The second bitstream engine is configured to, based on the synchronization information, initiate decoding of a second portion of a particular video frame to generate second decoded portion data. The second bitstream engine uses the first decoded portion data during decoding of the second portion of the particular video frame. The particular video frame includes the first video frame or a second video frame of the plurality of video frames.

32 Claims, 16 Drawing Sheets

(56) References Cited

U.S. PATENT DOCUMENTS

| | | | |
|---|---|---|---|
| 2013/0188708 A1* | 7/2013 | Rusert | H04N 19/50 375/240.12 |
| 2017/0244967 A1* | 8/2017 | Wang | G06F 13/28 |
| 2019/0200043 A1 | 6/2019 | Egilmez et al. | |

OTHER PUBLICATIONS

"How VP9 Works, Technical Details & Diagrams", Doom9's Forum, Oct. 8, 15 pages, 2013, Retrieved on Mar. 3, 2021, https://forum.doom9.org/showthread.php?t=168947.

"Implementing Tile Encoding in rav1e", rom1v/blog, Apr. 25, 2019, 12 pages, https://blog.rom1v.com/2019/04/implementing-tile-encoding-in-rav1e/.

Wikipedia, VP9, Jun. 17, 2013, 17 pages, Retrieved on Mar. 3, 2021, https://en.wikipedia.org/wikiNP9.

International Search Report and Written Opinion—PCT/US2022/071433—ISA/EPO—dated Jul. 18, 2022.

\* cited by examiner

VIDEO PROCESSING USING MULTIPLE BITSTREAM ENGINES

I. FIELD

The present disclosure is generally related to video processing using multiple bitstream engines.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Such computing devices often incorporate functionality to receive video frames from a camera. For example, a first device encodes the video frames for transmission as a bitstream to a second device and the second device decodes the received bitstream to reconstruct the video frames for display. Emerging video applications increasingly rely on high bitrate throughput. Reducing the encoding time at the first device and the decoding time at the second device can increase the bitrate throughput for the video frames.

III. SUMMARY

According to one implementation of the present disclosure, a device includes a first bitstream engine and a second bitstream engine. The first bitstream engine is configured to decode a first portion of a first video frame of a plurality of video frames to generate first decoded portion data. The first bitstream engine is also configured to generate synchronization information based on completion of decoding the first portion. The second bitstream engine is configured to, based on the synchronization information, initiate decoding of a second portion of a particular video frame to generate second decoded portion data. The second bitstream engine uses the first decoded portion data during decoding of the second portion of the particular video frame. The particular video frame includes the first video frame or a second video frame of the plurality of video frames.

According to another implementation of the present disclosure, a method includes receiving, at a device, a bitstream representing a plurality of video frames. The method also includes decoding, at a first bitstream engine of the device, a first portion of a first video frame of the plurality of video frames to generate first decoded portion data. The method further includes generating, at the first bitstream engine, synchronization information based on completion of decoding the first portion. The method also includes initiating decoding, at a second bitstream engine of the device, of a second portion of a particular video frame to generate second decoded portion data. The decoding of the second portion is based on the synchronization information and the first decoded portion data. The particular video frame includes the first video frame or a second video frame of the plurality of video frames.

According to another implementation of the present disclosure, a device includes an interface, a first bitstream engine, and a second bitstream engine. The interface is configured to receive a plurality of video frames. The first bitstream engine is configured to encode first portion data of a first portion of a first video frame of the plurality of video frames to generate a first encoded portion. The first bitstream engine is also configured to generate synchronization information based on completion of encoding the first portion. The second bitstream engine is configured to, based on the synchronization information, initiate encoding of second portion data of a second portion of a particular video frame to generate a second encoded portion. The second bitstream engine uses the first encoded portion during encoding of the second portion of the particular video frame. The particular video frame includes the first video frame or a second video frame of the plurality of video frames.

According to another implementation of the present disclosure, a method includes receiving a plurality of video frames at a device. The method also includes encoding, at a first bitstream engine of the device, first portion data of a first portion of a first video frame of the plurality of video frames to generate a first encoded portion. The method further includes generating, at the first bitstream engine, synchronization information based on completion of encoding the first portion. The method also includes initiating encoding, at a second bitstream engine of the device, second portion data of a second portion of a particular video frame to generate a second encoded portion. The encoding of the second portion is based on the synchronization information and the first encoded portion. The particular video frame includes the first video frame or a second video frame of the plurality of video frames.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
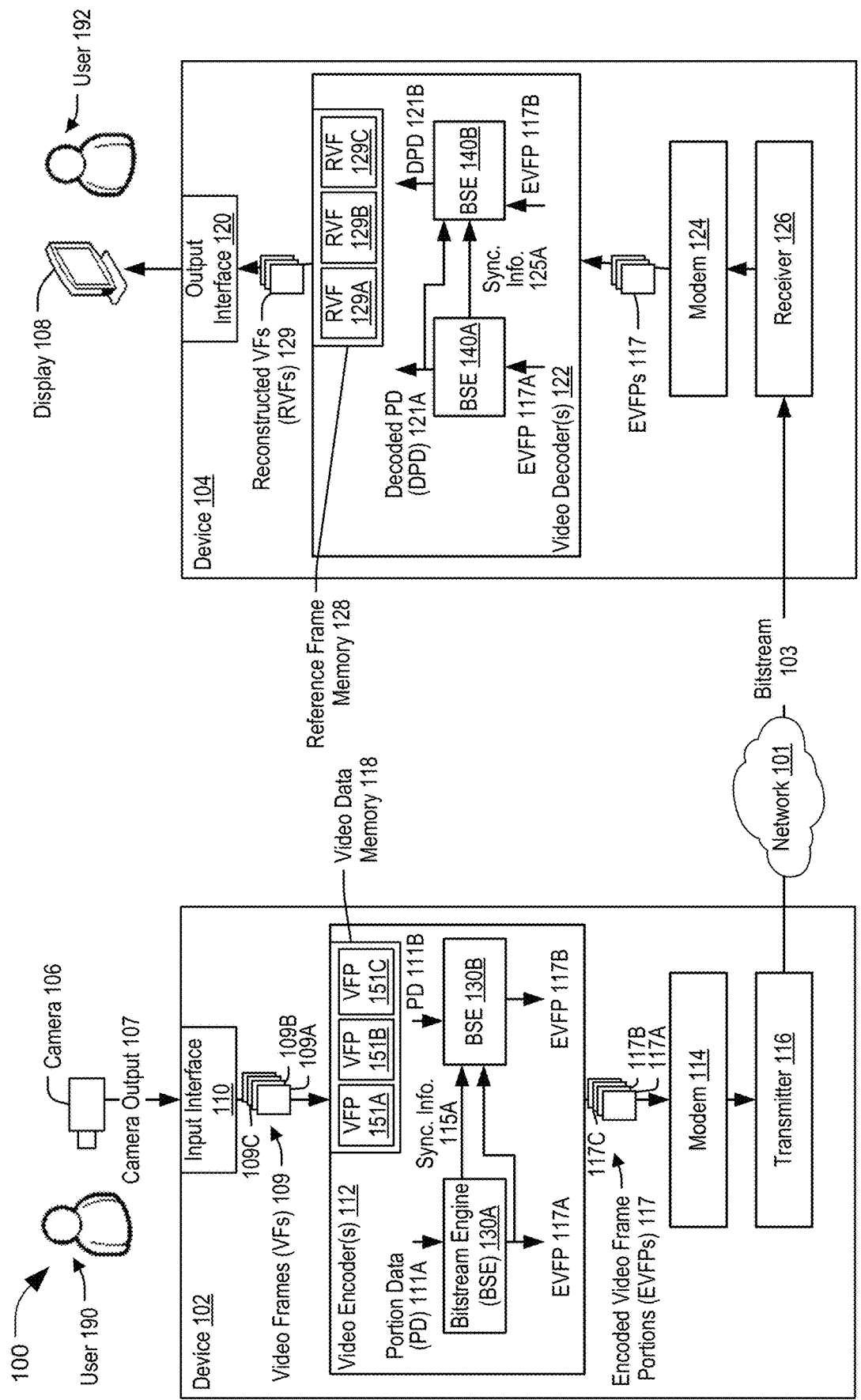
FIG. 1 is a block diagram of a particular illustrative aspect of a system operable to use multiple bitstream engines to process video, in accordance with some examples of the present disclosure.

Both encoding video frames to generate a bitstream for transmission and decoding the bitstream to reconstruct the video frames add processing delay that reduces throughput. Systems and methods of using multiple bitstream engines to process video are disclosed. For example, multiple bitstream engines are used at a first device to encode the video frames to generate the bitstream for transmission to a second device, and multiple bitstream engines are used at the second device to decode the bitstream to reconstruct the video frames. Using multiple bitstream engines for encoding, decoding, or both, reduces the processing delay and increases the bitrate throughput.

A video frame has a particular size (e.g., 720 pixels by 576 pixels). A video frame portion may refer to any portion of the video frame of any size and any shape. For example, a video frame may include rows and columns of video frame portions (e.g., blocks). As another example, a video frame portion may include rows of video frame portions. A video frame portion has a size (e.g., 240 pixels by 288 pixels or 720 pixels by 192 pixels) that is less than or equal to the size of the video frame. In some implementations, each video frame portion of a video frame has the same size (e.g., same dimensions). In alternative implementations, a video frame portion of the video frame has a different size than another video frame portion of the video frame. In some implementations, the video frame is divided into non-overlapping video frame portions. In other implementations, the video frame includes partially overlapping video frame portions.

A first bitstream engine of a video encoder at a first device is used to encode a first video frame portion and a second bitstream engine of the video encoder is used to encode a second video frame portion. In some examples, the first video frame portion and the second video frame portion are included in the same video frame. In other examples, the first video frame portion is from a first video frame and the second video frame portion is from another video frame.

In some cases, encoding of the second video frame portion is dependent on encoding of the first video frame portion (e.g., for motion estimation). In these cases, the second video frame portion is encoded by the second bitstream engine subsequent to encoding of the first video frame portion by the first bitstream engine. For example, the first bitstream encodes the first video frame portion to generate a first encoded video frame portion and provides the first encoded video frame portion and synchronization information to the second bitstream engine. The second bitstream engine encodes the second video frame portion based on the first encoded video frame portion and the synchronization information. In a particular example, the first bitstream engine encodes a third video frame portion concurrently with the second bitstream engine encoding the second video frame portion. The concurrent encoding of video frames by multiple bitstream engines reduces the encoding delay and increases throughput. The encoded video frame portions are transmitted as a bitstream to a second device.

A first bitstream engine of a video decoder at the second device is used to decode the first video frame portion and a second bitstream engine of the video decoder at the second device is used to decode the second video frame portion. In some cases, decoding of the second video frame portion is dependent on decoding of the first video frame portion (e.g., for motion estimation). In these cases, the second video frame portion is decoded by the second bitstream engine subsequent to decoding of the first video frame portion by the first bitstream engine. For example, the first bitstream decodes the first video frame portion to generate a first decoded video frame portion and provides the first decoded video frame portion and synchronization information to the second bitstream engine. The second bitstream engine decodes the second video frame portion based on the first decoded video frame portion and the synchronization information. In a particular example, the first bitstream engine decodes a third video frame portion concurrently with the second bitstream engine decoding the second video frame portion. The concurrent decoding of video frames by multiple bitstream engines reduces the decoding delay and increases throughput.

Digital video devices implement video compression techniques, such as those described in the standards defined by MPEG-2, MPEG-4, ITU-T H.263, ITU-T H.264/MPEG-4, Part 10, Advanced Video Coding (AVC), ITU-T H.265, High Efficiency Video Coding (HEVC), and extensions of such standards, to transmit, receive and store digital video information more efficiently.

Video compression techniques include spatial (intra-frame) prediction and/or temporal (inter-frame) prediction to reduce or remove redundancy inherent in video sequences. In a particular example, a video frame or slice may be partitioned into blocks. Each block can be further partitioned. Blocks in an intra-coded (I) frame or slice are encoded using spatial prediction with respect to reference samples in neighboring blocks in the same frame or slice. Blocks in an inter-coded (P or B) frame or slice may use spatial prediction with respect to reference samples in neighboring blocks in the same frame or slice or temporal prediction with respect to reference samples in other reference frames. Spatial or temporal prediction results in a prediction block for a block to be coded. Residual data represents pixel differences between the original block to be coded and the prediction block.

An inter-coded block is encoded according to a motion vector that points to a block of reference samples forming the prediction block, and the residual data indicating the difference between the coded block and the prediction block. An intra-coded block is encoded according to an intra-coding mode and the residual data. For further compression, the residual data may be transformed from the pixel domain to a transform domain (e.g., Fourier or frequency domain), resulting in residual transform coefficients, which then may be quantized. The quantized transform coefficients, initially arranged in a two-dimensional array, may be scanned in a particular order to produce a one-dimensional vector of transform coefficients for entropy coding.

Various entropy coding processes may be used to code residual transform coefficients, motion vector information, syntax elements, and other associated information. Examples of various entropy coding and other data compression processes include context-adaptive variable length coding (CAVLC), context-adaptive binary arithmetic coding (CABAC), probability interval partitioning entropy coding (PIPE), Golomb coding, Golomb-Rice coding, and exponential Golomb coding.

Particular aspects of the present disclosure are described below with reference to the drawings. In the description, common features are designated by common reference numbers. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1, multiple video frames are illustrated and associated with reference numbers 109A, 109B, and 109C. When referring to a particular one of these video frames, such as the video frame 109A, the distinguishing letter "A" is used. However, when referring to any arbitrary one of these video frames or to these video frames as a group, the reference number 109 is used without a distinguishing letter.

As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. To illustrate, FIG. 1 depicts a device 102 including one or more video encoders ("video encoder(s)" 112 of FIG. 1), which indicates that in some implementations the device 102 includes a single video encoder 112 and in other implementations the device 102 includes multiple video encoders 112. For ease of reference herein, such features are generally introduced as "one or more" features and are subsequently referred to in the singular unless aspects related to multiple of the features are being described.

As used herein, the terms "comprise," "comprises," and "comprising" may be used interchangeably with "include," "includes," or "including." Additionally, the term "wherein" may be used interchangeably with "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Unless stated otherwise, as used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive signals (e.g., digital signals or analog signals) directly or indirectly, via one or more wires, buses, networks, etc. As used herein, "directly coupled" may include two devices that are coupled (e.g., communicatively coupled, electrically coupled, or physically coupled) without intervening components. Unless stated otherwise, two device (or components) that are "coupled," may be directly and/or indirectly coupled.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

Referring to FIG. 1, a particular illustrative aspect of a system configured to use multiple bitstream engines to process video is disclosed and generally designated 100. The system 100 includes a device 102 that is configured to be coupled via a network 101 to a device 104. For example, the device 102 includes a modem 114 and a transmitter 116 configured to enable communication via the network 101 with the device 104. The device 104 includes a modem 124 and a receiver 126 configured to enable communication via the network 101 with the device 102. In a particular aspect, the network 101 includes a wired network, a wireless network, or both.

The device 102 is configured to use multiple bitstream engines to process video using one or more video encoders 112. The device 104 is configured to use multiple bitstream engines to process video using one or more video decoders 122.

The video encoder 112 and the video decoder 122 may operate according to a video coding standard or technique, such as the HEVC standard, the ITU-T H.264 standard, alternatively referred to as MPEG-4, Part 10, Advanced Video Coding (AVC), MPEG-2, ITU-T H.263, Joint Exploratory Model (JEM), other coding techniques being explored by the Joint Video Exploration Team (WET), or extensions of such standards or techniques.

Although not shown in FIG. 1, in some aspects, the video encoder 112 and the video decoder 122 may each be integrated with one or more audio encoders and decoders, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

The video encoder 112 may implement any or all of the techniques of this disclosure for binary arithmetic coding (BAC) in a video coding process. Likewise, the video decoder 122 may implement any or all of these techniques BAC in a video coding process. As will be discussed in more detail below, in one example of the disclosure, the video decoder 122 may be configured to receive video data including coded representations of syntax elements, perform inverse binary arithmetic coding on the coded representations of the syntax elements to obtain bins of the syntax elements, inverse binarize the bins of the syntax elements to obtain the syntax elements, and decode the video data based on the syntax elements. To perform the inverse binary arithmetic coding, video decoder 122 may be further configured to determine a probability for a particular coded representation of the coded representations, normalize the probability for the particular coded representation using right bit shifts to create a normalized probability, determine a product of the normalized probability and a range for the particular coded representation, and update a range of a least probable symbol for the particular coded representation using the determined product.

Likewise, the video encoder 112 may be configured to encode the video data to produce syntax elements, binarize the syntax elements into bins, perform binary arithmetic coding on the bins of the syntax elements to produced coded representations of the bins, and signal the coded representations in a bitstream. To perform the binary arithmetic coding, the video encoder 112 may be further configured to determine a probability for a particular bin of a particular syntax element of the syntax elements, normalize the probability for the particular bin using right bit shifts to create a normalized probability, determine a product of the normalized probability and a range for the particular bin, and update a range of a least probable symbol for the particular bin using the determined product.

Digital video devices implement video compression techniques, such as those performed by the video encoder 112 and the video decoder 122, to encode and decode digital video information more efficiently. Video compression may apply spatial (intra-frame) prediction and/or temporal (inter-frame) prediction techniques to reduce or remove redundancy inherent in video sequences.

For video coding according to the High-Efficiency Video Coding (HEVC or ITU-T H.265) standard, as one example, a video frame may be partitioned into coding units. A coding unit (CU) generally refers to an image region that serves as a basic unit to which various coding tools are applied for video compression. A CU usually has a luminance (or "luma") component, which may be denoted as Y, and two color intensity (or "chroma") components, which may be denoted as Cr and Cb. Depending on the video sampling format, the size of the Cr and Cb components, in terms of number of samples, may be the same as or different from the size of the Y component. A CU is typically a square-shaped image region, and may be considered to be similar to a so-called macroblock, e.g., under other video coding standards such as ITU-T H.264.

The luma and chroma components of pixels in a CU may be coded in different sub-sampling formats. In one proposal for HEVC, the luma and chroma components of a pixel are coded in a 4:2:0 format. In a 4:2:0 pixel format, for every 4×2 block of pixels, there are eight luma components (4 in each row) and 2 chroma components (e.g., 1 Cr chroma component and 1 Cb chroma component in the first row of the 4×2 block). The second row of the 4×2 block would have no chroma information. As such, in a 4×2 block of pixels, the chroma components are sampled at ½ horizontal resolution and ½ vertical resolution. However, video coding techniques are not limited to 4:2:0 chroma sub-sampling. Other sub-sampling formats may be used, including 4:2:2 and 4:4:4. In a 4:2:2 pixel format, for every 4×2 block of pixels, there are eight luma components (4 in each row) and 4 chroma components (e.g., 1 Cr chroma component and 1 Cb chroma component in each of the first and second row of the 4×2 block). As such, for a 4:2:2 format, the chroma components are sampled at ½ horizontal resolution and full vertical resolution. The 4:4:4 pixel format involves no sub-sampling of chroma components. That is, for a 4×2 block of pixels, there are eight luma components, eight Cr components, and eight Cb components. These or other sampling formats could be used.

To achieve better coding efficiency, a coding unit may have variable sizes depending on video content. In addition, a coding unit may be split into smaller blocks for prediction or transformation. In particular, each coding unit may be further partitioned into prediction units and/or transform units. Prediction units may be considered to be similar to so-called partitions under other video coding standards, such as H.264. Transform units refer to blocks of residual data to which a transform is applied by the video encoder 112 to produce transform coefficients.

Coding according to some of aspects of the HEVC standard will be described in this application for purposes of illustration. However, the techniques described in this disclosure may be useful for other video coding processes, such as those defined according to H.264 or other standard or proprietary video coding processes.

HEVC standardization efforts were based on a model of a video coding device referred to as the HEVC Test Model (HM). The HM has several capabilities that other coding standards (e.g., ITU-T H.264/AVC, etc.) do not have. For example, whereas H.264 provides nine intra-prediction encoding modes, HM provides as many as thirty-five intra-prediction encoding modes.

According to the HM, a CU may include one or more prediction units and/or one or more transform units. Syntax data within a bitstream may define a largest coding unit (LCU) or coding tree block (CTB), which is a largest CU in terms of the number of pixels. In general, a CU has a similar purpose to a macroblock of H.264, except that a CU does not have a size distinction. Thus, a CU may be split into sub-CUs. In general, references in this disclosure to a CU may refer to a LCU of a picture or a sub-CU of an LCU. An LCU may be split into sub-CUs, and each sub-CU may be further split into more sub-CUs. Syntax data for a bitstream may define a maximum number of times an LCU may be split, referred to as CU depth. Accordingly, a bitstream may also define a smallest coding unit (SCU). This disclosure also uses the term "block," "partition," or "portion" to refer to any of a CU, prediction unit, or transform unit. In general, "portion" may refer to any sub-set (e.g., LCU, SCU, sub-CU, or CU) of a video frame.

The video encoder 112 includes a plurality of bitstream engines 130, such as a bitstream engine 130A, a bitstream engine 130B, one or more additional bitstream engines, or a combination thereof. The video encoder 112 is configured to be coupled via an input interface 110 to a camera 106. The input interface 110 is configured to receive a camera output 107 from the camera 106 and to provide the camera output 107 as video data representing video frames (VFs) 109 to the video encoder 112. For example, a video data memory 118 (e.g., a buffer) of the video encoder 112 is configured to store video data representing one or more video frame portions (VFPs) 151 of the video frames 109. In a particular aspect, a video frame is divided into rows and columns of tiles and a VFP 151 includes a tile of the video frame, as further described with reference to FIG. 2. In a particular aspect, a video frame is divided into horizontal rows (e.g., slices) and a VFP 151 includes a row of the video frame, as further described with reference to FIG. 3. In a particular aspect, a VFP 151 includes a slice, a tile, a block, the entire frame, or another portion of a video frame.

The plurality of bitstream engines 130 of the video encoder 112 is configured to encode portion data 111 of the video frame portions 151 to generate encoded video frame portions (EVFPs) 117. The video encoder 112 is configured to initiate transmission of the encoded video frame portions 117 as a bitstream 103 to the device 104.

The video decoder 122 includes a plurality of bitstream engines 140, such as a bitstream engine 140A, a bitstream engine 140B, one or more additional bitstream engines, or a combination thereof. The video decoder 122 is configured to receive the bitstream 103 representing the encoded video frame portions 117. In a particular aspect, the encoded video frame portions 117 received by the device 104 are the same as the encoded video frame portions 117 transmitted by the device 102. In an alternative aspect, the encoded video frame portions 117 received by the device 104 differ at least partially from the encoded video frame portions 117 transmitted by the device 102 because of changes during transmission, such as bit flips, packet loss, etc. In a particular implementation, the encoded video frame portions 117 are transmitted by the device 102 using a first transmission (or packeting) protocol that is different from a second transmission (or packeting) protocol used by the device 104 to receive the encoded video frame portions 117. For example, the encoded video frame portions 117 can be transcoded between transmission by the device 102 and receipt by the device 104.

The plurality of bitstream engines 140 of the video decoder 122 is configured to decode the encoded video frame portions 117 to generate decoded portion data (DPD) 121. The video decoder 122 is configured to generate reconstructed video frames (RVFs) 129 based on the decoded portion data 121. In a particular aspect, the reconstructed video frames 129 generated by the video decoder 122 are the same as the video frames 109 encoded by the video encoder 112. In an alternative aspect, the reconstructed video frames 129 differ at least partially from the video frames 109 because of changes during encoding, transmission, decoding, or a combination thereof, such as bit flips, packet loss, processing loss, etc. In a particular implementation, the video decoder 122 is configured to provide the reconstructed video frames 129 via an output interface 120 to a display device 108. For example, the video decoder 122 is configured to store the reconstructed video frames 129 in a reference frame memory 128, and to output the reconstructed video frames 129 stored in the reference frame memory 128 to the display device 108 for playback. The display device 108 is configured to display the reconstructed video frames 129.

In some implementations, the device 102, the device 104, or both, correspond to or are included in various types of devices. In an illustrative example, the video encoder 112, the video decoder 122, or both, are integrated in at least one of a mobile phone or a tablet computer device, as described with reference to FIG. 11, a wearable electronic device, as described with reference to FIG. 12, a camera device, as described with reference to FIG. 13, or a virtual reality headset or an augmented reality headset, as described with reference to FIG. 14. In another illustrative example, the video encoder 112, the video decoder 122, or both, are integrated into a vehicle, such as described further with reference to FIG. 15 and FIG. 16.

In the same or alternative implementations, the camera 106, the display 108, or both, correspond to or are included in various types of devices. In an illustrative example, the camera 106, the display 108, or both, are integrated in at least one of a mobile phone or a tablet computer device, as described with reference to FIG. 11, a wearable electronic device, as described with reference to FIG. 12, a camera device, as described with reference to FIG. 13, or a virtual reality headset or an augmented reality headset, as described with reference to FIG. 14. In another illustrative example, the camera 106, the display 108, or both, are integrated into a vehicle, such as described further with reference to FIG. 15 and FIG. 16.

During operation, the input interface 110 receives the camera output 107 representing the video frames 109 from the camera 106. For example, the video frames 109 capture images of a user 190 during a video call (e.g., a teleconference) with a user 192 of the device 104. The video frames 109 include a sequence of video frames, such as a video frame 109A, a video frame 109B, a video frame 109C, one or more additional video frames, or a combination thereof. The video encoder 112 stores data representing video frame portions 151 of the video frames 109 in the video data memory 118. For example, the video encoder 112 stores a video frame portion 151A of the video frame 109A in the video data memory 118. In a particular aspect, the video encoder 112 also stores a video frame portion 151B, a video frame portion 151C, or both, in the video data memory 118. In a particular example, two or more of the video frame portion 151A, the video frame portion 151B, and the video frame portion 151C are distinct portions of the same video frame (e.g., the video frame 109A), as further described with reference to FIG. 2. In another example, two or more of the video frame portion 151A, the video frame portion 151B, and the video frame portion 151C are portions of the distinct video frames (e.g., two or more of the video frame 109A, the video frame 109B, and the video frame 109C), as further described with reference to FIG. 3.

The video encoder 112 generates portion data 111A based on the video frame portion 151A, as further described with reference to FIG. 5. Similarly, the video encoder 112 generates portion data 111B based on the video frame portion 151B, as further described with reference to FIG. 5.

The video encoder 112 assigns portion data to the plurality of bitstream engines 130 based on the dependency between the VFPs 151. In a particular example, the VFPs 151 correspond to tiles and have a dependency at a tile horizontal edge, as further described with reference to FIG. 2. In this example, the video encoder 112 assigns portion data of alternating tiles of the same video frame to each of the plurality of bitstream engines 130, as further described with reference to FIG. 2. In a particular example, the VFPs 151 correspond to rows (e.g., slices) and have a dependency across frames, as further described with reference to FIG. 3. In this example, the video encoder 112 assigns portion data of rows of different frames to each of the plurality of bitstream engines 130, as further described with reference to FIG. 3. In the same or alternative implementation(s), the video encoder 112 determines the dependency of the VFPs 151, performs the assignment of the portion data to the plurality of bitstream engines 130, or both, based on dependency information indicated by a configuration setting, a user input, default data, or a combination thereof.

In a particular aspect, the video encoder 112 assigns the portion data 111A corresponding to the video frame portion 151A to the bitstream engine 130A, and assigns the portion data 111B corresponding to the video frame portion 151B to the bitstream engine 130B. The bitstream engine 130A encodes the portion data 111A to generate an encoded video frame portion 117A, as further described with reference to FIG. 4. The bitstream engine 130A also generates synchronization information 115A based on completion of encoding the video frame portion 151A (e.g., the portion data 111A of the video frame portion 151A), as further described with reference to FIGS. 4 and 6. In a particular implementation, the synchronization information 115A is based on (e.g., depends on or indicates) a prediction mode (e.g., an intra-prediction mode or an inter-prediction mode), coded block information, coefficient information, motion vector information, reference index, reference mode, or a combination thereof, associated with encoding the video frame portion 151A.

The bitstream engine 130B, based on the synchronization information 115A, initiates encoding of the portion data 111B to generate an encoded video frame portion 117B, as further described with reference to FIGS. 4 and 6. The bitstream engine 130B uses the encoded video frame portion 117A during encoding of the video frame portion 151B (e.g., the portion data 111B of the video frame portion 151B), as further described with reference to FIGS. 4 and 6.

The bitstream engine 130B encodes the portion data 111B subsequent to the bitstream engine 130A encoding the portion data 111A. In a particular aspect, the bitstream engine 130A encodes portion data of another video frame portion (e.g., the video frame portion 151C) concurrently with the bitstream engine 130B encoding the portion data 111B of the video frame portion 151B, as further described with reference to FIGS. 2-3. For example, the bitstream engine 130A encodes the portion data of the video frame portion 151C to generate the encoded video frame portion 117C. Concurrent encoding of the video frame portion 151C with the encoding of the video frame portion 151B reduces encoding time and increases throughput for the video frames 109. The video encoder 112 provides the encoded video frame portions 117 to the modem 114 for transmission via the transmitter 116 as a bitstream 103.

The receiver 126 receives the bitstream 103 representing the video frames 109 via the network 101 from the device 102. The receiver 126 provides the bitstream 103 as the encoded video frame portions 117 via the modem 124 to the video decoder 122. The bitstream engine 140A decodes the encoded video frame portion 117A (e.g., corresponding to the video frame portion 151A) to generate decoded portion data 121A, as further described with reference to FIGS. 7 and 9. The bitstream engine 140A also generates synchronization information 125A based on completion of decoding the encoded video frame portion 117A, as further described with reference to FIGS. 7 and 9. In a particular implementation, the synchronization information 125A is based on (e.g., depends on or indicates) a prediction mode (e.g., an intra-prediction mode or an inter-prediction mode), coded block information, coefficient information, motion vector information, reference index, reference mode, or a combination thereof, associated with decoding the encoded video frame portion 117A.

The bitstream engine 140B, based on the synchronization information 125A, initiates decoding of the encoded video frame portion 117B (e.g., corresponding to the video frame portion 151B) to generate decoded portion data 121B, as further described with reference to FIGS. 7 and 9. The bitstream engine 140B uses the decoded portion data 121A during decoding of the encoded video frame portion 117B, as further described with reference to FIGS. 7 and 9. In a particular aspect, the decoded portion data 121A and the decoded portion data 121B are the same as the portion data 111A and the portion data 111B, respectively. In an alternate aspect, the decoded portion data 121A and the decoded portion data 121B differ at least partially from the portion data 111A and the portion data 111B, respectively, because of transmission loss, processing loss, bit flips, etc.

The bitstream engine 140B decodes the encoded video frame portion 117B subsequent to the bitstream engine 140A decoding the encoded video frame portion 117A. In a particular aspect, the bitstream engine 140A decodes another encoded video frame portion (e.g., the encoded video frame portion 117C) concurrently with the bitstream engine 140B decoding the encoded video frame portion 117B. Concurrent decoding of the encoded video frame portion 117C with the decoding of the encoded video frame portion 117B reduces a decoding time and increases throughput for the encoded video frame portions 117.

The video decoder 122 generates reconstructed video frames 129 from the decoded portion data 121, as further described with reference to FIG. 8. In a particular aspect, a reconstructed video frame 129A, a reconstructed video frame 129B, and a reconstructed video frame 129C are the same as the video frame 109A, the video frame 109B, and the video frame 109C, respectively. In an alternate aspect, the reconstructed video frame 129A, the reconstructed video frame 129B, and the reconstructed video frame 129C differ at least partially from the video frame 109A, the video frame 109B, and the video frame 109C, respectively, because of transmission loss, processing loss, bit flips, etc. The video decoder 122 provides data representing the reconstructed video frames 129 via the output interface 120 to the display device 108.

The system 100 thus increases throughput for the video frames 109 by using multiple bitstream engines for encoding, multiple bitstream engines for decoding, or a combination thereof. Sharing synchronization information across bitstream engines enables video frame portions with dependencies to be processed (e.g., encoded or decoded) by multiple bitstream engines.

Although the video frames 109 are illustrated as based on the camera output 107 received from the camera 106, in other implementations the video frames 109 are received from one or more storage device(s), server(s), other device(s), or a combination thereof. In some examples, the video frames 109 are generated by an application (e.g., a gaming application, a graphics application, or a combination thereof) of the device 102. Although the reconstructed video frames 129 are illustrated as provided by the video decoder 122 to the display device 108, in some implementations the video decoder 122 provides the reconstructed video frames 129 to one or more memor(ies) and/or other device(s).

In some examples, the video encoder 112 and the video decoder 122 are integrated into a single device. In a particular example, each of the device 102 and the device 104 includes a copy of the video encoder 112 and a copy of the video decoder 122. For example, the video encoder 112 of the device 104 generates encoded video frame portions corresponding to video frames representing a video of the user 192 and the video decoder 122 generates reconstructed video frames from the encoded video frame portions.

The bitstream engines 130 included in a single encoder (e.g., the video encoder 112) and the bitstream engines 140 included in a single decoder (e.g., the video decoder 122) is provided as an illustrative example. In other examples, the bitstream engines 130 can be distributed across multiple encoders, multiple devices, or a combination thereof. Similarly, in some examples, the bitstream engines 140 can be distributed across multiple decoders, multiple devices, or a combination thereof.

Figure 2:
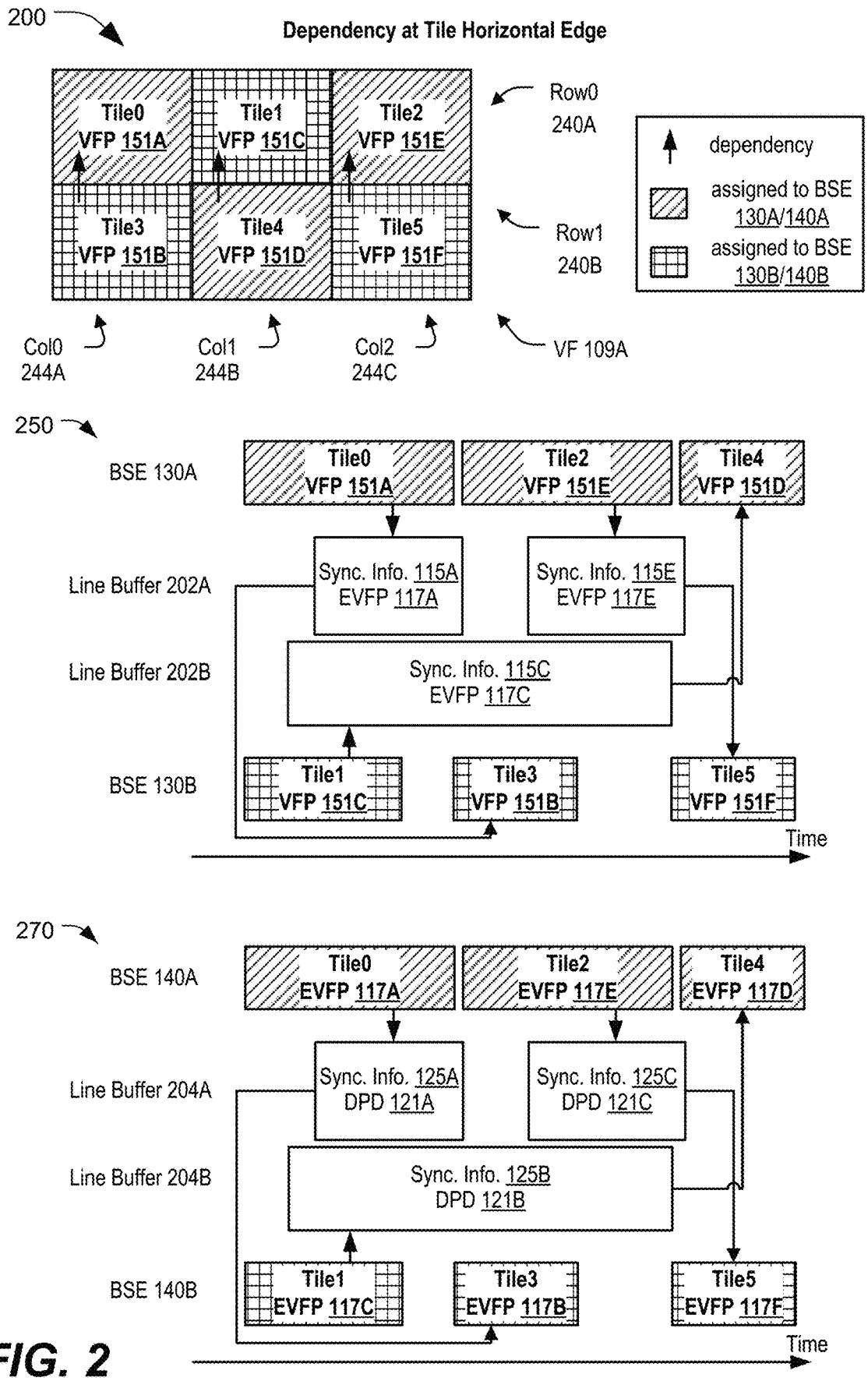
FIG. 2 is a diagram of an illustrative aspect of operations associated with using multiple bitstream engines to process video, in accordance with some examples of the present disclosure.

FIG. 2 is a diagram of an illustrative aspect of operations associated with using multiple bitstream engines to process video based on horizontal-edge dependency. In an example 200, the video frame 109A is divided into a plurality of rows 240 (e.g., rows 240A, 240B) and a plurality of columns 244 (e.g., columns 244A, 244B, 244C) of video frame portions 151 (e.g., tiles) (e.g., video frame portions 151A, 151B, 151C, 151D, 151E, 151F). To illustrate, the video frame 109A includes a row 240A (Row0) and a row 240B (Row1) of the video frame portions 151. The video frame 109A includes a column 244A, a column 244B, and a column 244C of the video frame portions 151. The video frame 109A including an even count of rows and an odd count of columns is provided as an illustrative example. The video frame 109A can include any count of rows greater than 1 and any count of columns greater than 1.

In the example 200, each of the video frame portions 151 of the row 240B has a dependency on a corresponding one of the video frame portions 151 of the row 240A. For example, the video frame portion 151B, a video frame portion 151D, and a video frame portion 151F of the row 240B have a dependency on the video frame portion 151A, the video frame portion 151C, and a video frame portion 151E, respectively.

A diagram 250 is an example of operations associated with using multiple bitstream engines to process video that may be performed at the plurality of bitstream engines 130, the video encoder 112, the device 102, the system 100 of FIG. 1, or a combination thereof. The video encoder 112 assigns alternating video frame portions 151 of the video frame 109A to the plurality of bitstream engines 130. For example, the video encoder 112 assigns even-numbered video frame portions to the bitstream engine 130A and odd-numbered video frame portions to the bitstream engine 130B. To illustrate, the video encoder 112 assigns the video frame portion 151A (Tile0), the video frame portion 151E (Tile2), and the video frame portion 151D (Tile 4) to the bitstream engine 130A and assigns the video frame portion 151C (Tile1), the video frame portion 151B (Tile3), and the video frame portion 151F (Tile 5) to the bitstream engine 130B.

In a particular implementation, each of the bitstream engines 130 has access to dependency information indicating dependencies between various video frame portions. In a particular implementation, the video encoder 112 provides video frame dependency information to each of the bitstream engines 130 indicating whether a video frame portion has a dependency on another video frame portion.

The bitstream engine 130A, in response to determining that the video frame portion 151A (Tile0) has no dependency on any other video frame portion, generates the synchronization information 115A and the encoded video frame portion 117A based on the portion data 111A of the video frame portion 151A, as described with reference to FIG. 1. In a particular implementation, the synchronization information 115A is based on (e.g., depends on or indicates) a prediction mode (e.g., an inter-prediction mode or an intra-prediction mode), coded block information, coefficient information, or a combination thereof, associated with encoding the video frame portion 151A (Tile0). The bitstream engine 130A, in response to determining that the video frame portion 151B has a dependency on the video frame portion 151A, stores the synchronization information 115A and the encoded video frame portion 117A in a line buffer 202A of the video encoder 112. In a particular implementation, the bitstream engine 130A provides a notification to the bitstream engine 130B that information associated with the video frame portion 151A is available in the line buffer 202A, that the video frame portion 151B has a dependency on the video frame portion 151A, or both.

The bitstream engine 130B, in response to determining that the video frame portion 151C (Tile1) has no dependency on any other video frame portion, generates the synchronization information 115C and the encoded video frame portion 117C based on portion data of the video frame portion 151C, as described with reference to FIG. 1. The bitstream engine 130B, in response to determining that the video frame portion 151D has a dependency on the video frame portion 151C, stores the synchronization information 115C and the encoded video frame portion 117C in a line buffer 202B of the video encoder 112. In a particular implementation, the bitstream engine 130B provides a notification to the bitstream engine 130A that information associated with the video frame portion 151C is available in the line buffer 202B, that the video frame portion 151D has a dependency on the video frame portion 151C, or both.

In a particular aspect, the bitstream engine 130A encodes the video frame portion 151A to generate the encoded video frame portion 117A concurrently with the bitstream engine 130B encoding the video frame portion 151C to generate the encoded video frame portion 117C. The video frame portion 151A and the video frame portion 151C can be encoded concurrently because each of the video frame portion 151A and the video frame portion 151C have no dependency on any video frame portion.

The bitstream engine 130A, subsequent to encoding the video frame portion 151A (Tile0), identifies the video frame portion 151E (Tile2) as the next assigned video frame portion. The bitstream engine 130A, in response to determining that the video frame portion 151E (Tile 2) has no dependency on any other video frame portion, generates the synchronization information 115E and the encoded video frame portion 117E based on portion data of the video frame portion 151E, as described with reference to FIG. 1. The bitstream engine 130A, in response to determining that the video frame portion 151F has a dependency on the video frame portion 151E, determines that the synchronization information 115E and the encoded video frame portion 117E are to be stored in the line buffer 202A. The bitstream engine 130A, in response to determining that the line buffer 202A has available space, stores the synchronization information 115E and the encoded video frame portion 117E in the line buffer 202A. Alternatively, the bitstream engine 130A, in response to determining that the line buffer 202A is full, waits till there is space available in the line buffer 202A to store the synchronization information 115E and the encoded video frame portion 117E in the line buffer 202A. In a particular implementation, the line buffer 202A is configured to store synchronization information and encoded video frame portion of a single video frame portion at a time. In this implementation, the bitstream engine 130A stores the synchronization information 115E and the encoded video frame portion 117E in the line buffer 202A subsequent to the bitstream engine 130B retrieving the synchronization information 115A and the encoded video frame portion 117A from the line buffer 202A. In a particular implementation, the bitstream engine 130A provides a notification to the bitstream engine 130B that information associated with the video frame portion 151E is available in the line buffer 202A, that the video frame portion 151F has a dependency on the video frame portion 151E, or both.

The bitstream engine 130B, subsequent to encoding the video frame portion 151C (Tile1), identifies the video frame portion 151B (Tile3) as the next assigned video frame portion. The bitstream engine 130B, in response to determining that the video frame portion 151B (Tile 3) has a dependency on the video frame portion 151A (Tile1), determines whether information (e.g., the synchronization information 115A and the encoded video frame portion 117A) associated with the video frame portion 151A is available in the line buffer 202A. In a particular aspect, the bitstream engine 130B initiates encoding of the video frame portion 151B in response to determining that the line buffer 202A has available data (e.g., the synchronization information 115A and the encoded video frame portion 117A), that a notification received from the bitstream engine 130A indicates that information associated with the video frame portion 151A is available in the line buffer 202A, or both. The bitstream engine 130B retrieves the synchronization information 115A and the encoded video frame portion 117A from the line buffer 202A and encodes the video frame portion 151B to generate the encoded video frame portion 117B. For example, the bitstream engine 130B encodes the video frame portion 151B (Tile3) based at least in part on the synchronization information 115A (e.g., the prediction mode, the coded block information, the coefficient information, or a combination thereof) associated with encoding the video frame portion 151A (Tile0). The bitstream engine 130B, in response to determining that none of the video frame portions 151 have a dependency on the video frame portion 151B, determines that the encoded video frame portion 117B is not to be stored in the line buffer 202B.

In a particular aspect, the bitstream engine 130A encodes the video frame portion 151E to generate the encoded video frame portion 117E concurrently with the bitstream engine 130B encoding the video frame portion 151B to generate the encoded video frame portion 117B. The video frame portion 151E and the video frame portion 151B can be encoded concurrently subsequent to availability of the synchronization information 115A and the encoded video frame portion 117A in the line buffer 202A and subsequent to availability of the bitstream engine 130B (e.g., after encoding the video frame portion 151C).

The bitstream engine 130A, subsequent to encoding the video frame portion 151E (Tile2) and storing the synchronization information 115E and the encoded video frame portion 117E in the line buffer 202A, identifies the video frame portion 151D (Tile4) as the next assigned video frame portion. The bitstream engine 130A, in response to determining that the video frame portion 151D (Tile 4) has a dependency on the video frame portion 151C (Tile1) and that the synchronization information 115C and the encoded video frame portion 117C are available in the line buffer 202B, retrieves the synchronization information 115C and the encoded video frame portion 117C from the line buffer 202B. The bitstream engine 130A encodes the video frame portion 151D to generate encoded video frame portion. The bitstream engine 130A, in response to determining that none of the video frame portions 151 have a dependency on the video frame portion 151D, determines that the encoded video frame portion corresponding to the video frame portion 151D is not to be stored in the line buffer 202A.

The bitstream engine 130B, subsequent to encoding the video frame portion 151B (Tile3), identifies the video frame portion 151F (Tile5) as the next assigned video frame portion. The bitstream engine 130B, in response to determining that the video frame portion 151F (Tile 5) has a dependency on the video frame portion 151E (Tile2) and that the synchronization information 115E and the encoded video frame portion 117E of the video frame portion 151E is available in the line buffer 202A, retrieves the synchronization information 115E and the encoded video frame portion 117E from the line buffer 202A. The bitstream engine 130B encodes the video frame portion 151F to generate an encoded video frame portion. The bitstream engine 130B, in response to determining that none of the video frame portions 151 have a dependency on the video frame portion 151F, determines that the encoded video frame portion corresponding to the video frame portion 151F is not to be stored in the line buffer 202B.

In a particular aspect, the bitstream engine 130A encodes the video frame portion 151D concurrently with the bitstream engine 130B encoding the video frame portion 151F. The video frame portion 151D and the video frame portion 151F can be encoded concurrently subsequent to availability of the synchronization information 115E and the encoded video frame portion 117E in the line buffer 202A and subsequent to availability of the availability of the synchronization information 115C and the encoded video frame portion 117E in the line buffer 202B. Concurrent encoding of some video frame portions without dependency on each other is provided as an illustrative example. In other examples, some video frame portions without dependency on each other can be encoded non-concurrently (e.g., sequentially). To illustrate, the video frame portion 151D can encoded by the bitstream engine 130A before or after encoding of the video frame portion 151F by the bitstream engine 130B.

A diagram 270 is an example of operations associated with using multiple bitstream engines to process video that may be performed at the plurality of bitstream engines 140, the video decoder 122, the device 104, the system 100 of FIG. 1, or a combination thereof.

Similar to assignment by the video encoder 112 of the video frame portions 151 to the plurality of bitstream engines 130, the video decoder 122 assigns the encoded video frame portions 117 to the plurality of bitstream engines 140. In a particular aspect, the video decoder 122 assigns alternating encoded video frame portions 117 to the plurality of bitstream engines 140. For example, the video decoder 122 assigns the encoded video frame portion 117A (corresponding to Tile0), an encoded video frame portion 117E (corresponding to Tile2), and an encoded video frame portion 117D (corresponding to Tile 4) to the bitstream engine 140A and assigns the encoded video frame portion 117C (corresponding to Tile1), the encoded video frame portion 117B (corresponding to Tile3), and an encoded video frame portion 117F (corresponding to Tile 5) to the bitstream engine 140B.

Similar to the plurality of bitstream engines 130, the plurality of bitstream engines 140 store and retrieve data from line buffers based on dependency. In a particular implementation, each of the bitstream engines 140 has access to dependency information indicating dependencies between various encoded video frame portions. In a particular implementation, the video decoder 122 provides encoded video frame dependency information to each of the bitstream engines 140 indicating whether an encoded video frame portion has a dependency on another encoded video frame portion.

The bitstream engine 140A, in response to determining that the encoded video frame portion 117A (corresponding to Tile0) has no dependency on any other encoded video frame portion, generates the synchronization information 125A and the decoded portion data 121A based on the encoded video frame portion 117A, as described with reference to FIG. 1. In a particular implementation, the synchronization information 125A is based on (e.g., depends on or indicates) a prediction mode (e.g., an inter-prediction mode or an intra-prediction mode), coded block information, coefficient information, or a combination thereof, associated with decoding the encoded video frame portion 117A (Tile0). The bitstream engine 140A, in response to determining that the encoded video frame portion 117B has a dependency on the encoded video frame portion 117A, stores the synchronization information 125A and the decoded portion data 121A in a line buffer 204A of the video decoder 122. In a particular implementation, the bitstream engine 140A provides a notification to the bitstream engine 140B that information associated with the encoded video frame portion 117A is available in the line buffer 204A, that the encoded video frame portion 117B has a dependency on the encoded video frame portion 117A, or both.

The bitstream engine 140B, in response to determining that the encoded video frame portion 117C (corresponding to Tile1) has no dependency on any other video frame portion, generates the synchronization information 125C and the decoded portion data 121C based on the encoded video frame portion 117C, as described with reference to FIG. 1. The bitstream engine 140B, in response to determining that the encoded video frame portion 117D has a dependency on the encoded video frame portion 117C, stores the synchronization information 125C and the decoded portion data 121C in a line buffer 204B of the video decoder 122. In a particular implementation, the bitstream engine 140B provides a notification to the bitstream engine 140A that information associated with the encoded video frame portion 117C is available in the line buffer 204B, that the encoded video frame portion 117D has a dependency on the encoded video frame portion 117C, or both.

In a particular aspect, the bitstream engine 140A decodes the encoded video frame portion 117A to generate the decoded portion data 121A concurrently with the bitstream engine 140B decoding the encoded video frame portion 117C to generate the decoded portion data 121C. The encoded video frame portion 117A and the encoded video frame portion 117C can be decoded concurrently because each of the encoded video frame portion 117A and the encoded video frame portion 117C have no dependency on any other encoded video frame portion.

The bitstream engine 140A, subsequent to decoding the encoded video frame portion 117A (corresponding to Tile0), identifies the encoded video frame portion 117E (corresponding to Tile2) as the next assigned encoded video frame portion. The bitstream engine 140A, in response to determining that the encoded video frame portion 117E (corresponding to Tile 2) has no dependency on any other encoded video frame portion, generates the synchronization information 125E and the decoded portion data 121E based on the encoded video frame portion 117E, as described with reference to FIG. 1. The bitstream engine 140A, in response to determining that the encoded video frame portion 117F has a dependency on the encoded video frame portion 117E, determines that the synchronization information 125E and the decoded portion data 121E are to be stored in the line buffer 204A. The bitstream engine 140A, in response to determining that the line buffer 204A has available space, stores the synchronization information 125E and the decoded portion data 121E in the line buffer 204A. Alternatively, the bitstream engine 140A, in response to determining that the line buffer 204A is full, waits till there is space available in the line buffer 204A to store the synchronization information 125E and the decoded portion data 121E in the line buffer 204A. In a particular implementation, the line buffer 204A is configured to store synchronization information and decoded portion data of a single video frame portion at a time. In this implementation, the bitstream engine 140A stores the synchronization information 125E and the decoded portion data 121E in the line buffer 204A subsequent to the bitstream engine 140B retrieving the synchronization information 125A and the decoded portion data 121A from the line buffer 204A. In a particular implementation, the bitstream engine 140A provides a notification to the bitstream engine 140B that information associated with the encoded video frame portion 117E is available in the line buffer 204A, that the encoded video frame portion 117F has a dependency on the encoded video frame portion 117E, or both.

The bitstream engine 140B, subsequent to decoding the encoded video frame portion 117C (corresponding to Tile1), identifies the encoded video frame portion 117B (corresponding to Tile3) as the next assigned encoded video frame portion. The bitstream engine 140B, in response to determining that the encoded video frame portion 117B (corresponding to Tile 3) has a dependency on the encoded video frame portion 117A (corresponding to Tile1), determines whether the synchronization information 125A and the decoded portion data 121A of the encoded video frame portion 117A are available in the line buffer 204A. In a particular aspect, the bitstream engine 140B initiates decoding of the encoded video frame portion 117B in response to determining that the line buffer 204A has available data (e.g., the synchronization information 125A and the decoded portion data 121A), that a notification received from the bitstream engine 140A indicates that information (e.g., the synchronization information 125A and the decoded portion data 121A) associated with the encoded video frame portion 117A is available in the line buffer 204A, or both. The bitstream engine 140B retrieves the synchronization information 125A and the decoded portion data 121A from the line buffer 204A and decodes the encoded video frame portion 117B to generate the decoded portion data 121B. For example, the bitstream engine 130B decodes the encoded video frame portion 117B (Tile3) based at least in part on the synchronization information 125A (e.g., the prediction mode, the coded block information, the coefficient information, or a combination thereof) associated with decoding the video frame portion 117A (Tile0). The bitstream engine 140B, in response to determining that none of the video frame portions 151 have a dependency on the encoded video frame portion 117B, determines that the decoded portion data 121B is not to be stored in the line buffer 204B.

In a particular aspect, the bitstream engine 140A decodes the encoded video frame portion 117E to generate the decoded portion data 121E concurrently with the bitstream engine 140B decoding the encoded video frame portion 117B to generate the decoded portion data 121B. The encoded video frame portion 117E and the encoded video frame portion 117B can be decoded concurrently subsequent to availability of the synchronization information 125A and the decoded portion data 121A in the line buffer 204A and subsequent to availability of the bitstream engine 140B (e.g., after decoding the encoded video frame portion 117C).

The bitstream engine 140A, subsequent to decoding the encoded video frame portion 117E (corresponding to Tile2) and storing the synchronization information 125E and the decoded portion data 121E in the line buffer 204A, identifies the encoded video frame portion 117D (corresponding to Tile4) as the next assigned encoded video frame portion. The bitstream engine 140A, in response to determining that the encoded video frame portion 117D (corresponding to Tile 4) has a dependency on the encoded video frame portion 117C (corresponding to Tile1) and that the synchronization information 125C and the decoded portion data 121C are available in the line buffer 204B, retrieves the synchronization information 125C and the decoded portion data 121C from the line buffer 204B. The bitstream engine 140A decodes the encoded video frame portion 117D to generate decoded portion data. The bitstream engine 140A, in response to determining that none of the encoded video frame portions 117 have a dependency on the encoded video frame portion 117D, determines that the decoded portion data corresponding to the encoded video frame portion 117D is not to be stored in the line buffer 204A.

The bitstream engine 140B, subsequent to decoding the encoded video frame portion 117B (corresponding to Tile3), identifies the encoded video frame portion 117F (corresponding to Tile5) as the next assigned encoded video frame portion. The bitstream engine 140B, in response to determining that the encoded video frame portion 117F (corresponding to Tile 5) has a dependency on the encoded video frame portion 117E (corresponding to Tile2) and that the synchronization information 125E and the decoded portion data 121E of the encoded video frame portion 117E are available in the line buffer 204A, retrieves the synchronization information 125E and the decoded portion data 121E from the line buffer 204A. The bitstream engine 140B decodes the encoded video frame portion 117F to generate decoded portion data. The bitstream engine 140B, in response to determining that none of the encoded video frame portions 117 have a dependency on the encoded video frame portion 117F, determines that the decoded portion data corresponding to the encoded video frame portion 117F is not to be stored in the line buffer 204B.

In a particular aspect, the bitstream engine 140A decodes the encoded video frame portion 117D concurrently with the bitstream engine 140B decoding the encoded video frame portion 117F. The encoded video frame portion 117D and the encoded video frame portion 117F can be decoded concurrently subsequent to availability of the synchronization information 125E and the decoded portion data 121E in the line buffer 204A and subsequent to availability of the availability of the synchronization information 125C and the decoded portion data 121E in the line buffer 204B. Concurrent decoding of some encoded video frame portions without dependency on each other is provided as an illustrative example. In other examples, some encoded video frame portions without dependency on each other can be decoded non-concurrently (e.g., sequentially). To illustrate, the encoded video frame portion 117D can decoded by the bitstream engine 140A before or after decoding of the encoded video frame portion 117F by the bitstream engine 140B.

Use of multiple bitstream engines enables concurrent processing of video data that reduces processing time and increases throughput. Exchanging synchronization information between bitstream engines enables dependencies between video data to be considered during the concurrent processing.

Figure 3:
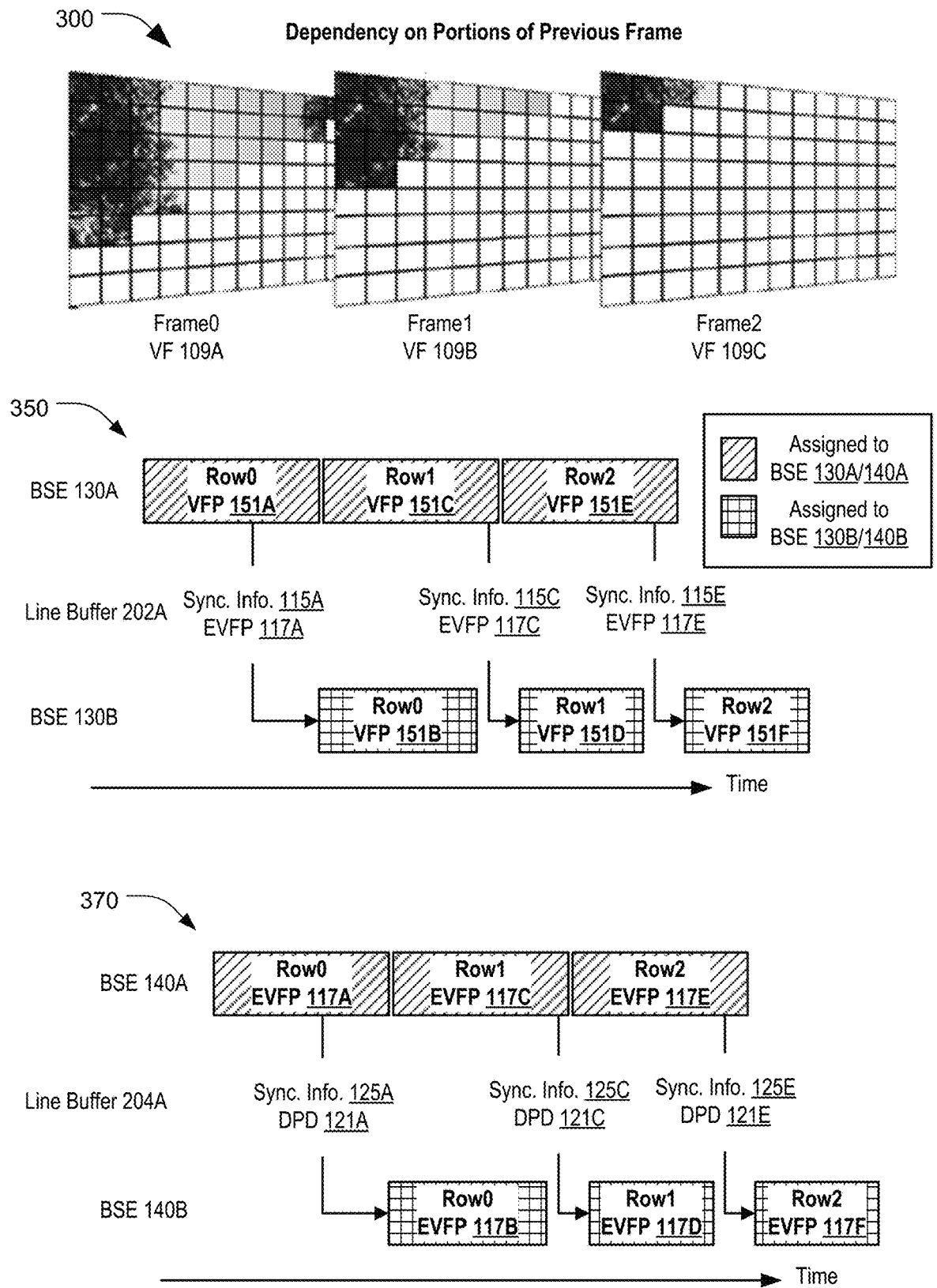
FIG. 3 is a diagram of an illustrative aspect of operations associated with using multiple bitstream engines to process video, in accordance with some examples of the present disclosure.

FIG. 3 is a diagram of an illustrative aspect of operations associated with using multiple bitstream engines to process video based on inter-frame dependency. In an example 300, each of the video frames 109A-C is divided into rows corresponding to the video frame portions 151 (e.g., slices). To illustrate, the video frame 109A includes the video frame portion 151A (Row0), the video frame portion 151C (Row1), the video frame portion 151E (Row2), one or more additional rows, or a combination thereof. The video frame 109B includes the video frame portion 151B (Row0), the video frame portion 151D (Row1), the video frame portion 151F (Row2), one or more additional rows, or a combination thereof. In a particular aspect, the video frame portion 151A (e.g., a row, a block, a tile, etc.) is from a first location (e.g., first shape at first coordinates) of the video frame 109A and the video frame portion 151B (e.g., a row, a block, a tile, etc.) is from the first location (e.g., the first shape at the first coordinates) of the video frame 109B.

In the example 300, each of the video frame portions 151 (e.g., row(s)) of the video frame 109B has a dependency on a corresponding one of the video frame portions 151 (e.g., row(s)) of the video frame 109A. For example, the video frame portion 151B, the video frame portion 151D, and the video frame portion 151F of the video frame 109B have a dependency on the video frame portion 151A, the video frame portion 151C, and the video frame portion 151E, respectively.

A diagram 350 is an example of operations associated with using multiple bitstream engines to process video that may be performed at the plurality of bitstream engines 130, the video encoder 112, the device 102, the system 100 of FIG. 1, or a combination thereof.

The video encoder 112 assigns video frame portions 151 of the video frame 109A to the bitstream engine 130A and video frame portions 151 of the video frame 109B to the bitstream engine 130B. For example, the video encoder 112 assigns the video frame portion 151A (Row0 of the video frame 109A), the video frame portion 151C (Row1 of the video frame 109A), and the video frame portion 151E (Row2 of the video frame 109A) to the bitstream engine 130A and assigns the video frame portion 151B (Row0 of the video frame 109B), the video frame portion 151D (Row1 of the video frame 109B), and the video frame portion 151F (Row2 of the video frame 109B) to the bitstream engine 130B.

The bitstream engine 130A generates synchronization information and encoded video frame portion for each of the video frame portions of the video frame 109A and stores the synchronization information and the encoded video frame portion in the line buffer 202A. The bitstream engine 130B retrieves the synchronization information and the encoded video frame portion from the line buffer 202A to generate encoded video frame portion for a corresponding video frame portion of the video frame 109B. For example, the bitstream engine 130A generates the synchronization information 115A and the encoded video frame portion 117A based on the portion data 111A of the video frame portion 151A (Row0 of the video frame 109A), as described with reference to FIG. 1. In a particular implementation, the synchronization information 115A is based on (e.g., depends on or indicates) co-located motion vectors, a reference index, a reference mode, or a combination thereof, associated with encoding the video frame portion 151A (Row0 of the video frame 109A). The bitstream engine 130A stores the synchronization information 115A and the encoded video frame portion 117A in the line buffer 202A of the video encoder 112.

The bitstream engine 130B, in response to determining that the video frame portion 151B (Row 0 of the video frame 109B) has a dependency on the video frame portion 151A (Row 0 of the video frame 109A) and that the synchronization information 115A and the encoded video frame portion 117A of the video frame portion 151A are available in the line buffer 202A, retrieves the synchronization information 115A and the encoded video frame portion 117A from the line buffer 202A. The bitstream engine 130B encodes the video frame portion 151B to generate the encoded video frame portion 117B. For example, the bitstream engine 130B encodes the video frame portion 151B (Row0 of the video frame 109B) based at least in part on the synchronization information 115A (e.g., the co-located motion vectors, a reference index, a reference mode, or a combination thereof) associated with encoding the video frame portion 151A (Row0 of the video frame 109A).

In a particular aspect, the bitstream engine 130A encodes the video frame portion 151C (Row 1 of the video frame 109A) to generate the encoded video frame portion 117C concurrently with the bitstream engine 130B encoding the video frame portion 151B to generate the encoded video frame portion 117B. The video frame portion 151C (Row 1 of the video frame 109A) and the video frame portion 151B (Row 0 of the video frame 109B) can be encoded concurrently subsequent to availability of the synchronization information 115A and the encoded video frame portion 117A in the line buffer 202A.

A diagram 370 is an example of operations associated with using multiple bitstream engines to process video that may be performed at the plurality of bitstream engines 140, the video decoder 122, the device 104, the system 100 of FIG. 1, or a combination thereof.

Similar to assignment by the video encoder 112 of the video frame portions 151 to the plurality of bitstream engines 130, the video decoder 122 assigns the encoded video frame portions 117 to the plurality of bitstream engines 140. The video decoder 122 assigns encoded video frame portions 117 of the video frame 109A to the bitstream engine 140A and encoded video frame portions 117 of the video frame 109B to the bitstream engine 140B. For example, the video decoder 122 assigns the encoded video frame portion 117A (corresponding to Row0 of the video frame 109A), the encoded video frame portion 117C (corresponding to Row1 of the video frame 109A), and the encoded video frame portion 117E (corresponding to Row2 of the video frame 109A) to the bitstream engine 140A and assigns the encoded video frame portion 117B (corresponding to Row0 of the video frame 109B), the encoded video frame portion 117D (corresponding to Row1 of the video frame 109B), and the encoded video frame portion 117F (corresponding to Row2 of the video frame 109B) to the bitstream engine 140B.

The bitstream engine 140A generates synchronization information and decoded portion data for each of the encoded video frame portions of the video frame 109A and stores the synchronization information and the decoded portion data in the line buffer 204A. The bitstream engine 140B retrieves the synchronization information and the decoded portion data from the line buffer 204A to generate decoded portion data for a corresponding encoded video frame portion of the video frame 109B. For example, the bitstream engine 140A generates the synchronization information 125A and the decoded portion data 121A based on the portion data 111A of the encoded video frame portion 117A (corresponding to Row 0 of the video frame 109A), as described with reference to FIG. 1. In a particular implementation, the synchronization information 125A is based on (e.g., depends on or indicates) co-located motion vectors, a reference index, a reference mode, or a combination thereof, associated with decoding the encoded video frame portion 117A (corresponding to Row0 of the video frame 109A). The bitstream engine 140A stores the synchronization information 125A and the decoded portion data 121A in the line buffer 204A of the video encoder 112.

The bitstream engine 140B, in response to determining that the encoded video frame portion 117B (corresponding to Row 0 of the video frame 109B) has a dependency on the encoded video frame portion 117A (corresponding to Row 0 of the video frame 109A) and that the synchronization information 125A and the decoded portion data 121A of the encoded video frame portion 117A are available in the line buffer 204A, retrieves the synchronization information 125A and the decoded portion data 121A from the line buffer 204A. The bitstream engine 140B decodes the encoded video frame portion 117B to generate the decoded portion data 121B. For example, the bitstream engine 130B decodes the encoded video frame portion 117B (corresponding to Row 0 of the video frame 109B) based at least in part on the synchronization information 125A (e.g., the co-located motion vectors, a reference index, a reference mode, or a combination thereof) associated with decoding the video frame portion 117A (corresponding to Row 0 of the video frame 109A).

In a particular aspect, the bitstream engine 140A decodes the encoded video frame portion 117C (Row 1 of the video frame 109A) to generate the decoded portion data 121C concurrently with the bitstream engine 140B decoding the encoded video frame portion 117B to generate the decoded portion data 121B. The encoded video frame portion 117C (Row 1 of the video frame 109A) and the encoded video frame portion 117B (Row 0 of the video frame 109B) can be decoded concurrently subsequent to availability of the synchronization information 125A and the decoded portion data 121A in the line buffer 204A.

Use of multiple bitstream engines enables concurrent processing of video data that reduces processing time and increases throughput. Exchanging synchronization information between bitstream engines enables dependencies between video data to be considered during the concurrent processing.

Figure 4:
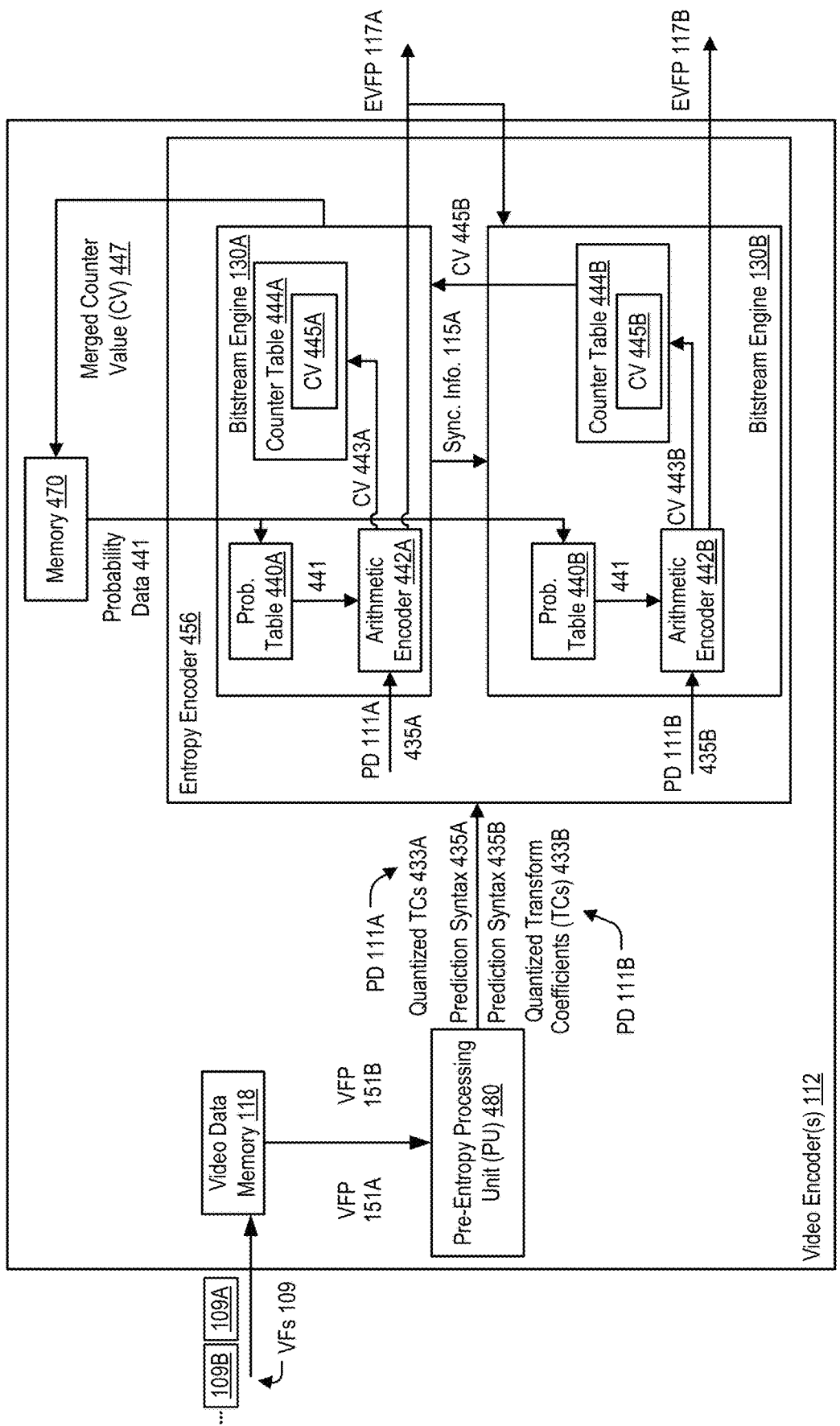
FIG. 4 is a diagram of an illustrative aspect of operation of a video encoder of the illustrative system of FIG. 1, in accordance with some examples of the present disclosure.

Referring to FIG. 4, a diagram illustrating an example of the video encoder 112 is shown. The video encoder 112 includes the video data memory 118 coupled via a pre-entropy processing unit (PU) 480 to an entropy encoder 456. The entropy encoder 456 includes the plurality of bitstream engines 130, such as the bitstream engine 130A and the bitstream engine 130B. The video encoder 112 also includes a memory 470 coupled to the plurality of bitstream engines 130. In some examples, the video encoder 112 includes the video data memory 118 and the memory 470. In other examples, the video data memory 118, the memory 470, or both, are external to the video encoder 112.

The video encoder 112 may be configured to utilize techniques for BAC, as described herein. The video encoder 112 will be described in the context of HEVC coding for purposes of illustration, but without limitation of this disclosure as to other coding standards or methods. For example, the video encoder 112 may operate according to other video coding standards, including H.266. The video encoder 112 may perform intra- and inter-coding of CUs within video frames. Intra-coding relies on spatial prediction to reduce or remove spatial redundancy in video data within a given video frame. Inter-coding relies on temporal prediction to reduce or remove temporal redundancy between a current frame and previously coded frames of a video sequence. Intra-mode (I-mode) may refer to any of several spatial-based video compression modes. Inter-modes such as uni-directional prediction (P-mode) or bi-directional prediction (B-mode) may refer to any of several temporal-based video compression modes.

The video data memory 118 may be configured to store video data to be encoded by the components of video encoder 112. The video data stored in the video data memory 118 may be obtained, for example, from a video source (e.g., the camera 106 of FIG. 1). During the encoding process, the video encoder 112 receives a video frame 109 to be coded. The video frame 109 may be divided into multiple video frame portions 151.

The pre-entropy processing unit 480 retrieves the video frame portions 151 from the video data memory 118 and generates portion data 111, as further described with reference to FIG. 5. For example, the pre-entropy processing unit 480 retrieves the video frame portion 151A from the video data memory 118 and generates the portion data 111A (e.g., quantized transform coefficients 433A and prediction syntax 435A). As another example, the pre-entropy processing unit 480 retrieves the video frame portion 151B from the video data memory 118 and generates the portion data 111B (e.g., quantized transform coefficients 433B and prediction syntax 435B).

In a particular aspect, the pre-entropy processing unit 480 retrieves video frame portions corresponding to the same video frame (e.g., the video frame 109A) in order before retrieving video frame portions of the next video frame (e.g., the video frame 109B). For example, the video encoder 112 encodes the video frame portions 151 of the video frame 109A, as described with reference to FIG. 2, prior to encoding the video frame portions 151 of the video frame 109B. In this example, the same video frame (e.g., the video frame 109A) includes the video frame portion 151A and the video frame portion 151B.

In a particular aspect, the pre-entropy processing unit 480 retrieves video frame portions corresponding to different video frames. For example, the video encoder 112 concurrently encodes the video frame portions 151 of the video frame 109A with encoding the video frame portions 151 of the video frame 109B, as described with reference to FIG. 3. In this example, the video frame 109A includes the video frame portion 151A and the video frame 109B includes the video frame portion 151B.

The pre-entropy processing unit 480, in response to determining that the video frame portion 151A is assigned to the bitstream engine 130A, provides the portion data 111A (e.g., the quantized transform coefficients 433A and the prediction syntax 435A) corresponding to the video frame portion 151A to the bitstream engine 130A. The pre-entropy processing unit 480, in response to determining that the video frame portion 151B is assigned to the bitstream engine 130B, provides the portion data 111B (e.g., the quantized transform coefficients 433B and the prediction syntax 435B) corresponding to the video frame portion 151B to the bitstream engine 130B.

The entropy encoder 456 may apply entropy coding such as CAVLC, BAC, CABAC, PIPE, Golomb coding, Golomb-Rice coding, exponential Golomb coding, syntax-based context-adaptive binary arithmetic coding (SBAC), or another entropy coding methodology to the quantized transform coefficients, the prediction syntax, or a combination thereof. To perform CABAC, the entropy encoder 456 may select a context model to apply to a certain context to encode symbols to be transmitted. The context may relate to, for example, whether neighboring values are non-zero or not. The entropy encoder 456 may also entropy encode syntax elements, such as the signal representative of the selected transform.

Each of the plurality of bitstream engines 130 includes an arithmetic encoder 442 coupled to a probability table 440 and a counter table 444, as further described with reference to FIG. 6. For example, the bitstream engine 130A includes an arithmetic encoder 442A coupled to a probability table 440A and a counter table 444A. As another example, the bitstream engine 130B includes an arithmetic encoder 442B coupled to a probability table 440B and a counter table 444B.

The memory 470 is configured to store probability data 441 associated with one or more previously encoded video frames. Each of the plurality of bitstream engines 130 is configured to retrieve the probability data 441 from the memory 470 prior to encoding any video frame portions (e.g., tiles) of a subsequent video frame. Each of the plurality of bitstream engines 130 is configured to copy the probability data 441 from the memory 470 to a probability table 440. For example, the bitstream engine 130A and the bitstream engine 130B copy the probability data 441 from the memory 470 to the probability table 440A and the probability table 440B, respectively. Storing the probability data 441 in probability tables 440 is provided as an illustrative example. In other examples, a bitstream engine can store and retrieve probability data from various types of storage (e.g., a register) or data structures other than a table.

In a particular implementation, the bitstream engine 130A and the bitstream engine 130B encode distinct video frame portions of the same video frame, as described with reference to FIG. 2. For example, prior to encoding the video frame 109B, the bitstream engine 130A and the bitstream engine 130B retrieve the probability data 441 associated with previous encoding of the video frame 109A.

In a particular implementation, the bitstream engine 130A and the bitstream engine 130B encode video frame portions of different video frames, as described with reference to FIG. 3. For example, prior to encoding the video frame 109C and another video frame, the bitstream engine 130A and the bitstream engine 130B retrieve the probability data 441 associated with previous encoding of the video frame 109A and the video frame 109B.

The arithmetic encoder 442A generates the encoded video frame portion 117A by encoding the portion data 111A based on the probability data 441, as further described with reference to FIG. 6. The arithmetic encoder 442A updates a counter value 445A of the counter table 444A based on the encoded video frame portion 117A, as further described with reference to FIG. 6.

The arithmetic encoder 442B generates the encoded video frame portion 117B by encoding the portion data 111B based at least in part on the probability data 441, as further described with reference to FIG. 6. In a particular aspect, the bitstream engine 130A provides the encoded video frame portion 117A, the synchronization information 115A, or both, to the bitstream engine 130B. For example, the bitstream engine 130A stores the encoded video frame portion 117A, the synchronization information 115A, or both, in the line buffer 202A, and the bitstream engine 130B retrieves the encoded video frame portion 117A, the synchronization information 115A, or both, from the line buffer 202A. In a particular implementation, the synchronization information 115A is based on (e.g., depends on or indicates) a prediction mode (e.g., an intra-prediction mode or an inter-prediction mode), coded block information, coefficient information, motion vector information, reference index, reference mode, or a combination thereof, associated with encoding the video frame portion 151A.

The bitstream engine 130B generates the encoded video frame portion 117B based on the encoded video frame portion 117A, the synchronization information 115A, the probability data 441, or a combination thereof, as further described with reference to FIG. 6. The arithmetic encoder 442B updates a counter value 445B of the counter table 444B based on the encoded video frame portion 117B, as further described with reference to FIG. 6. In some examples, the bitstream engine 130A provides the synchronization information 115A, the encoded video frame portion 117A, or both, to the bitstream engine 130B. In other examples, the bitstream engine 130B provides synchronization information, the encoded video frame portion 117B, or both, to the bitstream engine 130A, as described with reference to FIG. 2.

In a particular implementation, one bitstream engine of the plurality of bitstream engines 130 retrieves the counter values from the counter tables of the other bitstream engines to generate a merged counter value 447 and updates the probability data 441 in the memory 470 based on the merged counter value 447, as described in more detail below. In a particular implementation, one bitstream engine of the plurality of bitstream engines 130 retrieves the counter values in response to determining that a last video frame portion of a video frame that is to be encoded by the bitstream engine has been encoded by the bitstream engine.

In a particular example, the bitstream engine 130B provides the counter value 445B of the counter table 444B to the bitstream engine 130A. The bitstream engine 130A determines the merged counter value 447 based on the counter value 445A and the counter value 445B (e.g., the merged counter value 447=the counter value 445A+the counter value 445B) and stores the merged counter value 447 as the counter value 445A in the counter table 444A. The bitstream engine 130A updates the probability data 441 based on the merged counter value 447. In a particular aspect, the bitstream engine 130A generates a merged counter value 447 for each syntax element by merging the counter value 445A for the syntax element from the bitstream engine 130A with the counter value 445B for the syntax element from the bitstream engine 130B. In a particular implementation, the bitstream engine 130A performs a context adaptation process for each syntax element using the merged counter values of the syntax elements and updates the probability data 441 during performance of the context adaptation process. The bitstream engine 130A stores the updated probability data 441 in the probability table 440A, the memory 470, or both. In another example, the bitstream engine 130A provides the counter value 445A of the counter table 444A to the bitstream engine 130B. The bitstream engine 130B determines the merged counter value 447 based on the counter value 445A and the counter value 445B (e.g., the merged counter value 447=the counter value 445A+the counter value 445B) and stores the merged counter value 447 as the counter value 445B in the counter table 444B. The bitstream engine 130B determines an updated value of the probability data 441 based on the merged counter value 447. The bitstream engine 130B stores the updated value of the probability data 441 in the probability table 440B, the memory 470, or both.

Following the entropy coding by the entropy encoder 456, the resulting encoded video (e.g., the encoded video frame portions 117) may be transmitted to another device, such as the video decoder 122, or archived for later transmission or retrieval.

Figure 5:
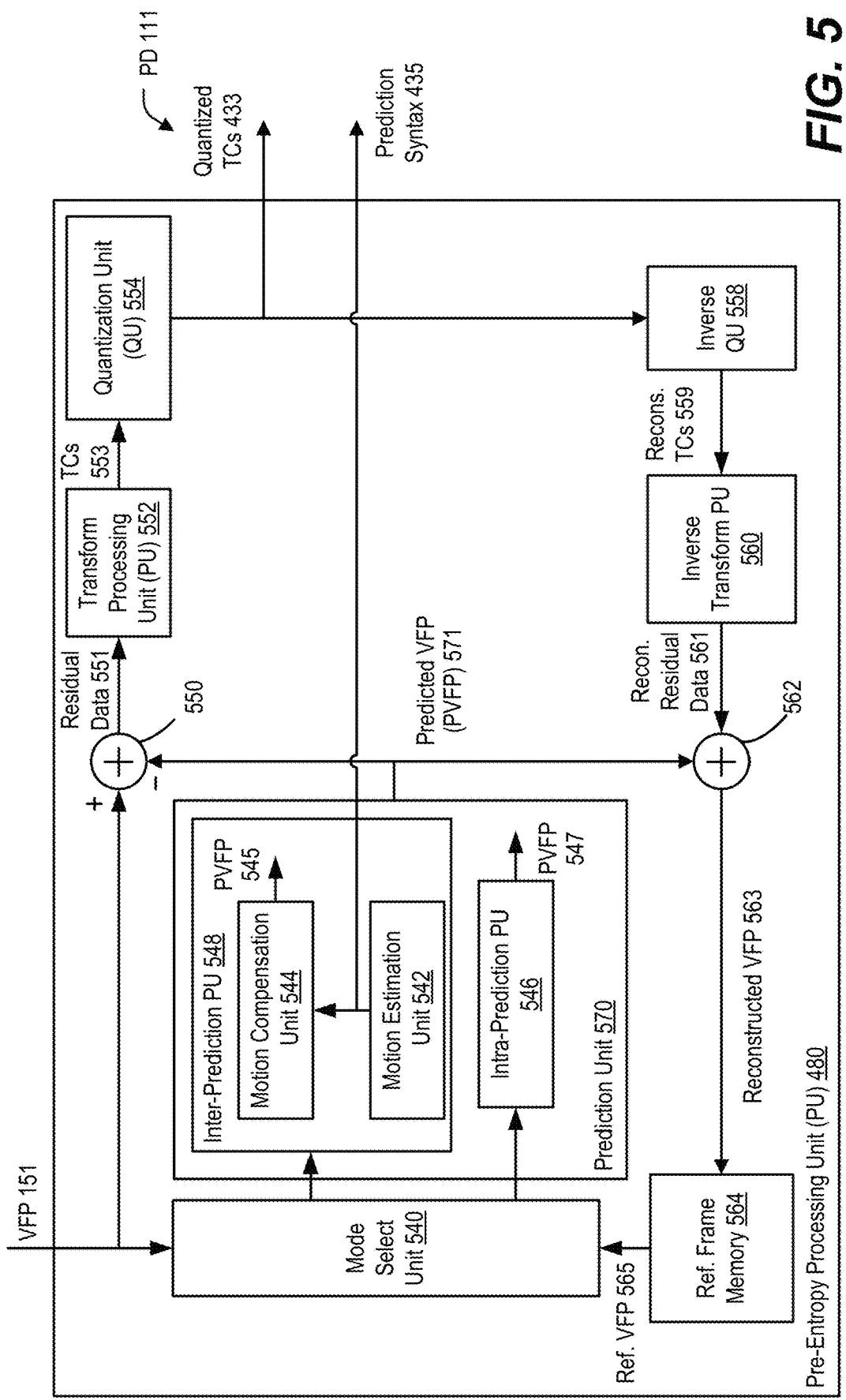
FIG. 5 is a diagram of an illustrative aspect of operation of a pre-entropy processing unit of the illustrative video encoder of FIG. 4, in accordance with some examples of the present disclosure.

Referring to FIG. 5, a diagram of an example of the pre-entropy processing unit 480 is shown. The pre-entropy processing unit 480 includes a mode select unit 540 coupled to a reference frame memory 564, a prediction unit 570, and a residual generation unit 550. The prediction unit 570 includes an inter-prediction processing unit 548, an intra-prediction processing unit 546, or both. The inter-prediction processing unit 548 includes a motion estimation unit 542, a motion compensation unit 544, or both.

The residual generation unit 550 is coupled via a transform processing unit 552 to a quantization unit (QU) 554. The transform processing unit 552 applies the actual transform (e.g., a Fourier transform) or combinations of transform to a block of residual data, and is not to be confused with a block of transform coefficients, which also may be referred to as a transform unit of a CU. For video frame portion reconstruction, the pre-entropy processing unit 480 also includes an inverse quantization unit 558 coupled via an inverse transform processing unit 560 to a summer 562. A deblocking filter (not shown in FIG. 5) may also be included to filter video frame portion boundaries to remove blockiness artifacts from reconstructed video. If desired, the deblocking filter would typically filter the output of summer 562. The summer 562 is coupled to the residual generation unit 550 and the reference frame memory 564.

The reference frame memory 564 may be a reference picture memory (decoded picture buffer) that stores reference video data for use in encoding video data by the video encoder 112, e.g., in intra- or inter-coding modes. The video data memory 118 of FIG. 1, the memory 470 of FIG. 4, and the reference frame memory 564 may be formed by any of a variety of memory devices, such as dynamic random-access memory (DRAM), including synchronous DRAM (SDRAM), magnetoresistive RAM (MRAM), resistive RAM (RRAM), or other types of memory devices. The video data memory 118, the memory 470, and the reference frame memory 564 may be provided by the same memory device or separate memory devices. In various examples, the video data memory 118, the memory 470, the reference frame memory 564, or a combination thereof, may be on-chip with other components of video encoder 112, or off-chip relative to those components.

The inter-prediction processing unit 548 is configured to perform inter-predictive coding of a received video frame portion 151 relative to one or more video frame portions in one or more reference frames to provide temporal compression. The intra-prediction processing unit 546 is configured to perform intra-predictive coding of the received video frame portion 151 relative to one or more neighboring video frame portions in the same frame or slice as the video frame portion 151 to be coded to provide spatial compression.

The mode select unit 540 is configured to select one of the coding modes, intra or inter, e.g., based on error (i.e., distortion) results for each mode, and provides the resulting intra- or inter-predicted video frame portion (e.g., a prediction unit) to residual generation unit 550 (e.g., a summer) to generate residual data 551 and to the summer 562 to generate a reconstructed video frame portion 563 for use in a reference frame. For example, the mode select unit 540 send an activation signal to either the inter-prediction processing unit 548 to generate a predicted video frame portion 545 or an activation signal to the intra-prediction processing unit 546 to generate a predicted video frame portion 547. The prediction unit 570 provides either the predicted video frame portion 545 or the predicted video frame portion 547 as a predicted video frame portion 571 to the residual generation unit 550 and the summer 562. The summer 562 combines the predicted video frame portion 571 with inverse quantized, inverse transformed data from the inverse transform processing unit 560 for the video frame portion 151 to reconstruct the encoded video frame portion, as described in greater detail below. Some video frames may be designated as I-frames, where all video frame portions in an I-frame are encoded in an intra-prediction mode. In some cases, the intra-prediction processing unit 546 may perform intra-prediction encoding of a video frame portion in a P- or B-frame, e.g., when motion search performed by the motion estimation unit 542 does not result in a sufficient prediction of the video frame portion.

The motion estimation unit 542 and the motion compensation unit 544 may be highly integrated, but are illustrated separately for conceptual purposes. Motion estimation (or motion search) is the process of generating motion vectors, which estimate motion for video frame portions. A motion vector, for example, may indicate the displacement of a prediction unit (e.g., a predicted video frame portion) in a current frame relative to a reference sample (e.g., a reference video frame portion 565) of a reference frame. The motion estimation unit 542 calculates a motion vector for a prediction unit of an inter-coded frame by comparing the prediction unit to reference samples of a reference frame stored in the reference frame memory 564. A reference sample may be a video frame portion that is found to closely match the portion of the CU including the prediction unit being coded in terms of pixel difference, which may be determined by sum of absolute difference (SAD), sum of squared difference (SSD), or other difference metrics. The reference sample may occur anywhere within a reference frame or reference slice, and not necessarily at a video frame portion (e.g., coding unit) boundary of the reference frame or slice. In some examples, the reference sample may occur at a fractional pixel position.

The motion estimation unit 542 sends the calculated motion vector and the prediction syntax 435 to the entropy encoder 456 and to the motion compensation unit 544. The portion (e.g., the reference video frame portion 565) of the reference frame identified by a motion vector may be referred to as a reference sample. The motion compensation unit 544 may calculate a prediction value for a prediction unit (e.g., the predicted video frame portion 545) of a current CU, e.g., by retrieving the reference sample identified by a motion vector for the prediction unit.

The intra-prediction processing unit 546 may perform intra-prediction on the received video frame portion (e.g., the video frame portion 151), as an alternative to inter-prediction performed by the inter-prediction processing unit 548. The intra-prediction processing unit 546 may predict the video frame portion (e.g., the predicted video frame portion 547) relative to neighboring, previously coded video frame portions, e.g., video frame portions above, above and to the right, above and to the left, or to the left of the current video frame portion (e.g., the video frame portion 151), assuming a left-to-right, top-to-bottom encoding order for video frame portions.

The intra-prediction processing unit 546 may select an intra-prediction mode by, for example, calculating error values for various intra-prediction modes and selecting a mode that yields the lowest error value. Directional prediction modes may include functions for combining values of spatially neighboring pixels and applying the combined values to one or more pixel positions in a prediction unit. Once values for all pixel positions in the prediction unit have been calculated, the intra-prediction processing unit 546 may calculate an error value for the prediction mode based on pixel differences between the prediction unit (e.g., the predicted video frame portion 547) and the received video frame portion (e.g., the video frame portion 151) to be encoded. The intra-prediction processing unit 546 may continue testing intra-prediction modes until an intra-prediction mode that yields an acceptable error value is discovered. Intra-prediction processing unit 546 may then send the prediction unit (e.g., the predicted video frame portion 547) as the predicted video frame portion 571 to the residual generation unit 550.

The pre-entropy processing unit 480 forms a residual video frame portion (e.g., the residual data 551) by subtracting the prediction data (e.g., the predicted video frame portion 571) calculated by the inter-prediction processing unit 548 or the intra-prediction processing unit 546 from the original video frame portion (e.g., the video frame portion 151) being coded. The residual generation unit 550 represents the component or components that perform this subtraction operation. The residual data 551 may correspond to a two-dimensional matrix of pixel difference values, where the number of values in the residual data 551 is the same as the number of pixels in the predicted video frame portion 571. The values in the residual data 551 (e.g., the residual video frame portion) may correspond to the differences, i.e., error, between values of co-located pixels in the predicted video frame portion 571 and in the video frame portion 151. The differences may be based on differences in chroma or luma values depending on the type of video frame portion that is coded.

The transform processing unit 552 may form one or more transform units from the residual data 551. The transform processing unit 552 selects a transform from among a plurality of transforms (e.g., a discrete cosine transform (DCT), an integer transform, a wavelet transform, a mode-dependent non-separable secondary transform (MDNSST), a signal dependent transform, a Karhunen-Loeve transform (KLT), or a combination thereof). The transform may be selected based on one or more coding characteristics, such as video frame portion size, coding mode, or the like. The transform processing unit 552 then applies the selected transform to the transform unit, producing a video frame portion comprising a two-dimensional array of transform coefficients 553. In addition, the transform processing unit 552 may signal the selected transform partition in the encoded video bitstream (e.g., the bitstream 103 of FIG. 1).

The transform processing unit 552 may send the resulting transform coefficients 553 to the quantization unit 554. The quantization unit 554 may then quantize the transform coefficients 553 to generate the quantized transform coefficients 433. The quantization matrix may specify values that, with a quantization parameter, may be used to determine an amount of quantization to be applied to corresponding transform coefficients. The entropy encoder 456 of FIG. 4 may perform a scan of the quantized transform coefficients 433 in the matrix according to a scanning mode. In some examples, the entropy encoder 456 performs the scan of the quantized transform coefficients 433. In other examples, other processing units, such as the quantization unit 554, could perform the scan. Once the transform coefficients 433 are scanned from the two-dimensional array into a one-dimensional array, the entropy encoder 456 provides the quantized transform coefficients 433 to a bitstream engine 130, as described with reference to FIG. 4.

The inverse quantization unit 558 and the inverse transform processing unit 560 apply inverse quantization and inverse transformation, respectively, to reconstruct the residual block as reconstructed residual data 561 in the pixel domain, e.g., for later use as a reference block. The motion compensation unit 544 may calculate a reference block by adding the residual block to a prediction block of one of the frames of the reference frame memory 564. The motion compensation unit 544 may also apply one or more interpolation filters to the reconstructed residual block (e.g., the reconstructed residual data 561) to calculate sub-integer pixel values for use in motion estimation. The summer 562 adds the reconstructed residual block (e.g., the reconstructed residual data 561) to the predicted video frame portion 571 (e.g., the predicted video frame portion 545 or the predicted video frame portion 547) to produce a reconstructed video block (e.g., a reconstructed video frame portion 563) for storage in the reference frame memory 564. The reconstructed video block (e.g., the reconstructed video frame portion 563) may be used by the inter-prediction processing unit 548 as a reference block (e.g., a reference video frame portion 565) to inter-code a block in a subsequent video frame.

Figure 6:
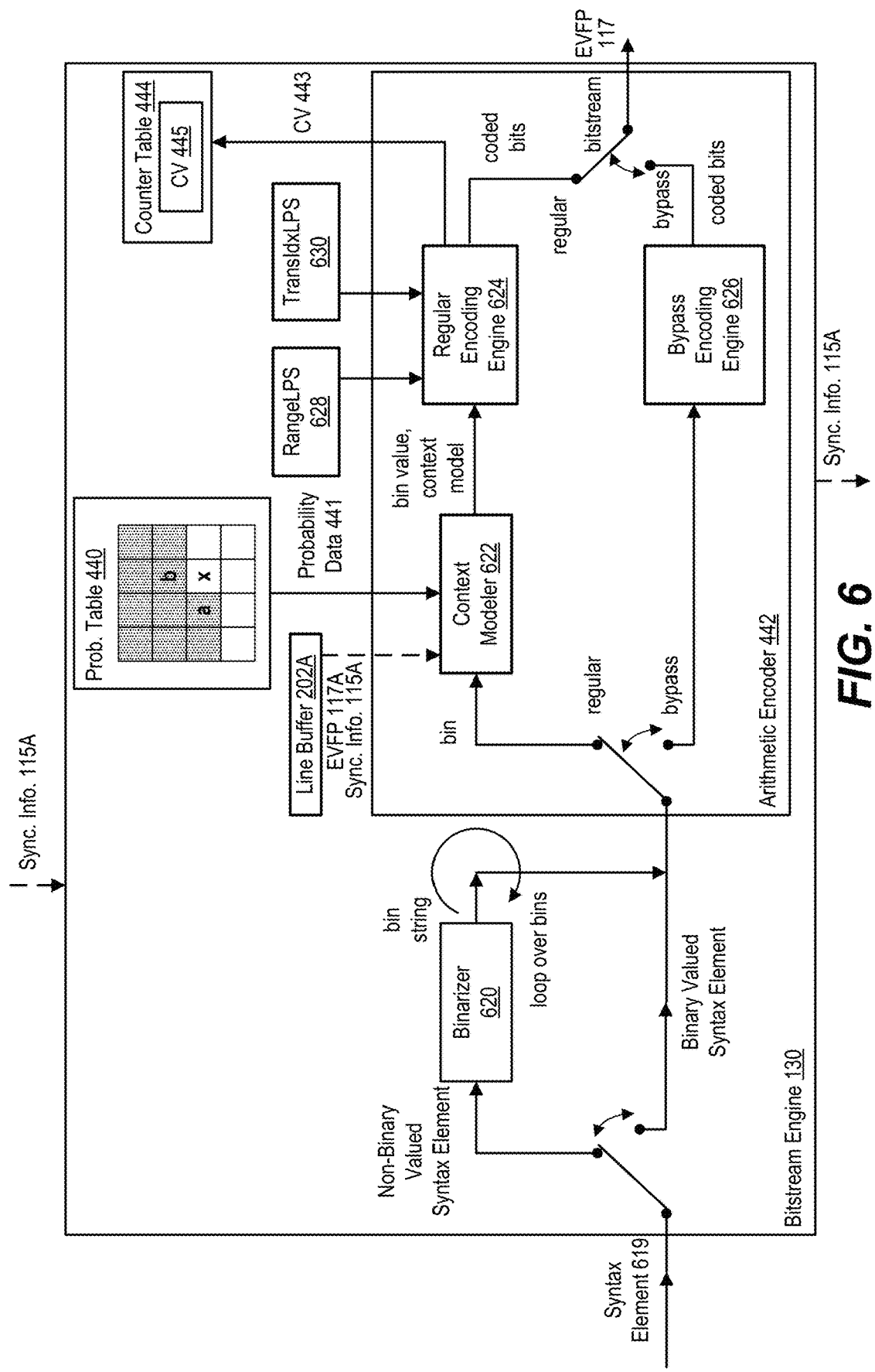
FIG. 6 is a diagram of an illustrative aspect of operation of a bitstream engine of the illustrative video encoder of FIG. 4, in accordance with some examples of the present disclosure.

FIG. 6 is a diagram of an example of a bitstream engine 130 of the video encoder 112. In a particular aspect, the bitstream engine 130 is an example of the bitstream engine 130A, the bitstream engine 130B of FIG. 1, or both. In a particular aspect, the bitstream engine 130 is configured to perform CABAC in accordance with the techniques of this disclosure.

The bitstream engine 130 includes a binarizer 620 coupled to an arithmetic encoder 442. In a particular aspect, the arithmetic encoder 442 includes a context modeler 622, a regular encoding engine 624, a bypass encoding engine 626, or a combination thereof. In a particular aspect, the arithmetic encoder 442 is coupled to a RangeLPS table 628, a TransIdxLPS table 630, a probability table 440, a counter table 444, or a combination thereof. In a particular aspect, the RangeLPS table 628 indicates a range value for a Least Probable Symbol (LPS) given a particular probability state. The TransIdxLPS table 630 indicates which probability state is used for a next bin (bin n+1) when the previous bin (bin n) is an LPS.

In a particular aspect, the bitstream engine 130 (e.g., the bitstream engine 130B of FIG. 1) is configured to perform entropy encoding based on an encoded video frame portion, synchronization information, or both. In this aspect, the bitstream engine 130 (e.g., the bitstream engine 130B) is configured to retrieve the encoded video frame portion (e.g., the encoded video frame portion 117A), the synchronization information (e.g., the synchronization information 115A), or both, from the line buffer 202A. In a particular example, the bitstream engine 130 corresponds to the bitstream engine 130A of FIG. 1 and outputs the synchronization information 115A to the line buffer 202A. In a particular example, the bitstream engine 130 corresponds to the bitstream engine 130B of FIG. 1 and retrieves the synchronization information 115A from the line buffer 202A.

Syntax elements corresponding to the quantized transform coefficients 433 and syntax elements corresponding to the prediction syntax 435 are input to the entropy encoder 456. For example, a syntax element 619 is input into the entropy encoder 456. To illustrate, the syntax element 619 corresponds to a quantized transform coefficient of the quantized transform coefficients 433 or a syntax element of the prediction syntax 435. In a particular example, the synchronization information 115A is based on (e.g., depends on or indicates) syntax elements corresponding to the quantized transform coefficients 433A and syntax elements corresponding to the prediction syntax 435A of the video frame portion 151A.

If the syntax element 619 is already a binary-value syntax element (i.e., a syntax element that only has a value of 0 and 1), the step of binarization may be skipped and the binary-value syntax element is processed by the arithmetic encoder 442. If the syntax element 619 is a non-binary valued syntax element (e.g., a syntax element represented by multiple bits, such as transform coefficient levels), the non-binary valued syntax element is binarized by the binarizer 620. The binarizer 620 performs a mapping of the syntax element 619 (e.g., the non-binary valued syntax element) into a sequence of binary decisions. These binary decisions are often called "bins." For example, for transform coefficient levels, the value of the level may be broken down into successive bins, each bin indicating whether or not the absolute value of a coefficient level is greater than some value. For example, bin 0 (sometimes called a significance flag) indicates if the absolute value of the transform coefficient level is greater than 0 or not. Bin 1 indicates if the absolute value of the transform coefficient level is greater than 1 or not, and so on. A unique mapping may be developed for each non-binary valued syntax element. In a particular example, the synchronization information 115A is based on (e.g., depends on or indicates) the bin values corresponding to the syntax elements associated with the video frame portion 151A.

Each bin produced by the binarizer 620 is fed to the arithmetic encoder 442 (e.g., the binary arithmetic coding side of entropy encoder 456). That is, for a predetermined set of non-binary valued syntax elements, each bin type (e.g., bin 0) is coded before the next bin type (e.g., bin 1). Coding may be performed in either regular mode or bypass mode. In bypass mode, the bypass encoding engine 626 performs arithmetic coding using a fixed probability model, for example, using Golomb-Rice or exponential Golomb coding. Bypass mode is generally used for more predictable syntax elements. Coding in regular mode involves performing CABAC. Regular mode CABAC is for coding bin values where the probability of a value of a bin is predictable given the values of previously coded bins. The probability of a bin being an LPS is determined by context modeler 622. The context modeler 622 outputs the bin value and the context model (e.g., the probability state σ). The context model may be an initial context model for a series of bins, or may be determined based on the coded values of previously coded bins (e.g., indicated by the probability data 441). In a particular aspect, the bitstream engine 130 corresponds to the bitstream engine 130B and the context modeler 622 determines the context model based on the coded values indicated by the encoded video frame portion 117A, the synchronization information 115A, or a combination thereof. As described above, the context modeler 622 may update the state based on whether or not the previously-coded bin was an MPS or an LPS. After the context model and probability state σ is determined by the context modeler 622, the regular encoding engine 624 performs BAC on the bin value. In a particular example, the synchronization information 115A is based on (e.g., depends on or indicates) the bin value, the context model, or both, of syntax elements associated with the video frame portion 151A.

BAC, in general, is a recursive interval-subdividing procedure. BAC is used to encode bins of syntax elements in the CABAC process in the H.264/AVC video coding standard, and in the HEVC video coding standard. Likewise, on the decoder side, CABAC may be used to decode the coded representations of the bins and retrieve the bin values. The syntax elements that may be coded using a CABAC process may be any data structures that represent video data or how the video data is coded, including syntax elements representing coding modes, motion vectors, transform coefficients representative of residual values, etc. The output of the BAC coder is a binary stream (e.g., coded representations of bins of syntax elements) that represents an interval value or pointer to a probability within a final coded probability interval. In some examples, the probability interval (also called an arithmetic coding interval or interval range) is specified by a range and a lower end value. Range is the extent of the probability interval. Low is the lower bound of the coding interval. Both the video encoder 112 and the video decoder 122 are configured to determine and update the interval range. The video decoder 122 may receive the coded representations and perform an inverse BAC process to recover the bin values of the syntax elements. The coded representations are the interval values that the video decoder 122, based on the updated interval ranges, uses to determine the bin values of a syntax element.

Application of arithmetic coding to video coding is described in D. Marpe, H. Schwarz, and T. Wiegand "Context-Based Adaptive Binary Arithmetic Coding in the H.264/AVC Video Compression Standard," IEEE Trans. Circuits and Systems for Video Technology, vol. 13, no. 7, July 2003, which is incorporated by reference herein. Each context (i.e., probability model) in CABAC is represented by a state. Each state (σ) implicitly represents a probability ($p_o$) of a particular symbol (e.g., a bin of a binarized syntax element) being the Least Probable Symbol (LPS). A symbol can be an LPS or a Most Probable Symbol (MPS). Symbols are binary, and as such, the MPS and the LPS can be 0 or 1. The probability is estimated for the corresponding context and used (implicitly) to entropy code the symbol using the arithmetic coder.

In some examples, the BAC process is performed by a state machine that changes the internal values 'range' and 'low' depending on the context to code and the value of the bin being coded. Depending on the state of a context (that is, its probability), the range is divided into rangeMPSσ (range of the most probable symbol in state σ) and rangeLPSσ (range of the least probable symbol in state σ). The rangeLPSσ value of a probability state σ can be derived by a multiplication:

rangeLPSσ=range×$p_o$, where $p_o$ is the probability to select the LPS. In some examples, the multiplication to determine rangeLPSσ may be performed directly by the video encoder 112 and the video decoder 122. In other examples, the video encoder 112 and the video decoder 122 may store a table of computed multiplications. The video encoder 112 and the video decoder 122 may use indexes to the table (the indexes based on possible values of range and $p_o$) to determine the value of rangeLPSσ. The probability of MPS is 1-pσ. Equivalently, the rangeMPSσ is equal to range minus rangeLPSσ. BAC iteratively updates the range depending on the state of the context bin to code, the current range, and the value of the bin being coded (i.e., based on whether the bin equal to the LPS or the MPS).

According to some example techniques of this disclosure, the regular encoding engine 624 performs BAC using the TransIdxLPS table 630 that includes probability states. The TransIdxLPS table 630 is used to determine which probability state is used for a next bin (bin n+1) when the previous bin (bin n) is an LPS. The regular encoding engine 624 may also use the RangeLPS table 628 to determine the range value for an LPS given a particular probability state. As described above, the regular encoding engine 624 may determine the product of the probability and range. An output (e.g., a coded representation of bins of the syntax element 619) of the regular encoding engine 624 is sent to a bitstream buffer for eventual output to the bitstream 103 as part of an encoded video frame portion 117. For example, the output of the bitstream engine 130 is collected in the bitstream buffer and output from the bitstream buffer as the encoded video frame portion 117 once all syntax elements corresponding to the quantized transform coefficients 433 and the prediction syntax 435 are processed by the bitstream engine 130. In a particular aspect, the bitstream engine 130 corresponds to the bitstream engine 130A and the encoded video frame portion 117 corresponds to the encoded video frame portion 117A. In an alternative aspect, the bitstream engine 130 corresponds to the bitstream engine 130B and the encoded video frame portion 117 corresponds to the encoded video frame portion 117B.

In a particular aspect, the bitstream engine 130 (e.g., the bitstream engine 130A) is configured to provide an encoded video frame portion, synchronization information, or both, to another bitstream engine. In this aspect, the bitstream engine 130 (e.g., the bitstream engine 130A) is configured to store the encoded video frame portion 117 (e.g., the encoded video frame portion 117B), the synchronization information (e.g., the synchronization information 115A), or both, to a line buffer (e.g., the line buffer 202A).

In some cases, the entropy encoder 456 or another unit of the video encoder 112 may be configured to perform other coding functions, in addition to entropy coding. For example, the entropy encoder 456 may be configured to determine coded block pattern (CBP) values for CU's and prediction units. Also, in some cases, the entropy encoder 456 may perform run length coding of coefficients. In addition, the entropy encoder 456, or other processing units, also may code other data, such as the values of a quantization matrix. In a particular example, the synchronization information 115A is based on (e.g., depends on or indicates) the CBP values, coefficient information, values of the quantization matrix, a prediction mode (e.g., an intra-prediction mode or an inter-prediction mode), coded block information, motion vector information, reference index, reference mode or a combination thereof, associated with the video frame portion 151A.

Figure 7:
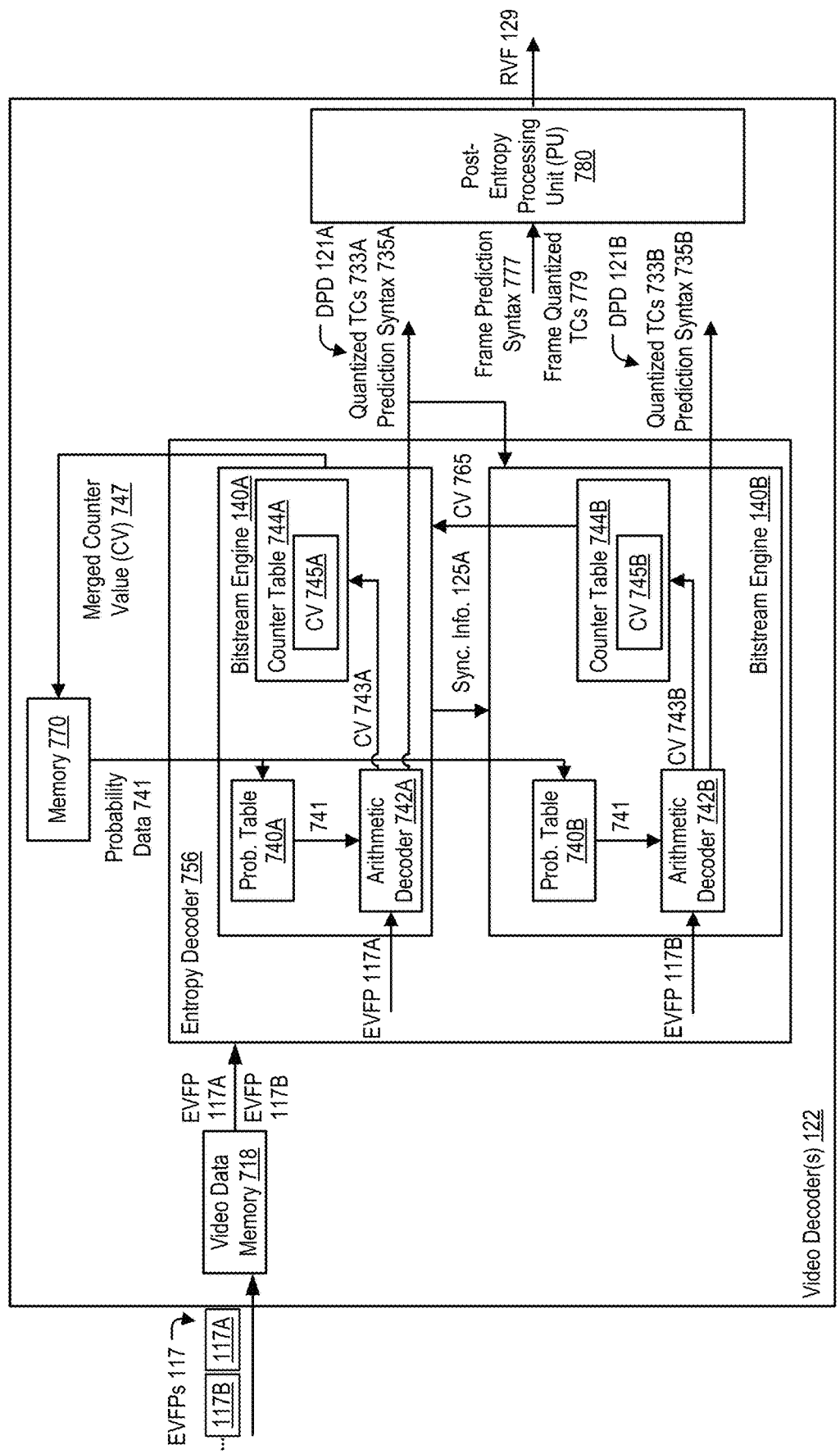
FIG. 7 is a diagram of an illustrative aspect of operation of a video decoder of the illustrative system of FIG. 1, in accordance with some examples of the present disclosure.

Referring to FIG. 7, a diagram illustrating an example of the video decoder 122 is shown. The video decoder 122 includes a video data memory 718 coupled via an entropy decoder 756 to a post-entropy processing unit (PU) 780. The entropy decoder 756 includes the plurality of bitstream engines 140, such as the bitstream engine 140A and the bitstream engine 140B. The video decoder 122 also includes a memory 770 coupled to the plurality of bitstream engines 140. In some examples, the video decoder 122 includes the video data memory 718 and the memory 770. In other examples, the video data memory 718, the memory 770, or both, are external to the video decoder 122.

The video decoder 122 may, in some examples, perform a decoding pass generally reciprocal to the encoding pass described with respect to the video encoder 112 (see FIG. 4). The video data memory 718 may be configured to store video data (e.g., the encoded video frame portions 117) to be decoded by the components of the video decoder 122. The video data stored in the video data memory 718 may be obtained, for example, from the video encoder 112.

The entropy decoder 756 or another decoding unit may be configured to use an inverse of the modified mapping described above, e.g., for quantization matrix values or other values, such as video data, using a modified mapping of source symbols. In particular, the entropy decoder 756 may apply a process that is generally inverse to the process used by the entropy encoder 456. The entropy decoder 756 performs an entropy decoding process on the bitstream 103 (e.g., the encoded bitstream) to retrieve a one-dimensional array of transform coefficients. The entropy decoding process used depends on the entropy coding used by the video encoder 112 (e.g., CABAC, PIPE, or other processes described above). In accordance with the techniques described in this disclosure, the entropy decoder 756 may apply a BAC process, e.g., within a CABAC process, as described in this disclosure. The entropy coding process used by the encoder may be signaled in the bitstream 103 or may be a predetermined process.

The entropy decoder 756 retrieves the encoded video frame portions 117 from the video data memory 718. In a particular aspect, the entropy decoder 756 retrieves encoded video frame portions corresponding to the same video frame (e.g., the video frame 109A of FIG. 1) in order before retrieving encoded video frame portions of the next video frame (e.g., the video frame 109B of FIG. 1). For example, the video decoder 122 decodes the encoded video frame portions 117 corresponding to the video frame 109A, as described with reference to FIG. 2, prior to decoding the encoded video frame portions 117 of the video frame 109B. In this example, the encoded video frame portion 117A and the encoded video frame portion 117B correspond to the same video frame (e.g., the video frame 109A).

In a particular aspect, the entropy decoder 756 retrieves encoded video frame portions corresponding to different video frames. For example, the video decoder 122 concurrently decodes the encoded video frame portions 117 corresponding to the video frame 109A with decoding the encoded video frame portions 117 corresponding to the video frame 109B, as described with reference to FIG. 3. In this example, the encoded video frame portion 117A corresponds to the video frame 109A and the encoded video frame portion 117B corresponds to the video frame 109B.

The entropy decoder 756 provides the encoded video frame portions 117 to the plurality of bitstream engines 140. For example, the entropy decoder 756, in response to determining that the encoded video frame portion 117A is assigned to the bitstream engine 140A, provides the encoded video frame portion 117A to the bitstream engine 140A. As another example, the entropy decoder 756, in response to determining that the encoded video frame portion 117B is assigned to the bitstream engine 140B, provides the encoded video frame portion 117B to the bitstream engine 140B.

Each of the plurality of bitstream engines 140 includes an arithmetic decoder 742 coupled to a probability table 740 and a counter table 744, as further described with reference to FIG. 9. For example, the bitstream engine 140A includes an arithmetic decoder 742A coupled to a probability table 740A and a counter table 744A. As another example, the bitstream engine 140B includes an arithmetic decoder 742B coupled to a probability table 740B and a counter table 744B.

The memory 770 is configured to store probability data 741 associated with one or more previously decoded video frames. Each of the plurality of bitstream engines 140 is configured to retrieve the probability data 741 from the memory 770 prior to decoding any encoded video frame portions corresponding to a subsequent video frame. Each of the plurality of bitstream engines 140 is configured to copy the probability data 741 from the memory 770 to the probability table 740. For example, the bitstream engine 140A and the bitstream engine 140B copy the probability data 741 from the memory 770 to the probability table 740A and the probability table 740B, respectively.

In a particular implementation, the bitstream engine 140A and the bitstream engine 140B decode distinct encoded video frame portions corresponding to the same video frame, as described with reference to FIG. 2. For example, prior to decoding the video frame 109B, the bitstream engine 140A and the bitstream engine 140B retrieve the probability data 741 associated with previous encoding of the video frame 109A.

In a particular implementation, the bitstream engine 140A and the bitstream engine 140B decode encoded video frame portions corresponding to different video frames, as described with reference to FIG. 3. For example, prior to decoding the video frame 109C and another video frame, the bitstream engine 140A and the bitstream engine 140B retrieve the probability data 741 associated with previous decoding of the video frame 109A and the video frame 109B.

The arithmetic decoder 742A generates the decoded portion data 121A (e.g., quantized transform coefficients 733A and prediction syntax 735A) by decoding the encoded video frame portion 117A based on the probability data 741, as further described with reference to FIG. 9. The arithmetic decoder 742A updates a counter value 745A of the counter table 744A based on the decoded portion data 121A, as further described with reference to FIG. 9.

The arithmetic decoder 742B generates the decoded portion data 121B (e.g., quantized transform coefficients 733B and prediction syntax 735B) by decoding the encoded video frame portion 117B based at least in part on the probability data 741, as further described with reference to FIG. 9. In a particular aspect, the bitstream engine 140A provides the decoded portion data 121A, the synchronization information 125A, or both, to the bitstream engine 140B. For example, the bitstream engine 140A stores the decoded portion data 121A, the synchronization information 115A, or both, in the line buffer 204A of FIG. 2, and the bitstream engine 140B retrieves the decoded portion data 121A, the synchronization information 125A, or both, from the line buffer 204A. In a particular implementation, the synchronization information 125A is based on (e.g., depends on or indicates) a prediction mode (e.g., an intra-prediction mode or an inter-prediction mode), coded block information, coefficient information, motion vector information, reference index, reference mode, or a combination thereof, associated with decoding the encoded video frame portion 117A.

The bitstream engine 140B generates the decoded portion data 121B based on the decoded portion data 121A, the synchronization information 125A, the probability data 741, or a combination thereof, as further described with reference to FIG. 9. The arithmetic decoder 742B updates a counter value 745B of the counter table 744B based on the decoded portion data 121B, as further described with reference to FIG. 9. In some examples, the bitstream engine 140A provides the synchronization information 125A, the decoded portion data 121A, or both, to the bitstream engine 140B. In other examples, the bitstream engine 140B provides synchronization information, the decoded portion data 121B, or both, to the bitstream engine 140A, as described with reference to FIG. 2.

In a particular implementation, one bitstream engine of the plurality of bitstream engines 140 retrieves the counter values from the counter tables of the other bitstream engines to generate a merged counter value 747 and updates the probability data 741 in the memory 770 based on the merged counter value 747. In a particular implementation, the bitstream engine retrieves the counter values in response to determining that a last encoded video frame portion of a video frame has been decoded.

In a particular example, the bitstream engine 140B provides the counter value 745B of the counter table 744B to the bitstream engine 140A. The bitstream engine 140A determines the merged counter value 747 based on the counter value 745A and the counter value 745B (e.g., the merged counter value 747=the counter value 745A+the counter value 745B) and stores the merged counter value 747 as the counter value 745A in the counter table 744A. The bitstream engine 140A updates the probability data 741 based on the merged counter value 747. In a particular aspect, the bitstream engine 140A generates a merged counter value 747 for each syntax element by merging the counter value 745A for the syntax element from the bitstream engine 140A with the counter value 745B for the syntax element from the bitstream engine 140B. In a particular implementation, the bitstream engine 140A performs a context adaptation process for each syntax element using the merged counter values of the syntax elements and updates the probability data 741 during performance of the context adaptation process. The bitstream engine 140A stores the updated probability data 741 in the probability table 740A, the memory 770, or both. In another example, the bitstream engine 140A provides the counter value 745A of the counter table 744A to the bitstream engine 140B. The bitstream engine 140B determines the merged counter value 747 based on the counter value 745A and the counter value 745B (e.g., the merged counter value 747=the counter value 745A+the counter value 745B) and stores the merged counter value 747 as the counter value 745B in the counter table 744B. The bitstream engine 140B determines an updated value of the probability data 741 based on the merged counter value 747 and stores the updated value of the probability data 741 in the probability table 740B, the memory 770, or both.

The video decoder 122 generates frame prediction syntax 777, frame quantized transform coefficients 779, or a combination thereof, corresponding to a video frame 109 based on decoded portion 121 corresponding to the video frame 109. In a particular aspect, the encoded video frame portion 117A and the encoded video frame portion 117B corresponding to video frame portions of the same video frame (e.g., the video frame 109A). In this aspect, the video decoder 122 generates the frame prediction syntax 777, the frame quantized transform coefficients 779, or a combination thereof, corresponding to the video frame 109A based at least in part on the decoded portion data 121A and the decoded portion data 121B. For example, the video decoder 122 determines the frame prediction syntax 777 based on the prediction syntax 735A, the prediction syntax 735B, prediction syntax corresponding to one or more additional video frame portions of the video frame 109A, or a combination thereof. The video decoder 122 determines the frame quantized transform coefficients 779 based on the quantized transform coefficients 733A, the quantized transform coefficients 733B, quantized transform coefficients corresponding to one or more additional video frame portions of the video frame 109A, or a combination thereof.

In a particular aspect, the encoded video frame portion 117A and the encoded video frame portion 117B corresponding to video frame portions of two different video frames. For example, the encoded video frame portion 117A corresponds to the video frame portion 151A of the video frame 109A and the encoded video frame portion 117B corresponds to the video frame portion 151B of the video frame 109B. In this aspect, the video decoder 122 generates the frame prediction syntax 777, the frame quantized transform coefficients 779, or a combination thereof, corresponding to the video frame 109A based at least in part on the decoded portion data 121A. For example, the video decoder 122 determines the frame prediction syntax 777 based on the prediction syntax 735A, prediction syntax corresponding to one or more additional video frame portions of the video frame 109A, or a combination thereof. The video decoder 122 determines the frame quantized transform coefficients 779 based on the quantized transform coefficients 733A, quantized transform coefficients corresponding to one or more additional video frame portions of the video frame 109A, or a combination thereof.

Similarly, the video decoder 122 generates the frame prediction syntax 777, the frame quantized transform coefficients 779, or a combination thereof, corresponding to the video frame 109B based at least in part on the decoded portion data 121B. For example, the video decoder 122 determines the frame prediction syntax 777 based on the prediction syntax 735B, prediction syntax corresponding to one or more additional video frame portions of the video frame 109B, or a combination thereof. The video decoder 122 determines the frame quantized transform coefficients 779 based on the quantized transform coefficients 733B, quantized transform coefficients corresponding to one or more additional video frame portions of the video frame 109B, or a combination thereof.

The video decoder 122 provides the frame prediction syntax 777, the frame quantized transform coefficients 779, or a combination thereof, corresponding to a video frame 109 (e.g., the video frame 109A or the video frame 109B) to the post-entropy processing unit 780 to generate a reconstructed video frame 129, as further described with reference to FIG. 8. For example, when the video decoder 122 provides the frame prediction syntax 777, the frame quantized transform coefficients 779, or a combination thereof, corresponding to the video frame 109A to the post-entropy processing unit 780, the reconstructed video frame 129 corresponds to the reconstructed video frame 129A. As another example, when the video decoder 122 provides the frame prediction syntax 777, the frame quantized transform coefficients 779, or a combination thereof, corresponding to the video frame 109B to the post-entropy processing unit 780, the reconstructed video frame 129 corresponds to the reconstructed video frame 129B.

Figure 8:
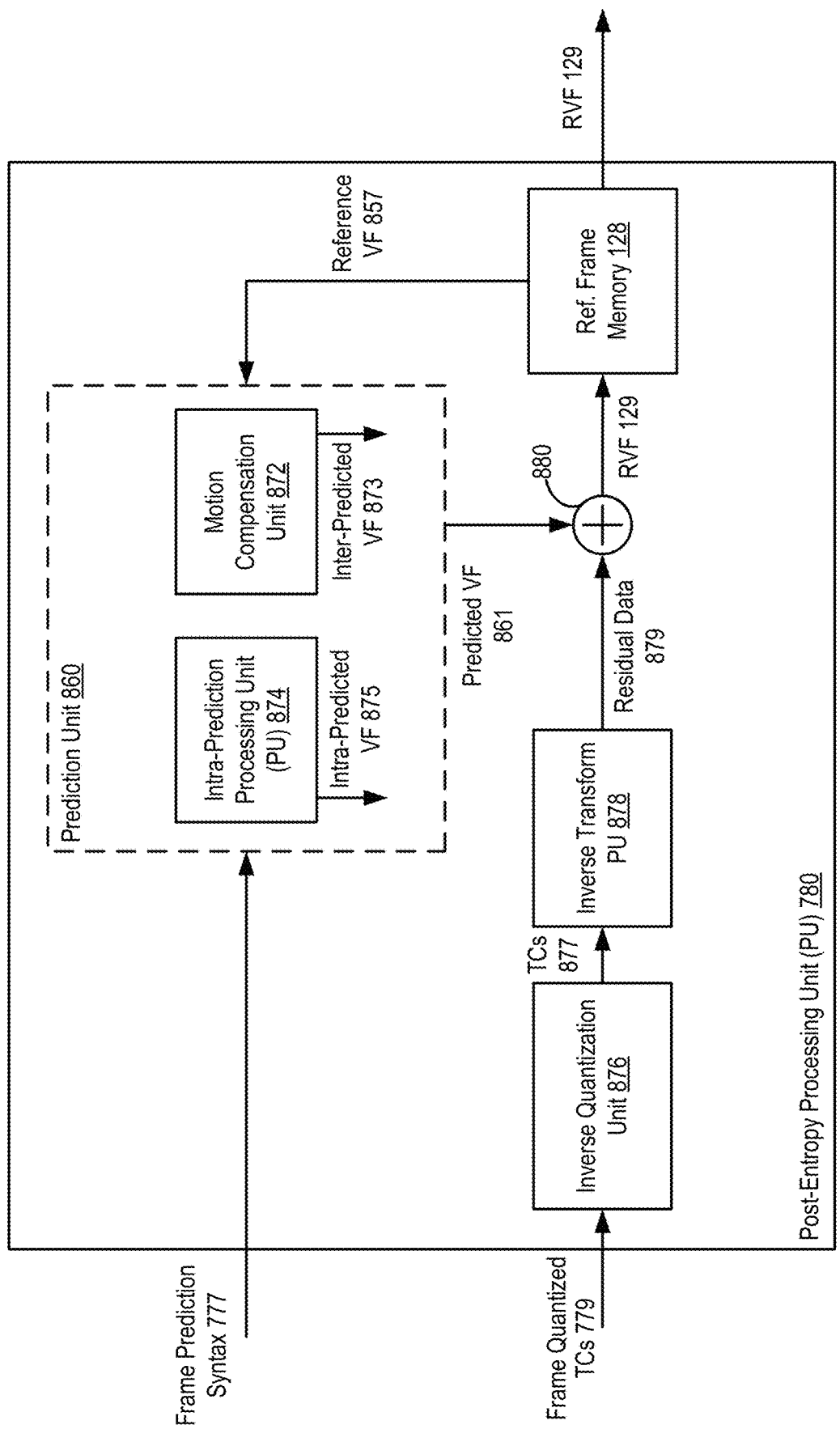
FIG. 8 is a diagram of an illustrative aspect of operation of a post-entropy processing unit of the illustrative video decoder of FIG. 7, in accordance with some examples of the present disclosure.

Referring to FIG. 8, a diagram of an example of the post-entropy processing unit 780 is shown. The post-entropy processing unit 780 includes an inverse quantization unit 876 coupled via an inverse transform processing unit 878 to a reconstruction unit 880. The post-entropy processing unit 780 also includes a prediction unit 860 coupled to the reconstruction unit 880. The reconstruction unit 880 is coupled to the reference frame memory 128. The prediction unit 860 includes a motion compensation unit 872, an intra-prediction processing unit 874, or both.

The reference frame memory 128 may be a reference picture memory (decoded picture buffer) that stores reference video data for use in decoding video data by the post-entropy processing unit 780, e.g., in intra- or inter-coding modes. The video data memory 718, the memory 770 of FIG. 7, the reference frame memory 128, or a combination thereof, may be formed by any of a variety of memory devices, such as DRAM, including SDRAM, MRAM, RRAM, or other types of memory devices. The video data memory 718, the memory 770, the reference frame memory 128, or a combination thereof, may be provided by the same memory device or separate memory devices. In various examples, the video data memory 718, the memory 770, the reference frame memory 128, or a combination thereof, may be on-chip with other components of the video decoder 122, or off-chip relative to those components.

The entropy decoder 756 (or the inverse quantization unit 876) may scan the frame quantized transform coefficients 779 using a scan mirroring the scanning mode used by entropy encoder 456 of FIG. 4 (or the quantization unit 554 of FIG. 5) of the video encoder 112. In addition, although shown as separate functional units for ease of illustration, the structure and functionality of the entropy decoder 756, the inverse quantization unit 876, and other units of the video decoder 122 may be highly integrated with one another.

The inverse quantization unit 876 inverse quantizes, i.e., dequantizes, the frame quantized transform coefficients 779 to generate transform coefficients 877. The inverse quantization process may include a conventional process, e.g., similar to the processes proposed for HEVC or defined by the H.264 decoding standard. The inverse quantization process may include use of a quantization parameter QP calculated by the video encoder 112 for the CU to determine a degree of quantization and, likewise, a degree of inverse quantization that should be applied. The inverse quantization unit 876 may inverse quantize the frame quantized transform coefficients 779 either before or after the coefficients are converted from a one-dimensional array to a two-dimensional array.

The inverse transform processing unit 878 applies an inverse transform to the transform coefficients 877. In some examples, the inverse transform processing unit 878 may determine an inverse transform based on signaling from the video encoder 112, or by inferring the transform from one or more coding characteristics such as block size, coding mode, or the like. In some examples, the inverse transform processing unit 878 may apply a cascaded inverse transform, in which the inverse transform processing unit 878 applies two or more inverse transforms to the transform coefficients 877 of the current block being decoded. In addition, the inverse transform processing unit 878 may apply the inverse transform to produce a transform unit partition.

The intra-prediction processing unit 874 may generate prediction data (e.g., an intra-predicted video frame 875) of a current frame based on a signaled intra-prediction mode.

Based on the retrieved motion prediction direction, reference frame index, and calculated current motion vectors (e.g., motion vectors copied from neighboring blocks according to a merge mode), the motion compensation unit 872 produces a motion compensated frame (e.g., an inter-predicted video frame 873) for the current frame.

The motion compensation unit 872 may produce the motion compensated video frame (e.g., the inter-predicted video frame 873), possibly performing interpolation based on interpolation filters. Identifiers for interpolation filters to be used for motion estimation with sub-pixel precision may be included in the frame prediction syntax 777. The motion compensation unit 872 may use interpolation filters as used by the video encoder 112 during encoding of the video frame to calculate interpolated values for sub-integer pixels of a reference video frame 857. The motion compensation unit 872 may determine the interpolation filters used by the video encoder 112 according to received syntax information (e.g., the frame prediction syntax 777) and use the interpolation filters to produce the inter-predicted video frame 873.

Additionally, the motion compensation unit 872 and the intra-prediction processing unit 874, in an HEVC example, may use some of the syntax information (e.g., provided by a quadtree) to determine sizes of LCUs used to encode frame(s) of the encoded video sequence. The motion compensation unit 872 and the intra-prediction processing unit 874 may also use syntax information (e.g., the frame prediction syntax 777) to determine split information that describes how each CU of a frame of the encoded video sequence is split (and likewise, how sub-CUs are split). The syntax information (e.g., the frame prediction syntax 777) may also include modes indicating how each split is encoded (e.g., intra- or inter-prediction, and for intra-prediction an intra-prediction encoding mode), one or more reference frames (and/or reference lists containing identifiers for the reference frames) for each inter-encoded PU, and other information to decode the encoded video sequence. The prediction unit 860 provides the intra-predicted video frame 875 or the inter-predicted video frame 873 as a predicted video frame 861 to the reconstruction unit 880.

The reconstruction unit 880 (e.g., a summer) combines the residual data 879 with the corresponding predicted video frame 861 to form a decoded video frame (e.g., the reconstructed video frame 129). For example, the reconstructed video frame 129 corresponds to the reconstructed video frame 129A or the reconstructed video frame 129B. If desired, a deblocking filter may also be applied to filter the reconstructed video frame 129 in order to remove blockiness artifacts. The reconstructed video frame 129 is then stored in the reference frame memory 128, which provides reference video frames (e.g., the reference video frame 857) for subsequent motion compensation and also produces decoded video for presentation on a display device (such as the display device 108 of FIG. 1).

Figure 9:
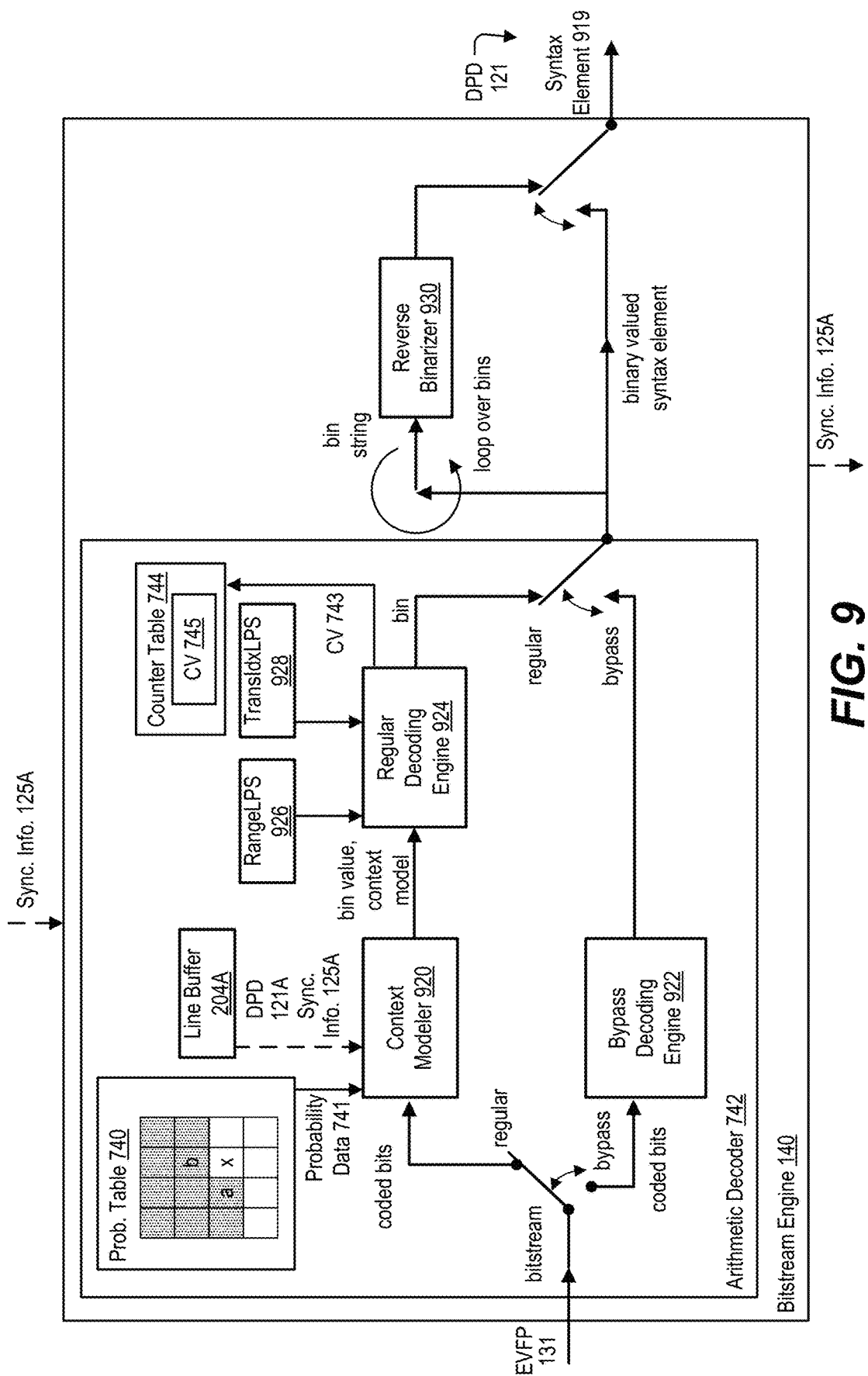
FIG. 9 is a diagram of an illustrative aspect of operation of a bitstream engine of the illustrative video decoder of FIG. 7, in accordance with some examples of the present disclosure.

FIG. 9 is a diagram of an example of a bitstream engine 140 of the video decoder 122. In a particular example, the bitstream engine 140 is an example of the bitstream engine 140A, the bitstream engine 140B, or both. In a particular aspect, the bitstream engine 140 is configured to perform CABAC in accordance with the techniques of this disclosure.

The bitstream engine 140 includes an arithmetic decoder 742 coupled to a reverse binarizer 930. In a particular aspect, the arithmetic decoder 742 includes a context modeler 920 coupled via a regular decoding engine 924 to the reverse binarizer 930. The arithmetic decoder 742 also includes a bypass decoding engine 922 coupled to the reverse binarizer 930. In a particular aspect, the arithmetic decoder 742 is coupled to a probability table 740, a RangeLPS table 926, a TransIdxLPS table 928, a counter table 744, or a combination of one or more thereof.

In a particular aspect, the bitstream engine 140 (e.g., the bitstream engine 140B of FIG. 1) is configured to perform entropy decoding based on decoded portion data, synchronization information, or both. In this aspect, the bitstream engine 140 (e.g., the bitstream engine 140B) is configured to retrieve the decoded portion data (e.g., the decoded portion data 121A), the synchronization information (e.g., the synchronization information 125A), or both, from the line buffer 204A. In a particular example, the bitstream engine 140 corresponds to the bitstream engine 140A of FIG. 1 and outputs the synchronization information 125A to the line buffer 204A. In a particular example, the bitstream engine 140 corresponds to the bitstream engine 140B of FIG. 1 and retrieves the synchronization information 125A from the line buffer 204A.

In a particular implementation, the bitstream engine 140 performs CABAC in a manner inverse to that of the bitstream engine 130 described in FIG. 6. Coded bits of the encoded video frame portion 131 from the bitstream 103 are input into the bitstream engine 140. The coded bits are fed to either the context modeler 920 or the bypass decoding engine 922 based on whether or not they were entropy coded using bypass mode or regular mode. If the coded bits were coded in bypass mode, the bypass decoding engine 922 uses Golomb-Rice or exponential Golomb decoding, for example, to retrieve the binary-valued syntax elements or bins of non-binary syntax elements.

If the coded bits were coded in regular mode, the context modeler 920 may determine a probability model for the coded bits based at least in part on the probability data 741. For example, if the bitstream engine 140 corresponds to the bitstream engine 140B of FIG. 1, the context modeler 920 determines a bin value and a context model based on the probability data 741, the decoded portion data 121A, the synchronization information 125A, or a combination thereof. In a particular example, the synchronization information 125A is based on (e.g., depends on or indicates) the bin value, the probability model, or both, associated with decoding the encoded video frame portion 117A. The regular decoding engine 924 may decode the coded bits to produce bins of non-binary valued syntax elements (or the syntax elements themselves if binary-valued). After the context model and probability state σ is determined by the context modeler 920, the regular decoding engine 924 performs BAC on the bin value.

According to some example techniques, the regular decoding engine 924 performs BAC using the TransIdxLPS table 928 that includes probability states. The TransIdxLPS 928 is used to determine which probability state is used for a next bin (bin n+1) when the previous bin (bin n) is an LPS. The regular decoding engine 924 may also use a RangeLPS table 926 to determine the range value for an LPS given a particular probability state. The regular decoding engine 924 may determine the product of the probability and range.

After the bins are decoded by the regular decoding engine 924, the reverse binarizer 930 may perform a reverse mapping to convert the bins back into the values of the non-binary valued syntax elements. As shown in FIG. 9, the BAC process may be performed for all bins of a syntax element 919 (e.g., as indicated by the loop over bins, to produce a bin string prior to reverse binarization by the reverse binarizer 930. In a particular aspect, the bitstream engine 140 outputs the syntax element 919 as part of the decoded portion data 121. In a particular implementation, the bitstream engine 140 stores the decoded syntax elements of the encoded video frame portion 131 in a decoder buffer and outputs the decoded syntax elements (e.g., including the syntax element 919) as the decoded portion data 121 upon generating all the decoded syntax elements of the encoded video frame portion 131. In a particular aspect, the syntax element 919 corresponds to a quantized transform coefficient of quantized transform coefficients 733 or a syntax element of a prediction syntax 735. In a particular aspect, the bitstream engine 140 (e.g., the bitstream engine 140A) is configured to store the decoded portion data 121 (e.g., the decoded portion data 121A), synchronization information (e.g., the synchronization information 125A), or both, in a line buffer 204 (e.g., the line buffer 204A). In a particular example, the synchronization information 125A is based on (e.g., depends on or indicates) CBP values, coefficient information, values of a quantization matrix, a prediction mode (e.g., an intra-prediction mode or an inter-prediction mode), coded block information, motion vector information, reference index, reference mode or a combination thereof, associated with the encoded video frame portion 117A.

Figure 10:
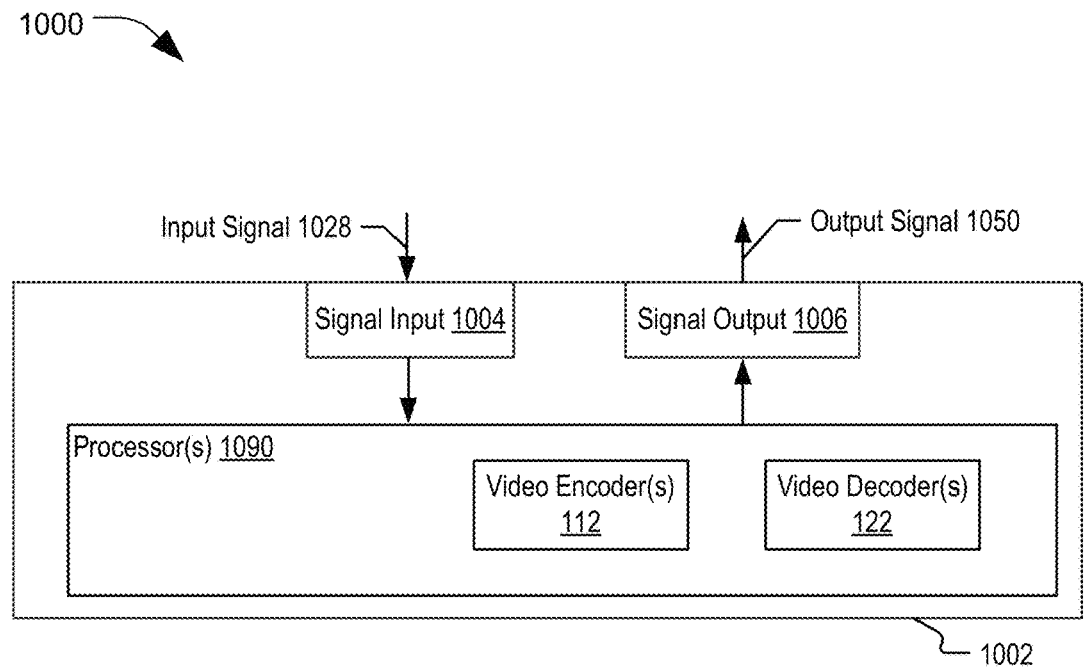
FIG. 10 illustrates an example of an integrated circuit operable to use multiple bitstream engines to process video, in accordance with some examples of the present disclosure.
Figure 13:
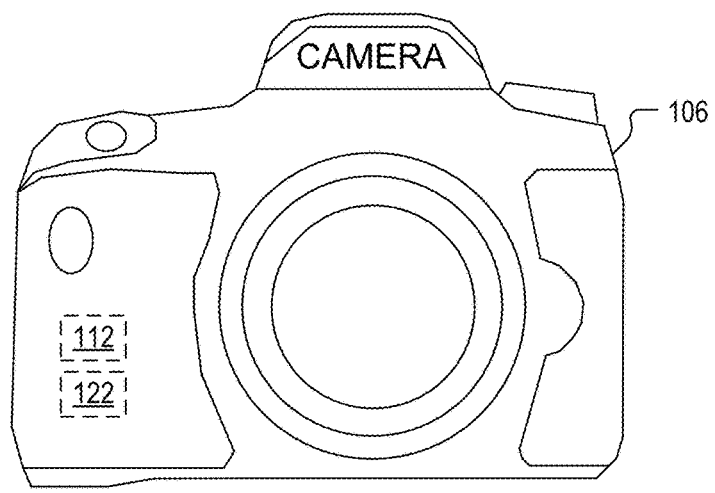
FIG. 13 is a diagram of an example of a camera operable to use multiple bitstream engines to process video, in accordance with some examples of the present disclosure.
Figure 14:
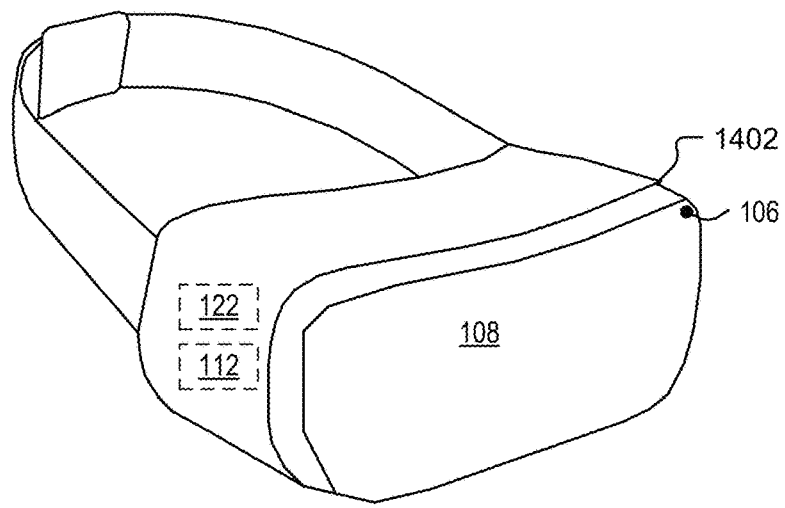
FIG. 14 is a diagram of an example of a headset, such as a virtual reality or augmented reality headset, operable to use multiple bitstream engines to process video, in accordance with some examples of the present disclosure.
Figure 15:
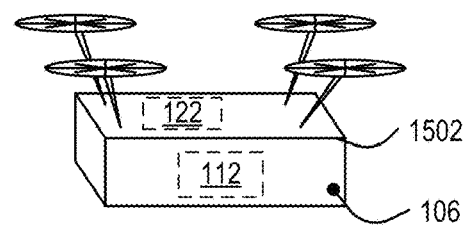
FIG. 15 is a diagram of a first example of a vehicle operable to use multiple bitstream engines to process video, in accordance with some examples of the present disclosure.
Figure 16:
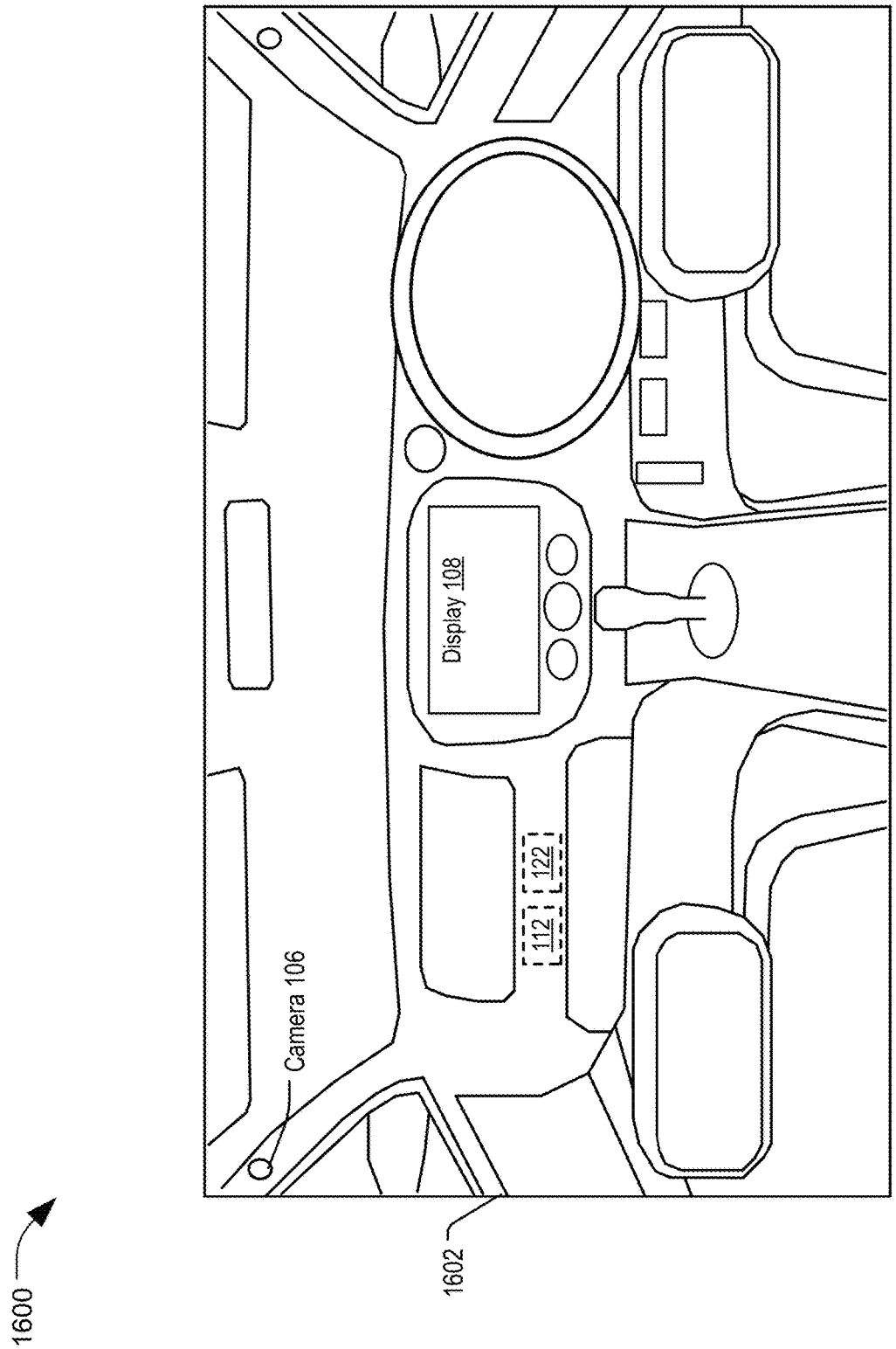
FIG. 16 is a diagram of a second example of a vehicle operable to use multiple bitstream engines to process video, in accordance with some examples of the present disclosure.

FIG. 10 depicts an implementation 1000 of the device 102, the device 104, or both, as an integrated circuit 1002 that includes one or more processors 1090. The integrated circuit 1002 also includes a signal input 1004, such as one or more bus interfaces, to enable an input signal 1028 to be received for processing. The integrated circuit 1002 also includes a signal output 1006, such as a bus interface, to enable sending of an output signal 1050. The one or more processors 1090 include the video encoder 112, the video decoder 122, or both. In a particular aspect, the input signal 1028 represents the video frames 109 and the output signal 1050 includes the bitstream 103. In a particular aspect, the input signal 1028 includes the bitstream 103 and the output signal 1050 represents the reconstructed video frames 129. The integrated circuit 1002 enables implementation of using multiple bitstream engines to process video as a component in a system, such as a mobile phone or tablet as depicted in FIG. 11, a wearable electronic device as depicted in FIG. 12, a camera as depicted in FIG. 13, a virtual reality headset or an augmented reality headset as depicted in FIG. 14, or a vehicle as depicted in FIG. 15 or FIG. 16.

Figure 11:
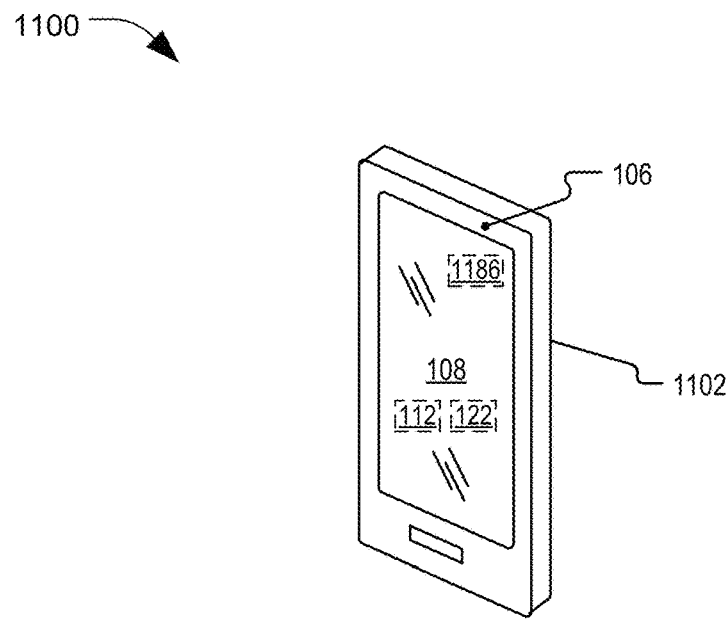
FIG. 11 is a diagram of an example of a mobile device operable to use multiple bitstream engines to process video, in accordance with some examples of the present disclosure.

FIG. 11 depicts an implementation 1100 in which the device 102, the device 104, or both, include a mobile device 1102, such as a phone or tablet, as illustrative, non-limiting examples. The mobile device 1102 includes the camera 106, the display device 108 (e.g., a display screen), a memory 1186, or a combination thereof. Components of the processor 1090, including the video encoder 112, the video decoder 122, or both, are integrated in the mobile device 1102 and are illustrated using dashed lines to indicate internal components that are not generally visible to a user of the mobile device 1102. In a particular example, the video encoder 112 operates to use multiple bitstream engines 130 to encode the camera output 107 of the camera 106 to generate the bitstream 103 for transmission to another device. In another example, the video decoder 122 operates to use multiple bitstream engines 140 to decode the bitstream 103 received from another device to generate the reconstructed video frames 129 for display at the display device 108. In a particular example, the video encoder 112 operates to use multiple bitstream engines 130 to encode the camera output 107 of the camera 106 to generate the bitstream 103 and the video decoder 122 operates to use multiple bitstream engines 140 to decode the bitstream 103 to generate the reconstructed video frames 129 for display at the display device 108. In a particular aspect, a comparison of the reconstructed video frames 129 and the camera output 107 can be used to determine a loss in image quality (if any) associated with encoding the camera output 107 and decoding the bitstream 103. In a particular aspect, storing the bitstream 103 in the memory 1186 uses less storage space as compared to storing the camera output 107 to the memory 1186. In this aspect, the video encoder 112 stores the bitstream 103 in the memory 1186 and discards (e.g., marks for deletion) the camera output 107 and the video decoder 122 retrieves the bitstream 103 from the memory 1186 to generate the reconstructed video frames 129 for display.

Figure 12:
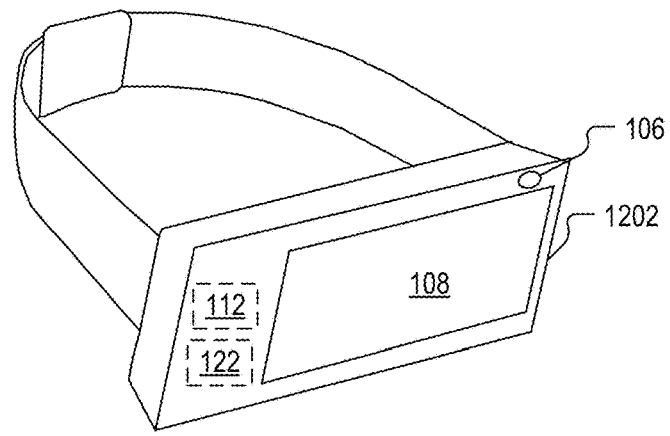
FIG. 12 is a diagram of an example of a wearable electronic device operable to use multiple bitstream engines to process video, in accordance with some examples of the present disclosure.

FIG. 12 depicts an implementation 1200 in which the device 102, the device 104, or both, include a wearable electronic device 1202, illustrated as a "smart watch." The camera 106, the display device 108 (e.g., a display screen), the video encoder 112, the video decoder 122, or a combination thereof, are integrated into the wearable electronic device 1202. In a particular example, the video encoder 112 operates to use multiple bitstream engines 130 to encode the camera output 107 of the camera 106 to generate the bitstream 103 for transmission to another device. In another example, the video decoder 122 operates to use multiple bitstream engines 140 to decode the bitstream 103 received from another device to generate the reconstructed video frames 129 for display at the display device 108.

In a particular example, the wearable electronic device 1202 includes a haptic device that provides a haptic notification (e.g., vibrates) in response to encoding or decoding of video. For example, the haptic notification can cause a user to look at the wearable electronic device 1202 to see a displayed notification indicating that the bitstream 103 is ready for transmission or indicating that the reconstructed video frames 129 are ready for display. The wearable electronic device 1202 can thus alert a user with a hearing impairment or a user wearing a headset that video content is available for sending or display.

FIG. 13 depicts an implementation 1300 in which the device 102, the device 104, or both, include a portable electronic device that corresponds to the camera 106. The display device 108 (e.g., a display screen), the video encoder 112, the video decoder 122, or a combination thereof, are integrated into the camera 106.

In a particular example, the video encoder 112 operates to use multiple bitstream engines 130 to encode the camera output 107 to generate the bitstream 103 for transmission to another device. In another example, the video decoder 122 operates to use multiple bitstream engines 140 to decode the bitstream 103 received from another device to generate the reconstructed video frames 129 for display at the display device 108.

FIG. 14 depicts an implementation 1400 in which the device 102, the device 104, or both, include a portable electronic device that corresponds to a virtual reality, augmented reality, or mixed reality headset 1402. The camera 106, the display device 108 (e.g., a display screen), the video encoder 112, the video decoder 122, or a combination thereof, are integrated into the headset 1402. A visual interface device (e.g., including the display device 108) is positioned in front of the user's eyes to enable display of augmented reality images, virtual reality images, or both, to the user while the headset 1402 is worn. In a particular aspect, the augmented reality images, the virtual reality images, or both, include the reconstructed video frames 129.

FIG. 15 depicts an implementation 1500 in which the device 102, the device 104, or both, correspond to, or are integrated within, a vehicle 1502, illustrated as a manned or unmanned aerial device (e.g., a birthday package delivery drone). The camera 106, the video encoder 112, the video decoder 122, or a combination thereof, are integrated into the vehicle 1502.

In a particular example, the display device 108 is coupled to the vehicle 1502 and the video decoder 122 operates to use multiple bitstream engines 130 to decode the bitstream 103 received from another device to generate the reconstructed video frames 129 (e.g., a video birthday greeting) for display at the display device 108. In a particular example, the video encoder 112 operates to use multiple bitstream engines 130 to encode the camera output 107 (e.g., capturing a reaction of a recipient) to generate the bitstream 103 for transmission to another device (e.g., of a user that ordered delivery of the birthday package).

FIG. 16 depicts another implementation 1600 in which the device 102, the device 104, or both, correspond to, or are integrated within, a vehicle 1602, illustrated as a car. The vehicle 1602 includes the video encoder 112, the video decoder 122, or both. The vehicle 1602 also includes the camera 106, the display device 108, or both. In some examples, the video encoder 112 operates to use multiple bitstream engines 130 to encode the camera output 107 from an interior camera (e.g., the camera 106), e.g., capturing video of a passenger of the vehicle 1602, to generate the bitstream 103 for transmission to another device. In some examples, the video encoder 112 operates to use multiple bitstream engines 130 to encode the camera output 107 from an exterior camera (e.g., the camera 106), e.g., capturing video of another vehicle or pedestrian, to generate the bitstream 103. In a particular example, the video decoder 122 operates to use multiple bitstream engines 140 to decode the bitstream 103 received from another device to generate the reconstructed video frames 129 (e.g., a movie) for display at the display device 108.

Figure 17:
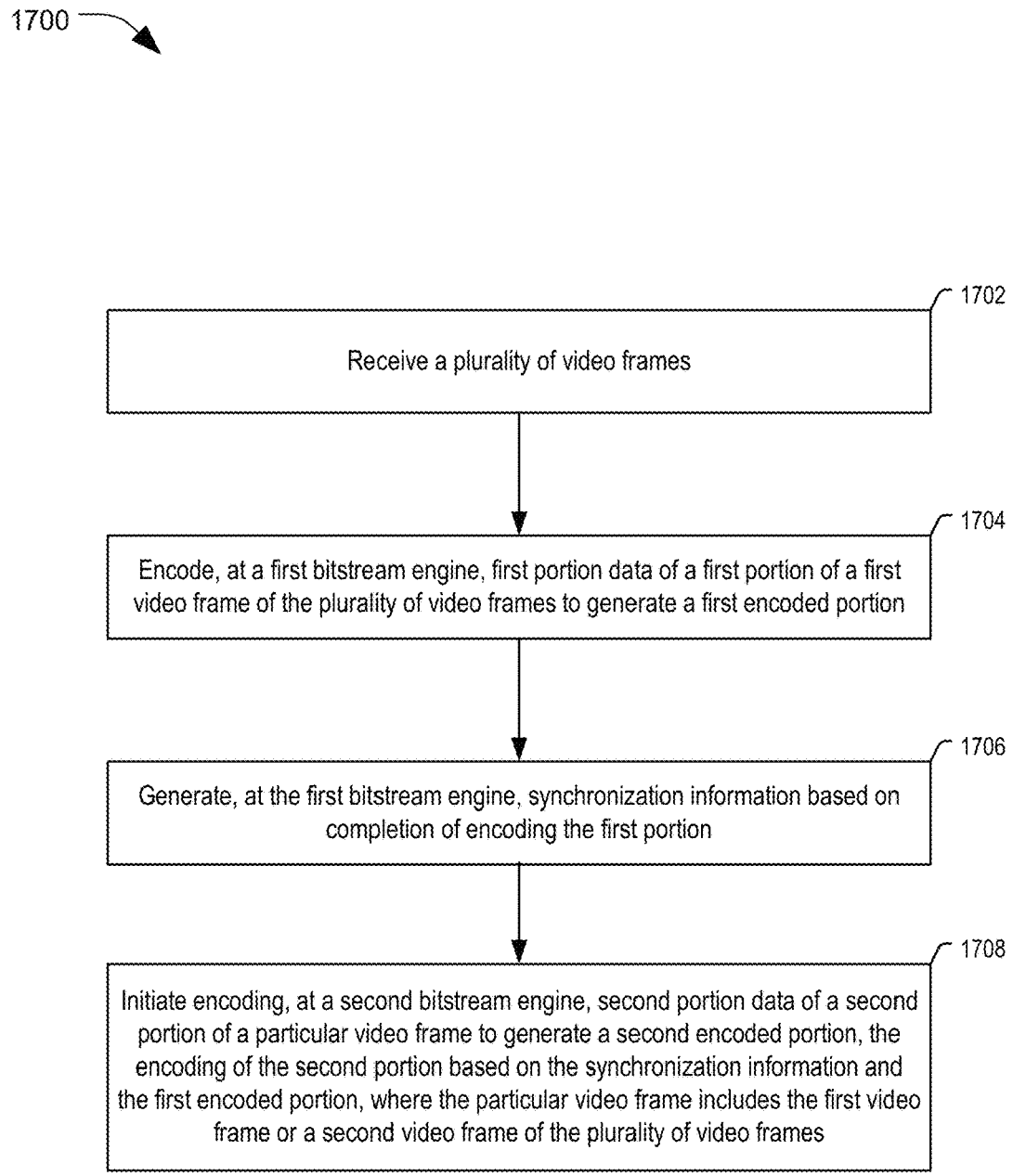
FIG. 17 is diagram of a particular implementation of a method of using multiple bitstream engines to process video that may be performed by the system of FIG. 1, in accordance with some examples of the present disclosure.

Referring to FIG. 17, a particular implementation of a method 1700 of using multiple bitstream engines to process video is shown. In a particular aspect, one or more operations of the method 1700 are performed by at least one of the input interface 110, the video encoder 112, the plurality of bitstream engines 130, the device 102, the system 100 of FIG. 1, or a combination thereof.

The method 1700 includes receiving a plurality of video frames, at 1702. For example, the video encoder 112 of FIG. 1 receives the video frames 109 via the input interface 110, as described with reference to FIG. 1.

The method 1700 also includes encoding, at a first bitstream engine, first portion data of a first portion of a first video frame of the plurality of video frames to generate a first encoded portion, at 1704. For example, the bitstream engine 130A of FIG. 1 encodes the portion data 111A of the video frame portion 151A of the video frame 109A to generate the encoded video frame portion 117A, as described with reference to FIG. 1.

The method 1700 also includes generating, at the first bitstream engine, synchronization information based on completion of encoding the first portion, at 1706. For example, the bitstream engine 130A of FIG. 1 generates the synchronization information 115A based on completion of encoding the video frame portion 151A, as described with reference to FIG. 1.

The method 1700 further includes initiating encoding, at a second bitstream engine, second portion data of a second portion of a particular video frame to generate a second encoded portion, at 1708. For example, the bitstream engine 130B of FIG. 1 initiates encoding of the portion data 111B of the video frame portion 151B to generate the encoded video frame portion 117B, as described with reference to FIG. 1. The video frame portion 151B is included in the video frame 109A or the video frame 109B, as described with reference to FIG. 1. The encoding of the video frame portion 151B is based on the synchronization information 115A and the encoded video frame portion 117A.

The method 1700 enables encoding of video frame portions using multiple bitstream engines that takes dependency between the video frame portions into account. The multiple bitstream engines can be used for concurrent encoding to increase bitrate. For example, the bitstream engine 130A can be used to encode the video frame portion 151C of FIG. 1 concurrently with the bitstream engine 130B encoding the video frame portion 151B.

The method 1700 of FIG. 17 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 1700 of FIG. 17 may be performed by a processor that executes instructions, such as described with reference to FIG. 19.

Figure 18:
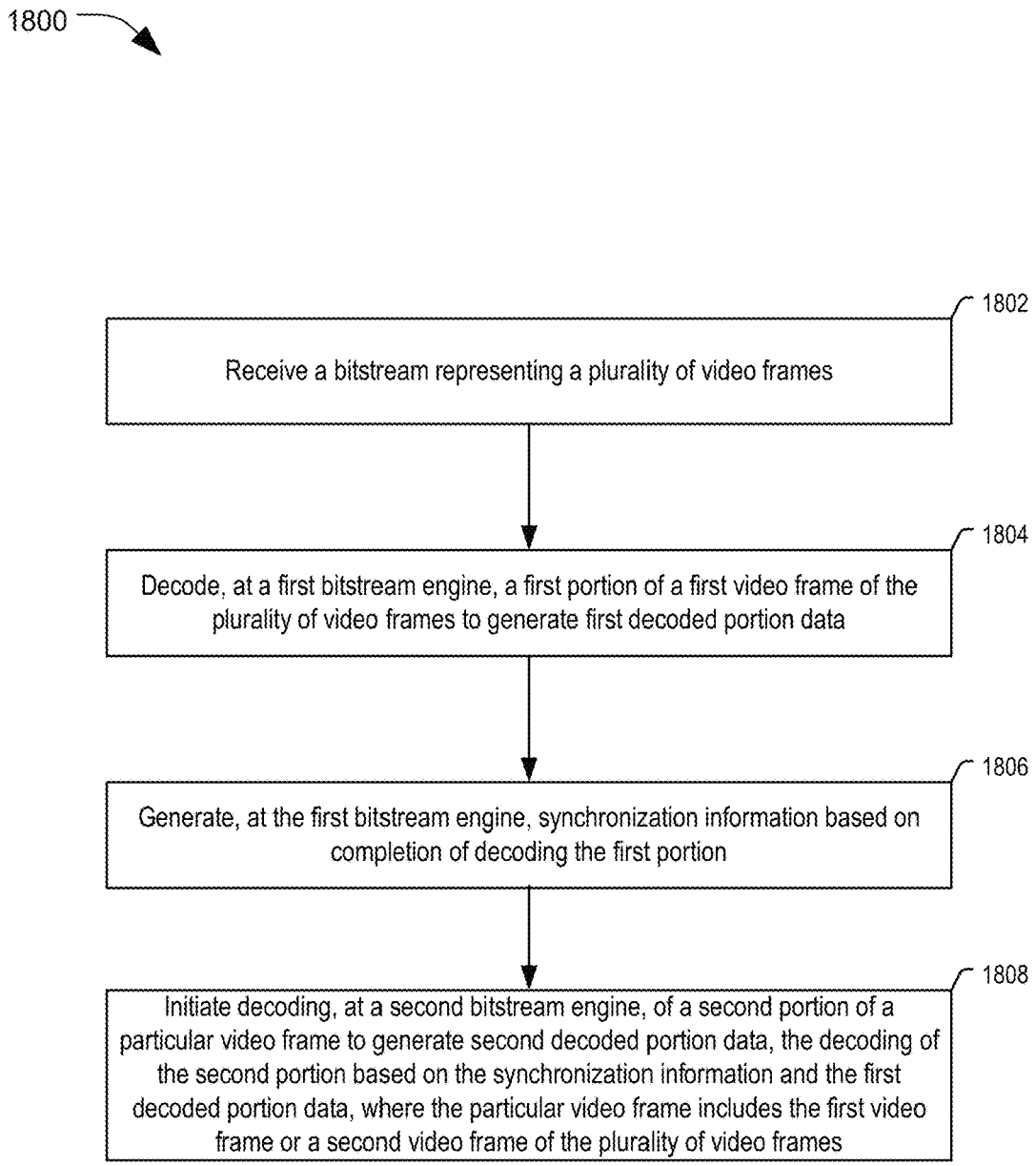
FIG. 18 is diagram of a particular implementation of another method of using multiple bitstream engines to process video that may be performed by the system of FIG. 1, in accordance with some examples of the present disclosure.

Referring to FIG. 18, a particular implementation of a method 1800 of using multiple bitstream engines to process video is shown. In a particular aspect, one or more operations of the method 1800 are performed by at least one of the receiver 126, the modem 124, the video decoder 122, the plurality of bitstream engines 140, the device 104, the system 100 of FIG. 1, or a combination thereof.

The method 1800 includes receiving a bitstream representing a plurality of video frames, at 1802. For example, the video decoder 122 of FIG. 1 receives the bitstream 103 representing the video frames 109 via the receiver 126, as described with reference to FIG. 1.

The method 1800 also includes decoding, at a first bitstream engine, a first portion of a first video frame of the plurality of video frames to generate first decoded portion data, at 1804. For example, the bitstream engine 140A of FIG. 1 decodes the encoded video frame portion 117A of the video frame 109A to generate the decoded portion data 121A, as described with reference to FIG. 1.

The method 1800 also includes generating, at the first bitstream engine, synchronization information based on completion of decoding the first portion, at 1806. For example, the bitstream engine 140A of FIG. 1 generates the synchronization information 125A based on completion of decoding the encoded video frame portion 117A, as described with reference to FIG. 1.

The method 1800 further includes initiating decoding, at a second bitstream engine, of a second portion of a particular video frame to generate a second decoded portion data, at 1808. For example, the bitstream engine 140B of FIG. 1 initiates decoding of the encoded video frame portion 117B to generate the decoded portion data 121B, as described with reference to FIG. 1. The encoded video frame portion 117B corresponds to the video frame portion 151B included in the video frame 109A or the video frame 109B, as described with reference to FIG. 1. The decoding of the encoded video frame portion 117B is based on the synchronization information 125A and the decoded portion data 121A.

The method 1800 enables decoding of encoded video frame portions using multiple bitstream engines that takes dependency between the encoded video frame portions into account. The multiple bitstream engines can be used for concurrent decoding to increase bitrate. For example, the bitstream engine 140A can be used to decode the encoded video frame portion 117C of FIG. 1 concurrently with the bitstream engine 140B decoding the encoded video frame portion 117B.

The method 1800 of FIG. 18 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 1800 of FIG. 18 may be performed by a processor that executes instructions, such as described with reference to FIG. 19.

Figure 19:
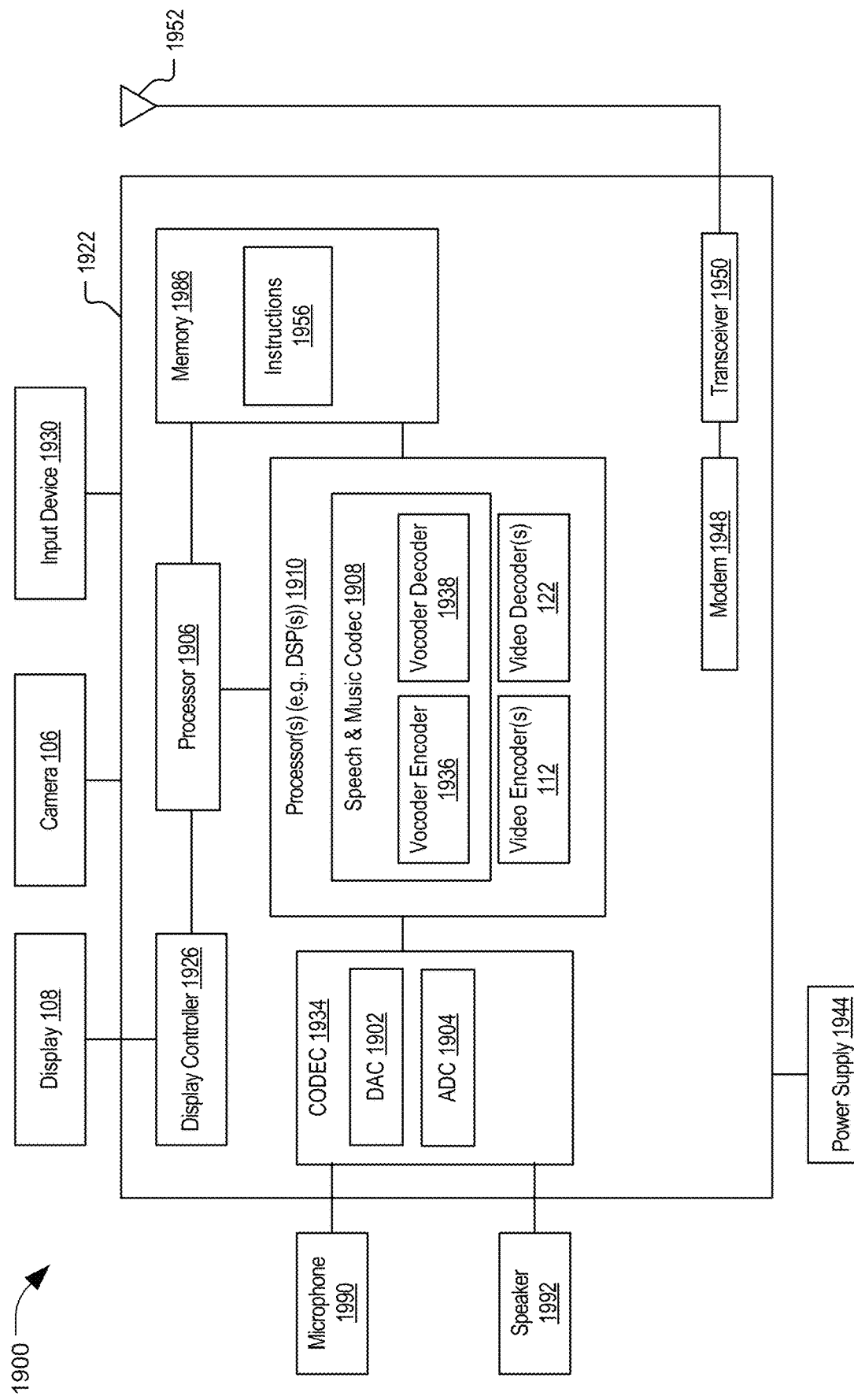
FIG. 19 is a block diagram of a particular illustrative example of a device that is operable to use multiple bitstream engines to process video, in accordance with some examples of the present disclosure.

Referring to FIG. 19, a block diagram of a particular illustrative implementation of a device is depicted and generally designated 1900. In various implementations, the device 1900 may have more or fewer components than illustrated in FIG. 19. In an illustrative implementation, the device 1900 may correspond to the device 102, the device 104, or both. In an illustrative implementation, the device 1900 may perform one or more operations described with reference to FIGS. 1-18.

In a particular implementation, the device 1900 includes a processor 1906 (e.g., a central processing unit (CPU)). The device 1900 may include one or more additional processors 1910 (e.g., one or more DSPs). In a particular aspect, the one or more processors 1090 of FIG. 10 correspond to the processor 1906, the processors 1910, or a combination thereof. The processors 1910 may include a speech and music coder-decoder (CODEC) 1908 that includes a voice coder ("vocoder") encoder 1936, a vocoder decoder 1938, or both. In a particular aspect, the processors 1910 include the video encoder 112, the video decoder 122, or both. In a particular implementation, the speech and music CODEC 1908 includes the video encoder 112, the video decoder 122, or both.

The device 1900 may include a memory 1986 and a CODEC 1934. The memory 1986 may include instructions 1956, that are executable by the one or more additional processors 1910 (or the processor 1906) to implement the functionality described with reference to the video encoder 112, the video decoder 122, or both. The memory 1986 is configured to store data generated or used to perform one or more operations described herein. In a particular aspect, the memory 1986 includes the video data memory 118, the reference frame memory 128 of FIG. 1, the line buffer 202A, the line buffer 202B, the line buffer 204A, the line buffer 204B of FIG. 2, the probability table 440A, the probability table 440B, the counter table 444A, the counter table 444B, the memory 470 of FIG. 4, the reference frame memory 564 of FIG. 5, the probability table 740A, the probability table 740B, the counter table 744A, the counter table 744B, the memory 770 of FIG. 7, the memory 1186 of FIG. 11, or a combination thereof. The device 1900 may include a modem 1948 coupled, via a transceiver 1950, to an antenna 1952. In a particular aspect, the modem 1948 corresponds to the modem 114, the modem 124 of FIG. 1, or both. In a particular aspect, the transceiver 1950 includes the transmitter 116, the receiver 126, or both.

The device 1900 may include the display device 108 coupled to a display controller 1926. A speaker 1992 and a microphone 1990 may be coupled to the CODEC 1934. The CODEC 1934 may include a digital-to-analog converter (DAC) 1902, an analog-to-digital converter (ADC) 1904, or both. In a particular implementation, the CODEC 1934 may receive analog signals from the microphone 1990, convert the analog signals to digital signals using the analog-to-digital converter 1904, and provide the digital signals to the speech and music codec 1908. The speech and music codec 1908 may process the digital signals. In a particular implementation, the speech and music codec 1908 may provide digital signals to the CODEC 1934. The CODEC 1934 may convert the digital signals to analog signals using the digital-to-analog converter 1902 and may provide the analog signals to the speaker 1992.

The video encoder 112 and the video decoder 122 each may be implemented as any of a variety of suitable encoder or decoder circuitry, including fixed-function and/or programmable processing circuitry, such as one or more microprocessors, DSPs, ASICs, FPGAs, discrete logic, software, hardware, firmware or any combinations thereof.

When the techniques are implemented partially in software, a device may store instructions for the software in a suitable, non-transitory computer-readable medium and execute the instructions in hardware using one or more processors to perform the techniques of this disclosure. Each of video encoder 112 and the video decoder 122 may be included in one or more encoders or decoders, either of which may be integrated as part of the CODEC 1934.

In a particular implementation, the device 1900 may be included in a system-in-package or system-on-chip device 1922. In a particular implementation, the memory 1986, the processor 1906, the processors 1910, the display controller 1926, the CODEC 1934, and the modem 1948 are included in a system-in-package or system-on-chip device 1922. In a particular implementation, an input device 1930, the camera 106, and a power supply 1944 are coupled to the system-on-chip device 1922. Moreover, in a particular implementation, as illustrated in FIG. 19, the display 1928, the input device 1930, the speaker 1992, the microphone 1990, the camera 106, the antenna 1952, and the power supply 1944 are external to the system-on-chip device 1922. In a particular implementation, each of the display 1928, the input device 1930, the speaker 1992, the f microphone 1990, the camera 106, the antenna 1952, and the power supply 1944 may be coupled to a component of the system-on-chip device 1922, such as an interface (e.g., the input interface 110 or the output interface 120) or a controller.

The device 1900 may include a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, a mobile device, or any combination thereof.

In conjunction with the described implementations, an apparatus includes means for receiving a plurality of video frames. For example, the means for receiving can correspond to the input interface 110, the video encoder 112, the device 102 of FIG. 1, the processor 1906, the processors 1910, one or more other circuits or components configured to receive a plurality of video frames, or any combination thereof.

The apparatus also includes means for encoding, at a first bitstream engine, first portion data of a first portion of a first video frame of the plurality of video frames to generate a first encoded portion. For example, the means for encoding can correspond to the bitstream engine 130A, the video encoder 112, the device 102 of FIG. 1, the processor 1906, the processors 1910, one or more other circuits or components configured to encode at a first bitstream engine, or any combination thereof.

The apparatus further includes means for generating, at the first bitstream engine, synchronization information based on completion of encoding the first portion. For example, the means for generating can correspond to the bitstream engine 130A, the video encoder 112, the device 102 of FIG. 1, the processor 1906, the processors 1910, one or more other circuits or components configured to generate synchronization information at the first bitstream engine, or any combination thereof.

The apparatus also includes means for initiating encoding, at a second bitstream engine, second portion data of a second portion of a particular video frame to generate a second encoded portion, the encoding of the second portion based on the synchronization information and the first encoded portion, where the particular video frame includes the first video frame or a second video frame of the plurality of video frames. For example, the means for initiating encoding can correspond to the bitstream engine 130B, the video encoder 112, the device 102 of FIG. 1, the processor 1906, the processors 1910, one or more other circuits or components configured to initiate encoding at a second bitstream engine, or any combination thereof.

Also in conjunction with the described implementations, an apparatus includes means for receiving a bitstream representing a plurality of video frames. For example, the means for receiving can correspond to the receiver 126, the modem 124, the video decoder 122, the device 104 of FIG. 1, the processor 1906, the processors 1910, the modem 1948, the transceiver 1950, one or more other circuits or components configured to receive a bitstream, or any combination thereof.

The apparatus also includes means for decoding, at a first bitstream engine, a first portion of a first video frame of the plurality of video frames to generate first decoded portion data. For example, the means for decoding can correspond to the bitstream engine 140A, the video decoder 122, the device 104 of FIG. 1, the processor 1906, the processors 1910, one or more other circuits or components configured to decode at a first bitstream engine, or any combination thereof.

The apparatus further includes means for generating, at the first bitstream engine, synchronization information based on completion of decoding the first portion. For example, the means for generating can correspond to the bitstream engine 140A, the video decoder 122, the device 104 of FIG. 1, the processor 1906, the processors 1910, one or more other circuits or components configured to generate synchronization information at the first bitstream engine, or any combination thereof.

The apparatus also includes means for initiating decoding, at a second bitstream engine, of a second portion of a particular video frame to generate second decoded portion data, the decoding of the second portion based on the synchronization information and the first decoded portion data, where the particular video frame includes the first video frame or a second video frame of the plurality of video frames. For example, the means for initiating decoding at a second bitstream engine can correspond to the bitstream engine 140B, the video decoder 122, the device 104 of FIG. 1, the processor 1906, the processors 1910, one or more other circuits or components configured to initiate decoding at a second bitstream engine, or any combination thereof.

In some implementations, a non-transitory computer-readable medium (e.g., a computer-readable storage device, such as the memory 1986) includes instructions (e.g., the instructions 1956) that, when executed by one or more processors (e.g., the one or more processors 1910 or the processor 1906), cause the one or more processors to receive a plurality of video frames (e.g., the video frames 109). The instructions, when executed by the one or more processors, also cause the one or more processors to encode, at a first bitstream engine (e.g., the bitstream engine 130A), first portion data (e.g., the portion data 111A) of a first portion (e.g., the video frame portion 151A) of a first video frame (e.g., the video frame 109A) of the plurality of video frames to generate a first encoded portion (e.g., the encoded video frame portion 117A). The instructions, when executed by the one or more processors, further cause the one or more processors to generate, at the first bitstream engine, synchronization information (e.g., the synchronization information 115A) based on completion of encoding the first portion. The instructions, when executed by the one or more processors, also cause the one or more processors to initiate encoding, at a second bitstream engine (e.g., the bitstream engine 130B), second portion data (e.g., the portion data 111B) of a second portion (e.g., the video frame portion 151B) of a particular video frame (e.g., the video frame 109A or the video frame 109B) to generate a second encoded portion (e.g., the encoded video frame portion 117B), the encoding of the second portion based on the synchronization information and the first encoded portion, where the particular video frame includes the first video frame or a second video frame (e.g., the video frame 109B) of the plurality of video frames.

In some implementations, a non-transitory computer-readable medium (e.g., a computer-readable storage device, such as the memory 1986) includes instructions (e.g., the instructions 1956) that, when executed by one or more processors (e.g., the one or more processors 1910 or the processor 1906), cause the one or more processors to receive a bitstream (e.g., the bitstream 103) representing a plurality of video frames (e.g., the video frames 109). The instructions, when executed by the one or more processors, also cause the one or more processors to decode, at a first bitstream engine (e.g., the bitstream engine 140A), a first portion (e.g., the encoded video frame portion 117A) of a first video frame (e.g., the video frame 109A) of the plurality of video frames to generate first decoded portion data (e.g., the decoded portion data 121A). The instructions, when executed by the one or more processors, further cause the one or more processors to generate, at the first bitstream engine, synchronization information (e.g., the synchronization information 125A) based on completion of decoding the first portion. The instructions, when executed by the one or more processors, also cause the one or more processors to initiate decoding, at a second bitstream engine (e.g., the bitstream engine 140B), of a second portion (e.g., the encoded video frame portion 117B) of a particular video frame (e.g., the video frame 109A or the video frame 109B) to generate second decoded portion data (e.g., the decoded portion data 121B), the decoding of the second portion based on the synchronization information and the first decoded portion data, where the particular video frame includes the first video frame or a second video frame (e.g., the video frame 109B) of the plurality of video frames.

Particular aspects of the disclosure are described below in a first set of interrelated clauses:

According to Clause 1, a device includes: a first bitstream engine configured to decode a first portion of a first video frame of a plurality of video frames to generate first decoded portion data and configured to generate synchronization information based on completion of decoding the first portion; and a second bitstream engine configured to, based on the synchronization information, initiate decoding of a second portion of a particular video frame to generate second decoded portion data, wherein the second bitstream engine uses the first decoded portion data during decoding of the second portion of the particular video frame, and wherein the particular video frame includes the first video frame or a second video frame of the plurality of video frames.

Clause 2 includes the device of Clause 1, further including an entropy decoder that includes the first bitstream engine and the second bitstream, wherein the first decoded portion data includes first quantized transform coefficients, wherein the synchronization information includes first prediction syntax, wherein the second decoded portion data includes second quantized transform coefficients, wherein the second bitstream engine is configured to generate second prediction syntax, and wherein the entropy decoder is configured to: provide frame quantized transform coefficients to an inverse quantization unit, wherein the frame quantized transform coefficients are based on the first quantized transform coefficients and the second quantized transform coefficients; and provide frame prediction syntax to a motion compensation unit, an intra-prediction processing unit, or both, wherein the frame prediction syntax includes the first prediction syntax and the second prediction syntax.

Clause 3 includes the device of Clause 2, further including: the inverse quantization unit configured to perform inverse quantization on the frame quantized transform coefficients to generate transform coefficients; an inverse transform processing unit configured to apply one or more inverse transforms to the transform coefficients to generate residual data; the motion compensation unit configured to apply motion compensation to a reference frame based on the frame prediction syntax to generate an inter-predicted frame; the intra-prediction processing unit configured to apply intra-prediction to the frame prediction syntax to generate an intra-predicted frame; and a reconstruction unit configured to generate a reconstructed frame based on the residual data and a predicted frame, the predicted frame including the inter-predicted frame, the intra-predicted frame, or both.

Clause 4 includes the device of any of Clauses 1 to 3, wherein the first bitstream engine includes a first arithmetic decoder configured to: generate the first decoded portion data based on first probability data of a first probability table; and update a first counter value of a first counter table based on the first decoded portion data.

Clause 5 includes the device of Clause 4, wherein the second bitstream engine includes a second arithmetic decoder configured to: generate the second decoded portion data based on second probability data of a second probability table; and update a second counter value of a second counter table based on the second decoded portion data.

Clause 6 includes the device of Clause 5, wherein the second bitstream engine is configured to provide the second counter value to the first bitstream engine, and wherein the first bitstream engine is configured to: update the first counter value of the first counter table based on the second counter value; update the first probability data of the first probability table based on the updated first counter value; and store the updated first probability data in a memory.

Clause 7 includes the device of Clause 5 or Clause 6, wherein the second bitstream engine is configured to, prior to decoding any tiles of a subsequent video frame, copy probability data from a memory to the second probability table as the second probability data.

Clause 8 includes the device of Clause 5, wherein the first bitstream engine is configured to provide the first counter value to the second bitstream engine, and wherein the second bitstream engine is configured to: update the second counter value of the second counter table based on the first counter value; update the second probability data of the second probability table based on the updated second counter value; and store the updated second probability data in a memory.

Clause 9 includes the device of Clause 5 or Clause 8, wherein the first bitstream engine is configured to, prior to decoding any tiles of a subsequent video frame, copy probability data from a memory to the first probability table as the first probability data.

Clause 10 includes the device of any of Clauses 1 to 9, wherein the first portion includes at least a first tile of the first video frame and the second portion includes at least a second tile of the first video frame.

Clause 11 includes the device of Clause 10, wherein the first video frame includes rows and columns of tiles, wherein the first tile is in a first row of the rows and in a first column of the columns, wherein the second tile is in a second row of the rows and in the first column, and wherein the second row is adjacent to and below the first row in the rows.

Clause 12 includes the device of Clause 11, wherein the first video frame includes an even count of the rows and an odd count of the columns.

Clause 13 includes the device of any of Clauses 1 to 12, further including a plurality of buffers, wherein the first bitstream engine is configured to store the first decoded portion data and the synchronization information in a particular buffer of the plurality of buffers, and wherein the second bitstream engine is configured to retrieve the first decoded portion data and the synchronization information from the particular buffer prior to decoding the second portion.

Clause 14 includes the device of any of Clauses 1 to 13, further including a plurality of buffers, wherein the second bitstream engine is configured to initiate decoding of the second portion based at least in part on determining that a particular buffer of the plurality of buffers has available data.

Clause 15 includes the device of any of Clauses 1 to 14, wherein the first portion includes a first block at a first location of the first video frame, and wherein the second portion includes a second block at the first location of the second video frame.

Clause 16 includes the device of any of Clauses 1 to 15, wherein the second bitstream engine includes a context modeler configured to generate a bin value and a context model based on probability data and the synchronization information, wherein the second bitstream engine is configured to generate the second decoded portion data based on the bin value and the context model.

Clause 17 includes the device of any of Clauses 1 to 16, wherein the first bitstream engine is configured to decode a third portion of the first video frame while the second bitstream engine decodes the second portion of the particular video frame.

Clause 18 includes the device of any of Clauses 1 to 16, wherein at least one of the first bitstream engine and the second bitstream engine is integrated into an application specific integrated circuit (ASIC).

Clause 19 includes the device of any of Clauses 1 to 18, further including a modem configured to receive a bitstream representing the plurality of video frames.

Clause 20 includes the device of any of Clauses 1 to 19, further including a memory configured to store the first decoded portion data, the synchronization information, the second decoded portion data, or a combination thereof.

Clause 21 includes the device of any of Clauses 1 to 20, further comprising a display device configured to display a first reconstructed video frame corresponding to the first video frame, the first reconstructed video frame based at least on the first decoded portion data.

Particular aspects of the disclosure are described below in a second set of interrelated clauses:

According to Clause 22, a method includes: receiving, at a device, a bitstream representing a plurality of video frames; decoding, at a first bitstream engine of the device, a first portion of a first video frame of the plurality of video frames to generate first decoded portion data; generating, at the first bitstream engine, synchronization information based on completion of decoding the first portion; and initiating decoding, at a second bitstream engine of the device, of a second portion of a particular video frame to generate second decoded portion data, the decoding of the second portion based on the synchronization information and the first decoded portion data, wherein the particular video frame includes the first video frame or a second video frame of the plurality of video frames.

Clause 23 includes the method of Clause 22, further including: generating, at the first bitstream engine, the first decoded portion data based on first probability data of a first probability table; updating, at the first bitstream engine, a first counter value of a first counter table based on the first decoded portion data; generating, at the second bitstream engine, the second decoded portion data based on second probability data of a second probability table; updating, at the second bitstream engine, a second counter value of a second counter table based on the second decoded portion data; receiving the second counter value at the first bitstream engine from the second bitstream engine; updating, at the first bitstream engine, the first counter value of the first counter table based on the second counter value; updating, at the first bitstream engine, the first probability data of the first probability table based on the updated first counter value; and storing, by the first bitstream engine, the updated first probability data in a memory.

Particular aspects of the disclosure are described below in a third set of interrelated clauses:

According to Clause 24, a device includes: an interface configured to receive a plurality of video frames; a first bitstream engine configured to encode first portion data of a first portion of a first video frame of the plurality of video frames to generate a first encoded portion and configured to generate synchronization information based on completion of encoding the first portion; and a second bitstream engine configured to, based on the synchronization information, initiate encoding of second portion data of a second portion of a particular video frame to generate a second encoded portion, wherein the second bitstream engine uses the first encoded portion during encoding of the second portion of the particular video frame, and wherein the particular video frame includes the first video frame or a second video frame of the plurality of video frames.

Clause 25 includes the device of Clause 24, wherein the first bitstream engine includes a first arithmetic encoder configured to: generate the first encoded portion based on first probability data of a first probability table; and update a first counter value of a first counter table based on the first encoded portion, and wherein the second bitstream engine includes a second arithmetic encoder configured to: generate the second encoded portion based on second probability data of a second probability table; and update a second counter value of a second counter table based on the second encoded portion.

Clause 26 includes the device of Clause 25, wherein the second bitstream engine is configured to provide the second counter value to the first bitstream engine, and wherein the first bitstream engine is configured to: update the first counter value of the first counter table based on the second counter value; update the first probability data of the first probability table based on the updated first counter value; and store the updated first probability data in a memory.

Clause 27 includes the device of Clause 25 or Clause 26, wherein the second bitstream engine is configured to, prior to encoding any tiles of a subsequent video frame, copy probability data from a memory to the second probability table as the second probability data.

Clause 28 includes the device of Clause 25, wherein the first bitstream engine is configured to provide the first counter value to the second bitstream engine, and wherein the second bitstream engine is configured to: update the second counter value of the second counter table based on the first counter value; update the second probability data of the second probability table based on the updated second counter value; and store the updated second probability data in a memory.

Clause 29 includes the device of any of Clauses 24 to 28, further including a plurality of buffers, wherein the first bitstream engine is configured to store the first encoded portion and the synchronization information in a particular buffer of the plurality of buffers, and wherein the second bitstream engine is configured to retrieve the first encoded portion and the synchronization information from the particular buffer prior to encoding the second portion.

Clause 30 includes the device of any of Clauses 24 to 29, further including an entropy encoder that includes the first bitstream engine and the second bitstream engine, wherein the first portion data includes first quantized transform coefficients, wherein the synchronization information includes first prediction syntax, wherein the second portion data includes second quantized transform coefficients, and wherein the entropy encoder is configured to: receive, from a quantization unit, the first quantized transform coefficients and the second quantized transform coefficients; and receive, from a motion estimation unit, the first prediction syntax and second prediction syntax.

Clause 31 includes the device of Clause 30, further including: a residual generation unit configured to: generate first residual data based on the first portion and first predicted portion, the first predicted portion received from the motion estimation unit; and generate second residual data based on the second portion and second predicted portion, the second predicted portion received from the motion estimation unit; a transform processing unit configured to: apply one or more transforms to the first residual data to generate first transform coefficients; and apply the one or more transforms to the second residual data to generate second transform coefficients; and the quantization unit configured to: perform quantization on the first transform coefficients to generate the first quantized transform coefficients; and perform quantization on the second transform coefficients to generate the second quantized transform coefficients.

Particular aspects of the disclosure are described below in a fourth set of interrelated clauses:

Clause 32 includes a method including: receiving a plurality of video frames at a device; encoding, at a first bitstream engine of the device, first portion data of a first portion of a first video frame of the plurality of video frames to generate a first encoded portion; generating, at the first bitstream engine, synchronization information based on completion of encoding the first portion; and initiating encoding, at a second bitstream engine of the device, second portion data of a second portion of a particular video frame to generate a second encoded portion, the encoding of the second portion based on the synchronization information and the first encoded portion, wherein the particular video frame includes the first video frame or a second video frame of the plurality of video frames.

Clause 33 includes the method of Clause 32, further including encoding, at the first bitstream engine, third portion data of a third portion of the first video frame while encoding, at the second bitstream engine, the second portion of the particular video frame.

Particular aspects of the disclosure are described below in a fifth set of interrelated clauses:

According to Clause 34, an apparatus includes: means for receiving a bitstream representing a plurality of video frames; means for decoding, at a first bitstream engine, a first portion of a first video frame of the plurality of video frames to generate first decoded portion data; means for generating, at the first bitstream engine, synchronization information based on completion of decoding the first portion; and means for initiating decoding, at a second bitstream engine, of a second portion of a particular video frame to generate second decoded portion data, the decoding of the second portion based on the synchronization information and the first decoded portion data, wherein the particular video frame includes the first video frame or a second video frame of the plurality of video frames.

Clause 35 includes the apparatus of Clause 34, wherein the means for receiving, the means for decoding, the means for generating, and the means for initiating decoding are integrated into at least one of a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, or a mobile device.

Particular aspects of the disclosure are described below in a sixth set of interrelated clauses:

According to Clause 36, an apparatus includes: means for receiving a plurality of video frames; means for encoding, at a first bitstream engine, first portion data of a first portion of a first video frame of the plurality of video frames to generate a first encoded portion; means for generating, at the first bitstream engine, synchronization information based on completion of encoding the first portion; and means for initiating encoding, at a second bitstream engine of the device, second portion data of a second portion of a particular video frame to generate a second encoded portion, the encoding of the second portion based on the synchronization information and the first encoded portion, wherein the particular video frame includes the first video frame or a second video frame of the plurality of video frames.

Clause 37 includes the apparatus of Clause 36, wherein the means for receiving, the means for encoding, the means for generating, and the means for initiating encoding are integrated into at least one of a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, or a mobile device.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, such implementation decisions are not to be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
a first bitstream engine configured to decode bits associated with a first portion of a first video frame of a plurality of video frames to generate first decoded portion data and configured to generate synchronization information based on completion of decoding the bits associated with the first portion; and
a second bitstream engine configured to, based on the synchronization information, initiate decoding of bits associated with a second portion of a particular video frame to generate second decoded portion data, wherein the second bitstream engine uses the first decoded portion data during decoding of the bits associated with the second portion of the particular video frame, and wherein the particular video frame includes the first video frame or a second video frame of the plurality of video frames,
wherein the first bitstream engine is further configured to decode bits associated with a third portion of the first video frame while the second bitstream engine decodes the bits associated with the second portion of the particular video frame, wherein the third portion of the first video frame is distinct from the first portion of the first video frame.

2. The device of claim 1, further comprising an entropy decoder that includes the first bitstream engine and the second bitstream engine, wherein the first decoded portion data includes first quantized transform coefficients, wherein the synchronization information includes first prediction syntax, wherein the second decoded portion data includes second quantized transform coefficients, wherein the second bitstream engine is configured to generate second prediction syntax, and wherein the entropy decoder is configured to:
provide frame quantized transform coefficients to an inverse quantization unit, wherein the frame quantized transform coefficients are based on the first quantized transform coefficients and the second quantized transform coefficients; and
provide frame prediction syntax to a motion compensation unit, an intra-prediction processing unit, or both, wherein the frame prediction syntax includes the first prediction syntax and the second prediction syntax.

3. The device of claim 2, further comprising:
the inverse quantization unit configured to perform inverse quantization on the frame quantized transform coefficients to generate transform coefficients;
an inverse transform processing unit configured to apply one or more inverse transforms to the transform coefficients to generate residual data;
the motion compensation unit configured to apply motion compensation to a reference frame based on the frame prediction syntax to generate an inter-predicted frame;
the intra-prediction processing unit configured to apply intra-prediction to the frame prediction syntax to generate an intra-predicted frame; and
a reconstruction unit configured to generate a reconstructed frame based on the residual data and a predicted frame, the predicted frame including the inter-predicted frame, the intra-predicted frame, or both.

4. The device of claim 1, wherein the first bitstream engine includes a first arithmetic decoder configured to:
generate the first decoded portion data based on first probability data of a first probability table; and update a first counter value of a first counter table based on the first decoded portion data.

5. The device of claim 4, wherein the second bitstream engine includes a second arithmetic decoder configured to:
generate the second decoded portion data based on second probability data of a second probability table; and
update a second counter value of a second counter table based on the second decoded portion data.

6. The device of claim 5, wherein the second bitstream engine is configured to provide the second counter value to the first bitstream engine, and wherein the first bitstream engine is configured to:
update the first counter value of the first counter table based on the second counter value;
update the first probability data of the first probability table based on the updated first counter value; and
store the updated first probability data in a memory.

7. The device of claim 5, wherein the second bitstream engine is configured to, prior to decoding bits associated with any tiles of a subsequent video frame, copy probability data from a memory to the second probability table as the second probability data.

8. The device of claim 5, wherein the first bitstream engine is configured to provide the first counter value to the second bitstream engine, and wherein the second bitstream engine is configured to:
update the second counter value of the second counter table based on the first counter value;
update the second probability data of the second probability table based on the updated second counter value; and
store the updated second probability data in a memory.

9. The device of claim 5, wherein the first bitstream engine is configured to, prior to decoding bits associated with any tiles of a subsequent video frame, copy probability data from a memory to the first probability table as the first probability data.

10. The device of claim 1, wherein the first portion includes at least a first tile of the first video frame, the second portion includes at least a second tile of the first video frame, and the third portion includes at least a third tile of the first video frame.

11. The device of claim 10, wherein the first video frame includes rows and columns of tiles, wherein the first tile is in a first row of the rows and in a first column of the columns, wherein the second tile is in a second row of the rows and in the first column, and wherein the second row is adjacent to and below the first row in the rows.

12. The device of claim 11, wherein the first video frame includes an even count of the rows and an odd count of the columns.

13. The device of claim 1, further comprising a plurality of buffers, wherein the first bitstream engine is configured to store the first decoded portion data and the synchronization information in a particular buffer of the plurality of buffers, and wherein the second bitstream engine is configured to retrieve the first decoded portion data and the synchronization information from the particular buffer prior to decoding the bits associated with the second portion.

14. The device of claim 1, further comprising a plurality of buffers, wherein the second bitstream engine is configured to initiate decoding of the bits associated with the second portion based at least in part on determining that a particular buffer of the plurality of buffers has available data.

15. The device of claim 1, wherein the first portion includes a first block at a first location of the first video frame, wherein the second portion includes a second block at the first location of the second video frame, and wherein the third portion includes a third block at a second location of the first video frame.

16. The device of claim 1, wherein the second bitstream engine comprises a context modeler configured to generate a bin value and a context model based on probability data and the synchronization information, wherein the second bitstream engine is configured to generate the second decoded portion data based on the bin value and the context model.

17. The device of claim 1, wherein the second bitstream engine is further configured to initiate decoding of bits associated with a fourth portion of the particular video frame to generate fourth decoded portion data based on the first bitstream engine completing decoding of the bits associated with the third portion of the first video frame.

18. The device of claim 1, wherein at least one of the first bitstream engine and the second bitstream engine is integrated into an application specific integrated circuit (ASIC).

19. The device of claim 1, further comprising a modem configured to receive a bitstream representing the plurality of video frames.

20. The device of claim 1, further comprising a memory configured to store the first decoded portion data, the synchronization information, the second decoded portion data, or a combination thereof.

21. The device of claim 1, further comprising a display device configured to display a first reconstructed video frame corresponding to the first video frame, the first reconstructed video frame based at least on the first decoded portion data.

22. A method comprising:
receiving, at a device, a bitstream representing a plurality of video frames;
decoding, at a first bitstream engine of the device, bits associated with a first portion of a first video frame of the plurality of video frames to generate first decoded portion data;
generating, at the first bitstream engine, synchronization information based on completion of decoding of the bits associated with the first portion;
initiating decoding, at a second bitstream engine of the device, of bits associated with a second portion of a particular video frame to generate second decoded portion data, the decoding of the bits associated with the second portion based on the synchronization information and the first decoded portion data, wherein the particular video frame includes the first video frame or a second video frame of the plurality of video frames; and
initiating decoding, at the first bitstream engine, of bits associated with a third portion of the first video frame while the second bitstream engine is decoding the bits associated with the second portion of the particular video frame, wherein the third portion of the first video frame is distinct from the first portion of the first video frame.

23. The method of claim 22, further comprising:
generating, at the first bitstream engine, the first decoded portion data based on first probability data of a first probability table;
updating, at the first bitstream engine, a first counter value of a first counter table based on the first decoded portion data;
generating, at the second bitstream engine, the second decoded portion data based on second probability data of a second probability table;

updating, at the second bitstream engine, a second counter value of a second counter table based on the second decoded portion data;
receiving the second counter value at the first bitstream engine from the second bitstream engine;
updating, at the first bitstream engine, the first counter value of the first counter table based on the second counter value;
updating, at the first bitstream engine, the first probability data of the first probability table based on the updated first counter value; and
storing, by the first bitstream engine, the updated first probability data in a memory.

24. A device comprising:
an interface configured to receive a plurality of video frames;
a first bitstream engine configured to encode first portion data of a first portion of a first video frame of the plurality of video frames to generate bits associated with a first encoded portion and configured to generate synchronization information based on completion of encoding the first portion; and
a second bitstream engine configured to, based on the synchronization information, initiate encoding of second portion data of a second portion of a particular video frame to generate bits associated with a second encoded portion, wherein the second bitstream engine uses the first encoded portion during encoding of the second portion of the particular video frame, and wherein the particular video frame includes the first video frame or a second video frame of the plurality of video frames,
wherein the first bitstream engine is further configured to encode a third portion of the first video frame while the second bitstream engine encodes the second portion of the particular video frame, wherein the third portion of the first video frame is distinct from the first portion of the first video frame.

25. The device of claim 24,
wherein the first bitstream engine includes a first arithmetic encoder configured to:
generate the first encoded portion based on first probability data of a first probability table; and
update a first counter value of a first counter table based on the first encoded portion, and
wherein the second bitstream engine includes a second arithmetic encoder configured to:
generate the second encoded portion based on second probability data of a second probability table; and
update a second counter value of a second counter table based on the second encoded portion.

26. The device of claim 25, wherein the second bitstream engine is configured to provide the second counter value to the first bitstream engine, and wherein the first bitstream engine is configured to:
update the first counter value of the first counter table based on the second counter value;
update the first probability data of the first probability table based on the updated first counter value; and
store the updated first probability data in a memory.

27. The device of claim 25, wherein the second bitstream engine is configured to, prior to encoding bits associated with any tiles of a subsequent video frame, copy probability data from a memory to the second probability table as the second probability data.

28. The device of claim 25, wherein the first bitstream engine is configured to provide the first counter value to the second bitstream engine, and wherein the second bitstream engine is configured to:
update the second counter value of the second counter table based on the first counter value;
update the second probability data of the second probability table based on the updated second counter value; and
store the updated second probability data in a memory.

29. A method comprising:
receiving a plurality of video frames at a device;
encoding, at a first bitstream engine of the device, first portion data of a first portion of a first video frame of the plurality of video frames to generate bits associated with a first encoded portion;
generating, at the first bitstream engine, synchronization information based on completion of encoding the first portion;
initiating encoding, at a second bitstream engine of the device, second portion data of a second portion of a particular video frame to generate bits associated with a second encoded portion, the encoding of the second portion based on the synchronization information and the first encoded portion, wherein the particular video frame includes the first video frame or a second video frame of the plurality of video frames; and
initiating encoding, at the first bitstream engine, of a third portion of the first video frame while the second bitstream engine is encoding the second portion of the particular video frame, wherein the third portion of the first video frame is distinct from the first portion of the first video frame.

30. The method of claim 29, further comprising initiating encoding, at the second bitstream engine, of a fourth portion of the particular video frame based on the first bitstream engine completing encoding of the third portion of the first video frame.

31. The device of claim 1, wherein the particular video frame is the first video frame, and wherein the second bitstream engine is configured to decode the bits associated with the second portion of the first video frame while the first bitstream engine decodes the bits associated with the third portion of the first video frame.

32. The device of claim 1, wherein the particular video frame is the second video frame, and wherein the second bitstream engine is configured to decode the bits associated with the second portion of the second video frame while the first bitstream engine decodes the bits associated with the third portion of the first video frame.

\* \* \* \* \*